US011647628B2

(12) United States Patent
Saito et al.

(10) Patent No.: US 11,647,628 B2
(45) Date of Patent: May 9, 2023

(54) SEMICONDUCTOR MEMORY DEVICE

(71) Applicant: Kioxia Corporation, Tokyo (JP)

(72) Inventors: Yuta Saito, Yokkaichi (JP); Shinji Mori, Nagoya (JP); Keiji Hosotani, Yokkaichi (JP); Daisuke Hagishima, Tokyo (JP); Atsushi Takahashi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 350 days.

(21) Appl. No.: 17/017,385

(22) Filed: Sep. 10, 2020

(65) Prior Publication Data

US 2021/0296347 A1 Sep. 23, 2021

(30) Foreign Application Priority Data

Mar. 19, 2020 (JP) .............................. JP2020-048786

(51) Int. Cl.
*H01L 27/115* (2017.01)
*H01L 27/11578* (2017.01)
(Continued)

(52) U.S. Cl.
CPC .. *H01L 27/11578* (2013.01); *H01L 27/11565* (2013.01); *H01L 27/11568* (2013.01)

(58) Field of Classification Search
CPC ......... H01L 27/11578; H01L 27/11565; H01L 27/11568; H01L 27/11524; H01L 27/11556; H01L 27/1157; H01L 27/11582
See application file for complete search history.

(56) References Cited

U.S. PATENT DOCUMENTS 8,202,365 B2   6/2012 Umeda et al.
8,633,535 B2   1/2014 Matsuo et al.
(Continued)

FOREIGN PATENT DOCUMENTS

JP   2010-510392 A   4/2010
JP   2011-258776 A   12/2011
(Continued)

OTHER PUBLICATIONS

Joaquim Portillo et al. "Precession Electron Diffraction assisted Orientation Mapping in the Transmission Electron Microscope", Materials Science Forum, vol. 644, 2010 pp. 1-7.

*Primary Examiner* — Thanhha S Pham
(74) *Attorney, Agent, or Firm* — Oblon, McClelland, Maier & Neustadt, L.L.P.

(57) ABSTRACT

According to one embodiment, a semiconductor memory device includes: a first semiconductor layer; first and second insulating layers in contact with the first semiconductor layer; a second semiconductor layer in contact with the first insulating layer; a third semiconductor layer in contact with the second insulating layer; a first conductor; a third insulating layer in contact with the first conductor; a fourth insulating layer provided between the second semiconductor layer and the third insulating layer; a first charge storage layer provided between the second semiconductor layer and the fourth insulating layer; and a fifth insulating layer provided between the second semiconductor layer and the first charge storage layer. The second semiconductor layer, the first conductor, the third to fifth insulating layers, and the first charge storage layer function as a first memory cell.

12 Claims, 45 Drawing Sheets

(51) Int. Cl.
   *H01L 27/11568* (2017.01)
   *H01L 27/11565* (2017.01)

(56) References Cited

U.S. PATENT DOCUMENTS

| | | |
|---|---|---|
| 8,729,523 B2 | 5/2014 | Pio |
| 9,019,739 B2 | 4/2015 | Park et al. |
| 9,178,078 B2 | 11/2015 | Matsuda |
| 10,242,877 B2 | 3/2019 | Park et al. |
| 2008/0119098 A1 | 5/2008 | Palley et al. |
| 2012/0327714 A1 | 12/2012 | Lue |
| 2013/0307047 A1* | 11/2013 | Sakuma ............ H01L 27/11551 438/258 |
| 2018/0090219 A1 | 3/2018 | Harari |
| 2019/0296118 A1 | 9/2019 | Ohba |
| 2020/0176033 A1 | 6/2020 | Hosotani et al. |

FOREIGN PATENT DOCUMENTS

| | | |
|---|---|---|
| JP | 2013-16781 A | 1/2013 |
| JP | 5215158 B2 | 6/2013 |
| JP | 2015-28988 A | 2/2015 |
| JP | 6127144 B2 | 5/2017 |
| JP | 2018-11054 A | 1/2018 |
| JP | 6351980 B2 | 7/2018 |
| JP | 2018-123039 A | 8/2018 |
| JP | 2019-526934 A | 9/2019 |
| JP | 2019-169554 A | 10/2019 |
| WO | WO 2018/039654 A1 | 3/2018 |

* cited by examiner

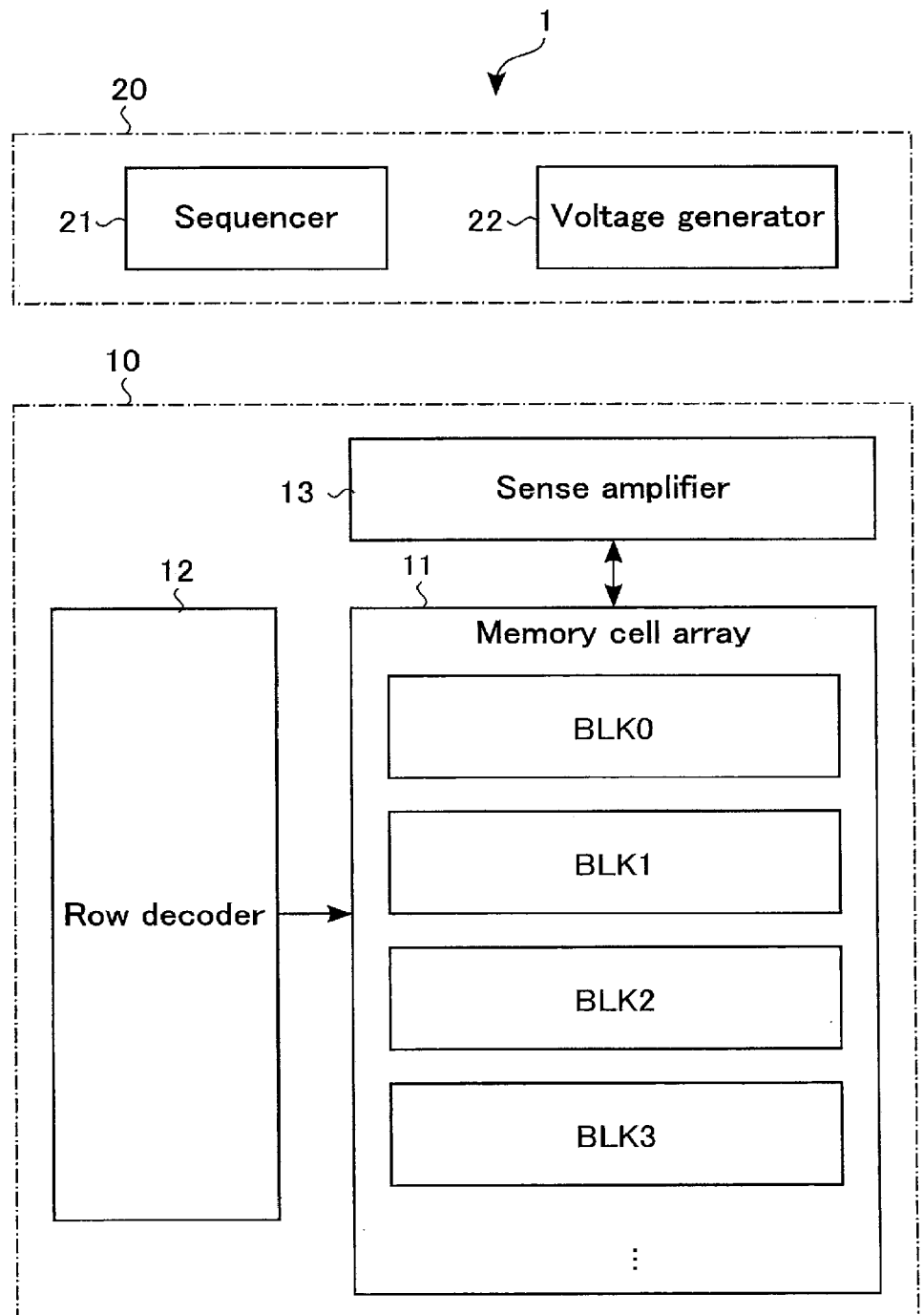
F I G. 1

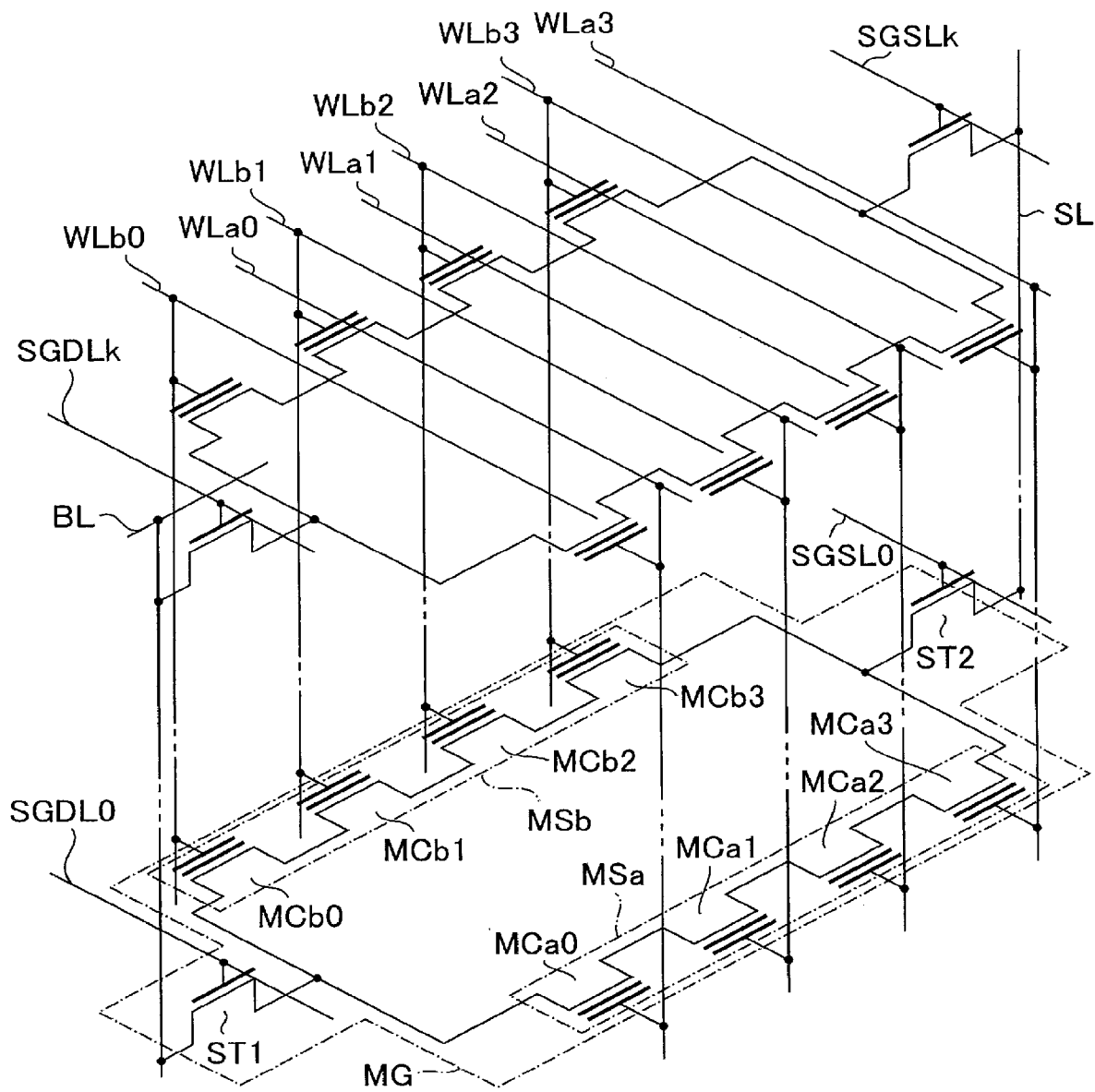
F I G. 3

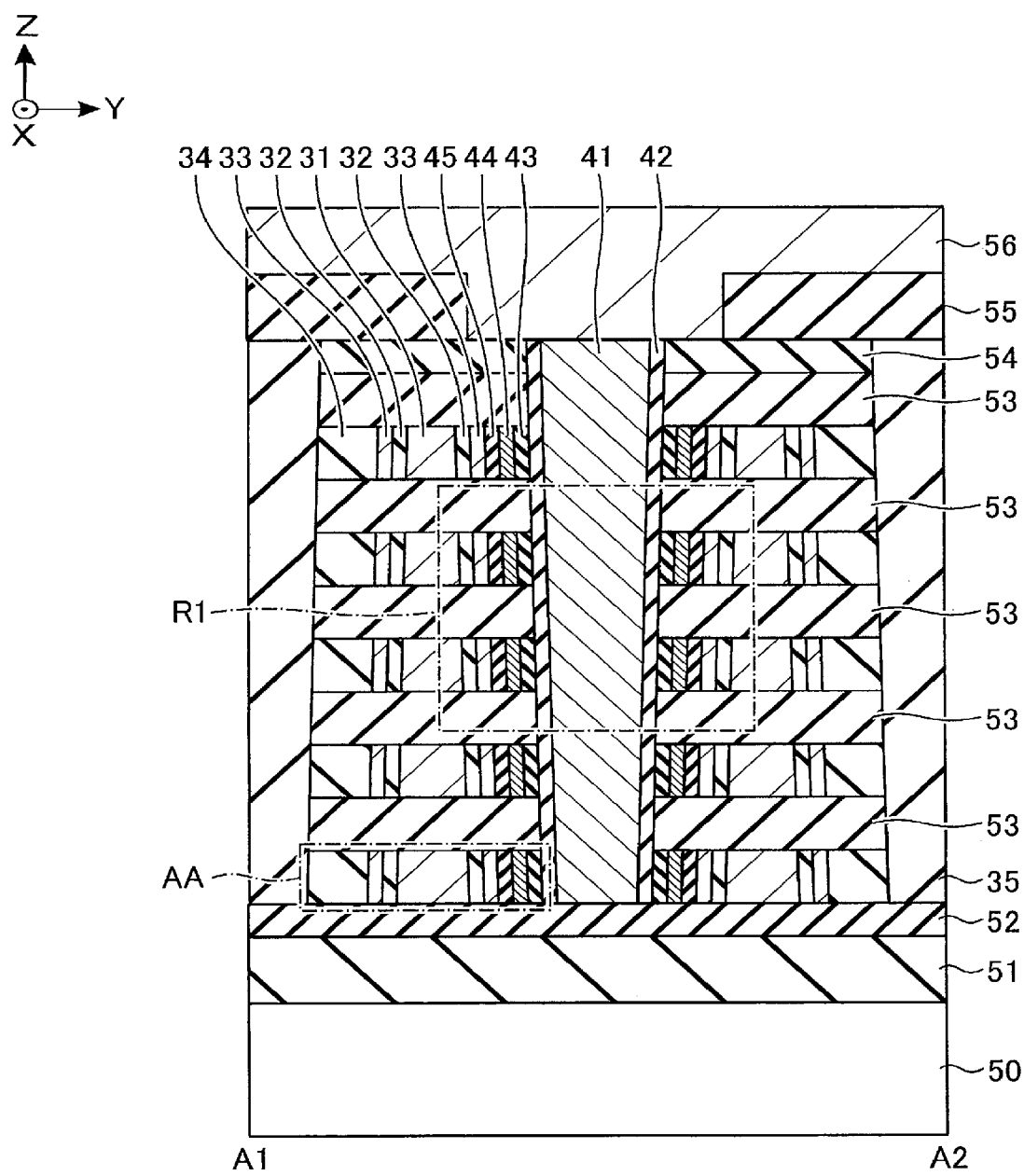
F I G. 5

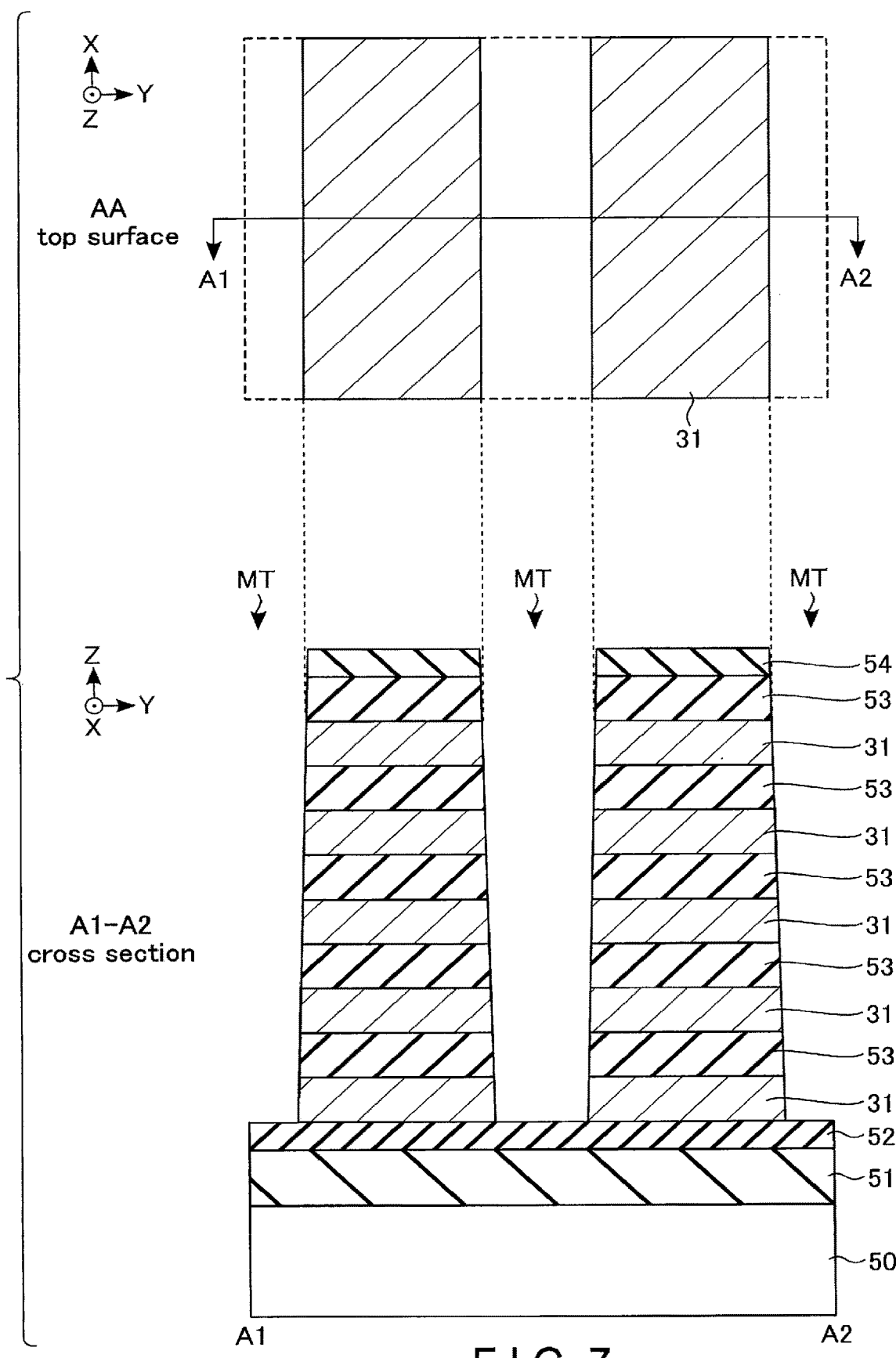
F I G. 7

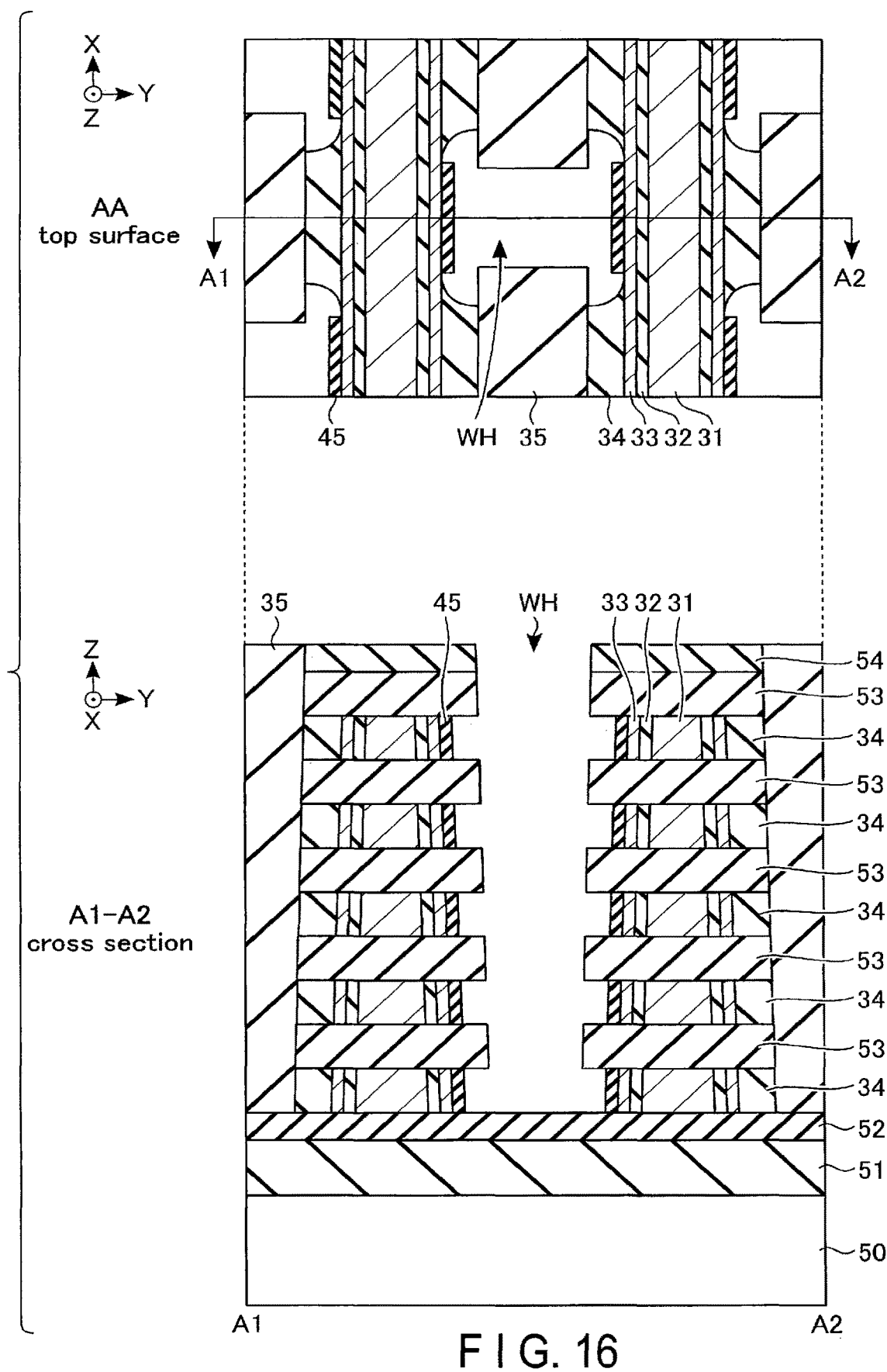
F I G. 16

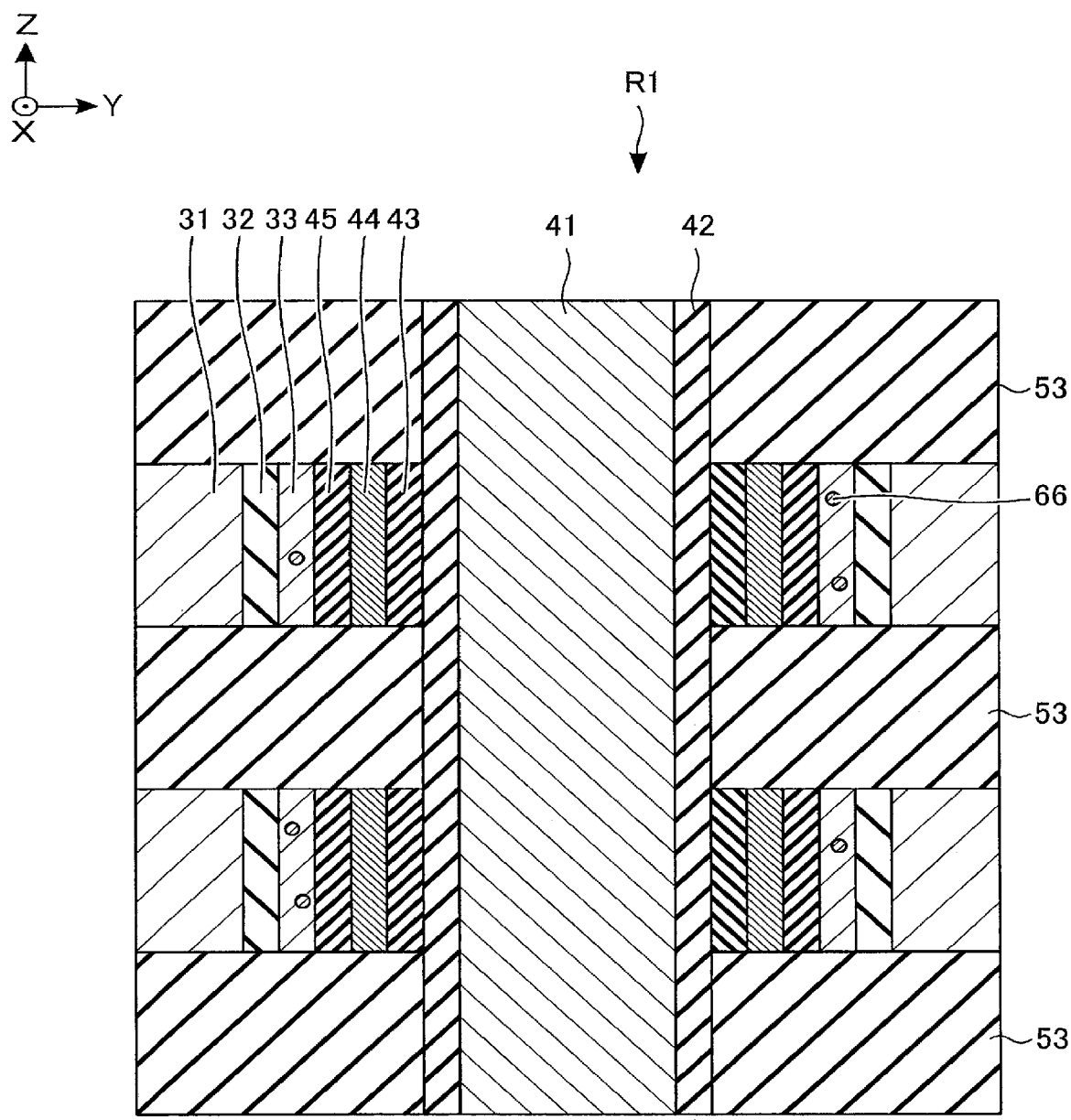
F I G. 22

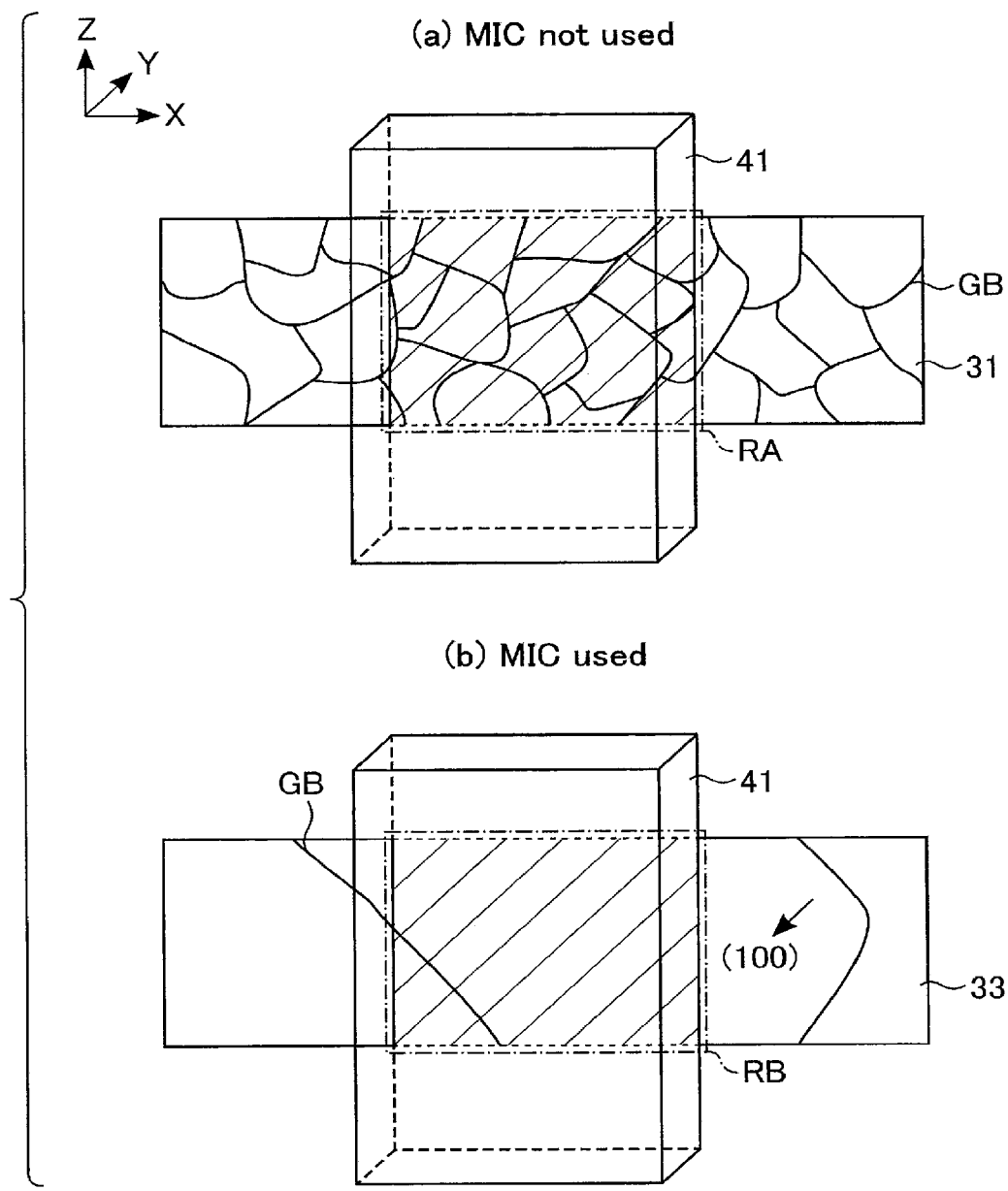
F I G. 29

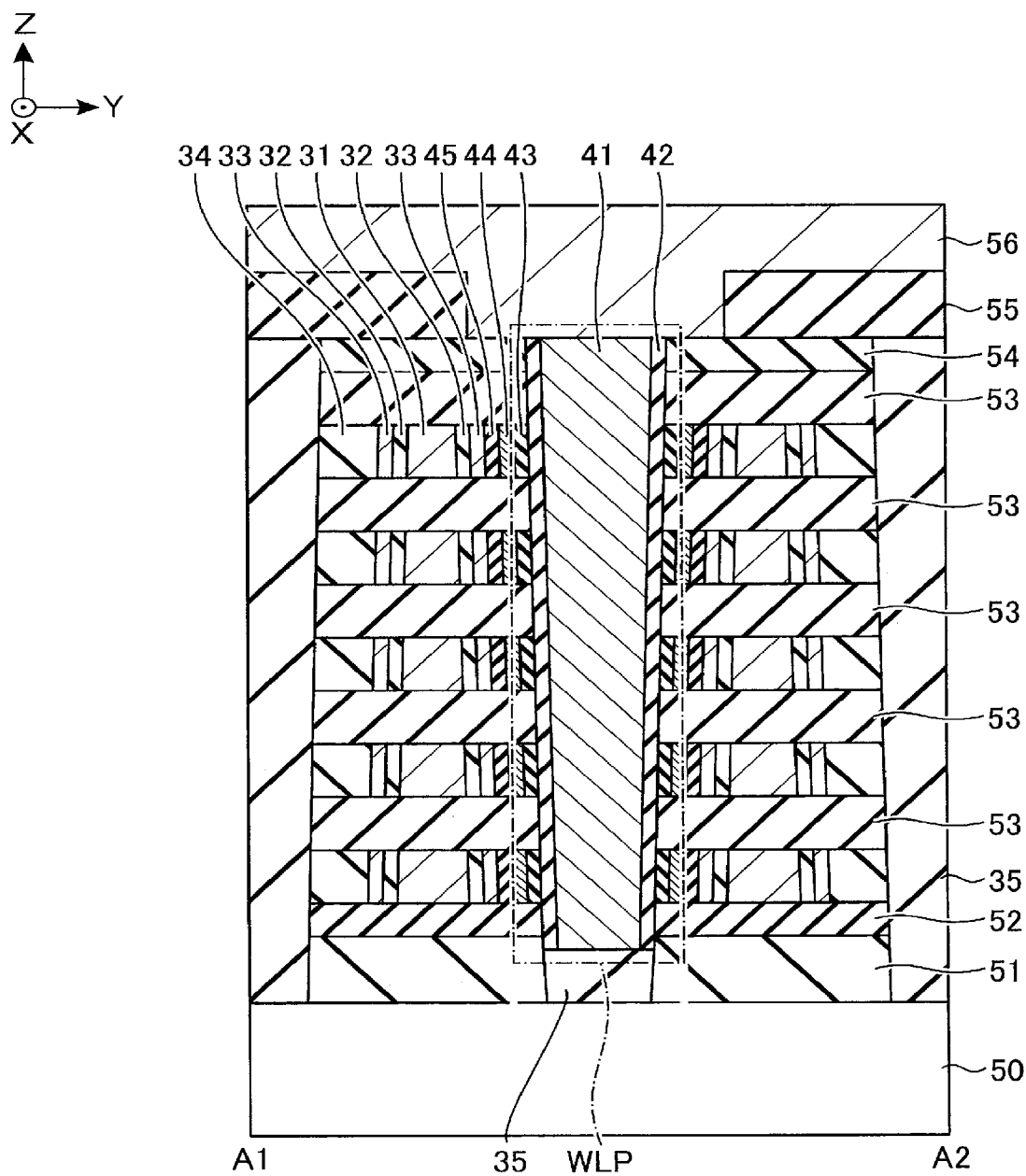
F I G. 30

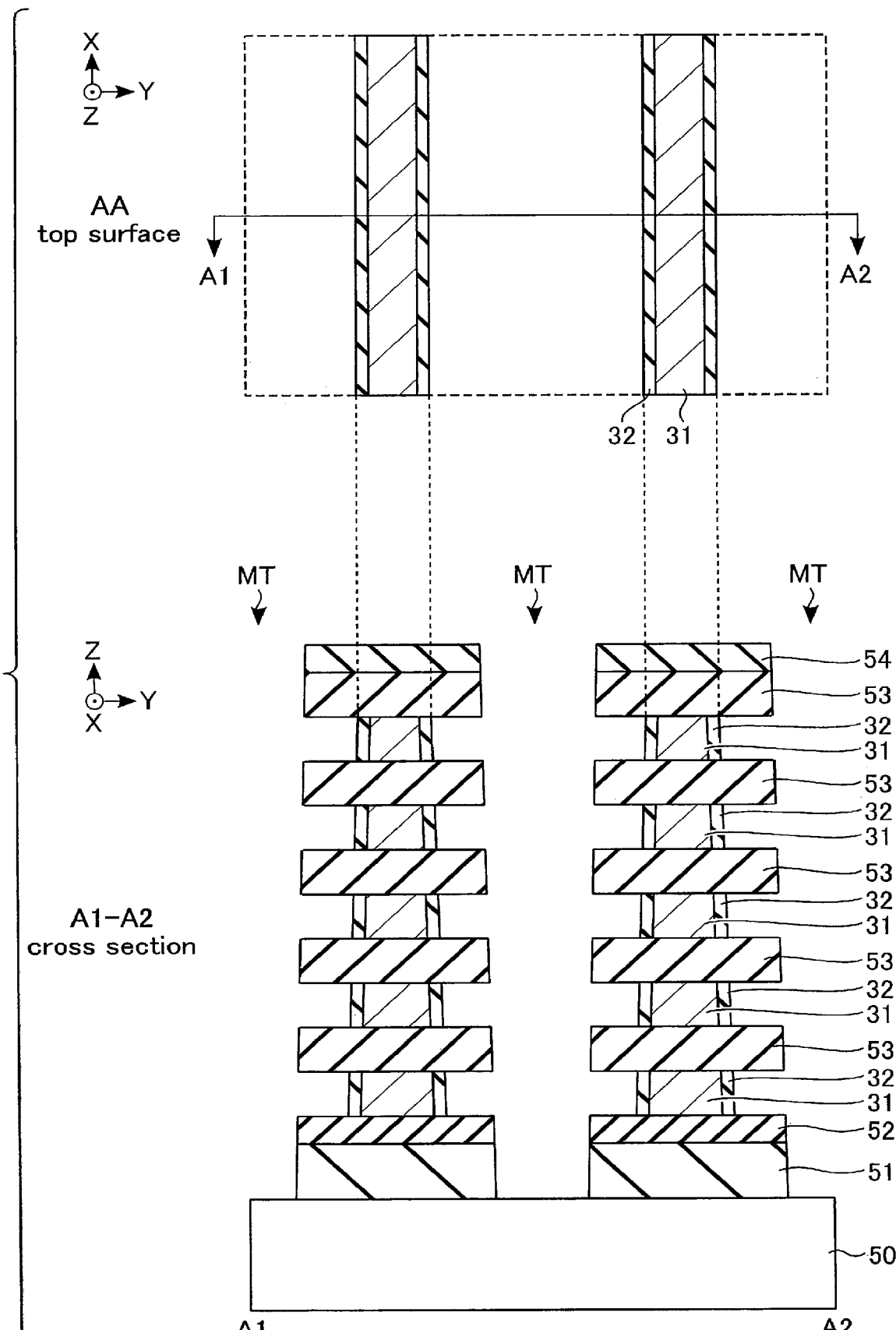
F I G. 33

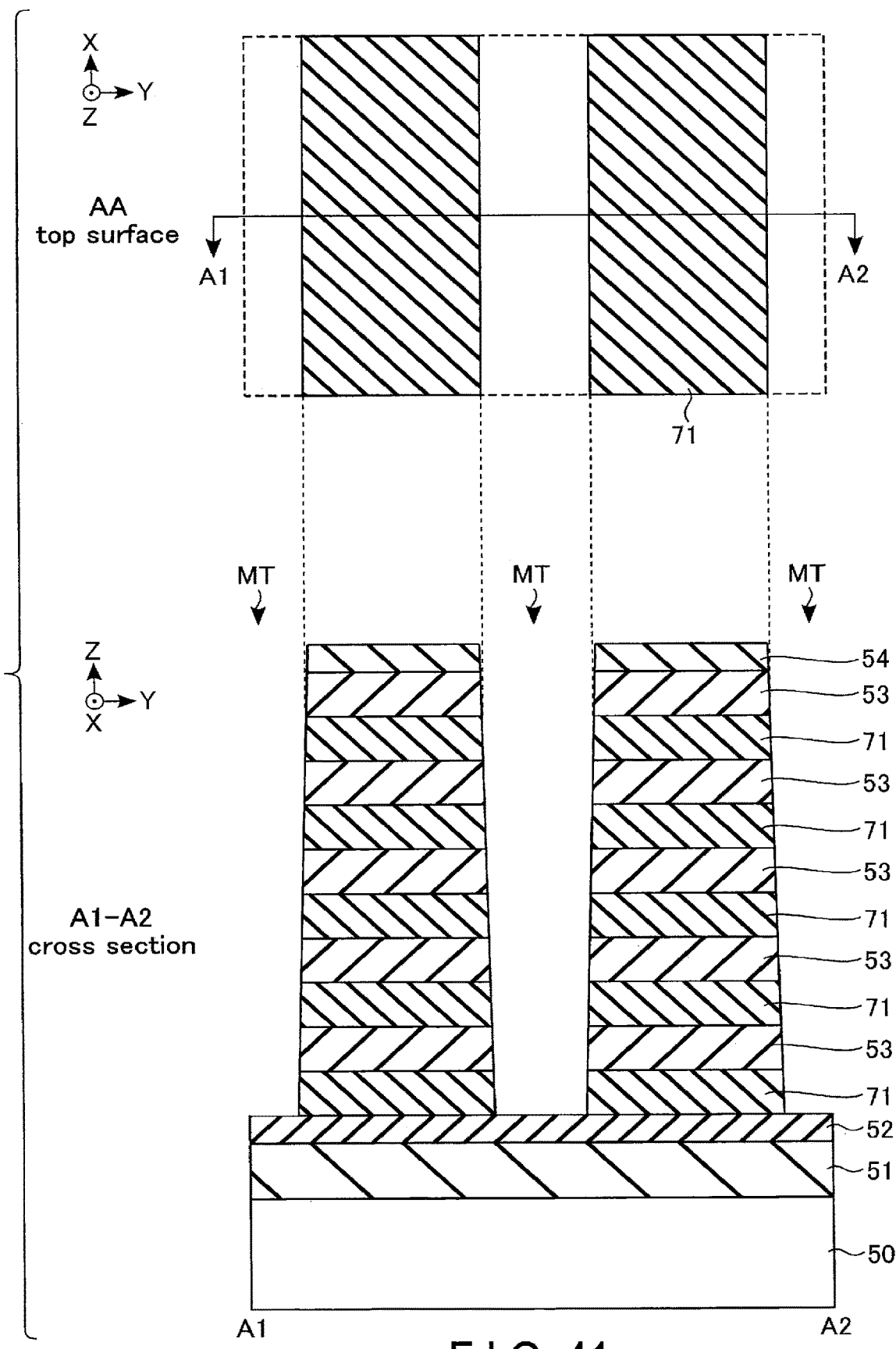
F I G. 41

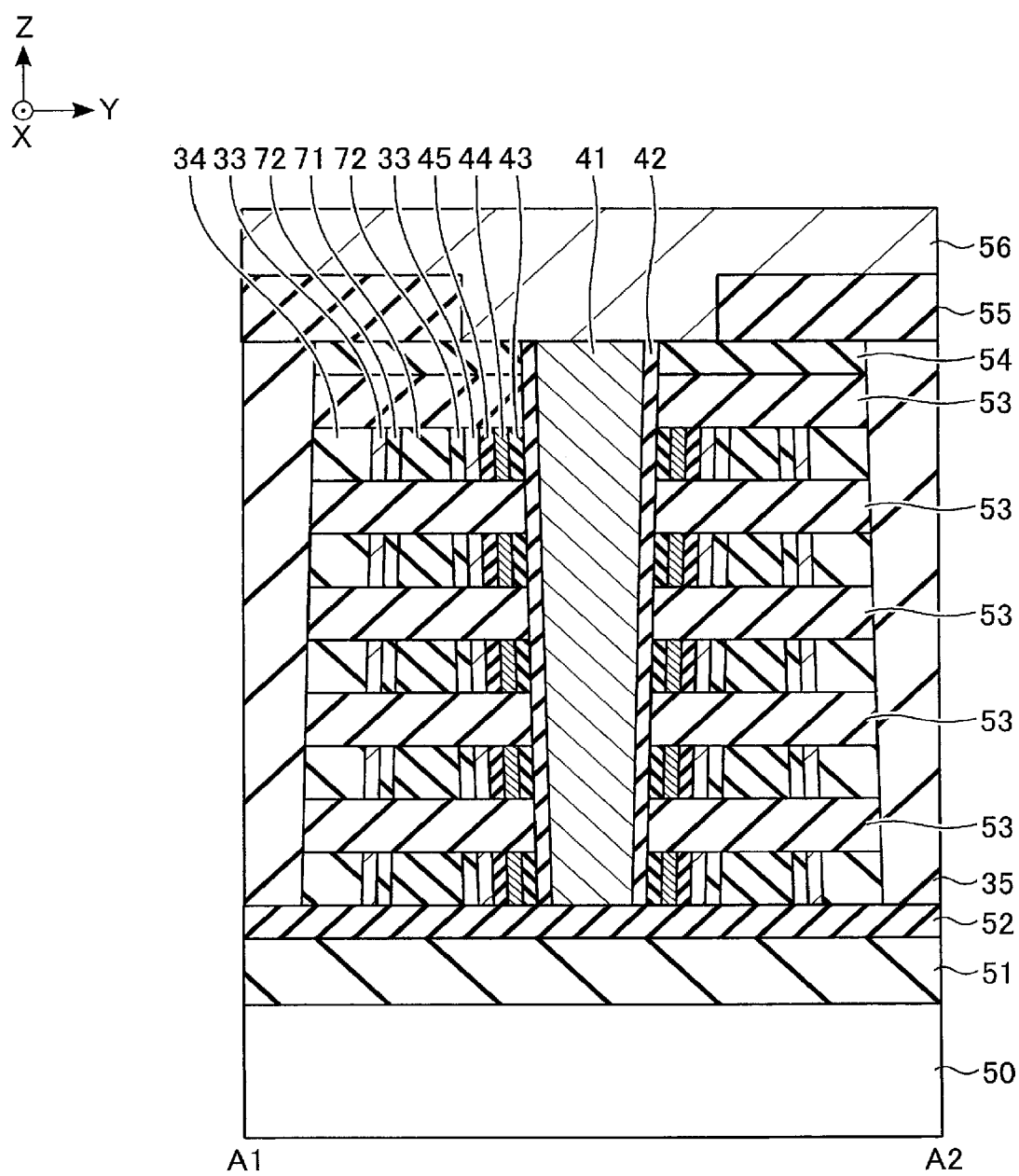
F I G. 44

SEMICONDUCTOR MEMORY DEVICE

CROSS-REFERENCE TO RELATED APPLICATIONS

This application is based upon and claims the benefit of priority from Japanese Patent Application No. 2020-048786, filed Mar. 19, 2020, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram of a semiconductor memory device according to a first embodiment.

FIG. 3 is a circuit diagram of the memory cell array included in the semiconductor memory device according to the first embodiment.

FIG. 5 is a cross-sectional view of the memory cell array included in the semiconductor memory device according to the first embodiment.

FIGS. 6 to 19 are diagrams showing a process of manufacturing the memory cell array included in the semiconductor memory device according to the first embodiment.

FIG. 22 is a cross-sectional view of a memory cell array included in a semiconductor memory device according to a second example of the second embodiment.

FIG. 29 is a diagram illustrating a crystal grain size of a semiconductor layer 33 in the semiconductor memory device according to the second example of the second embodiment.

FIG. 30 is a cross-sectional view of a memory cell array included in a semiconductor memory device according to a third example of the second embodiment.

FIGS. 31 to 37 are diagrams showing a process of manufacturing the memory cell array included in the semiconductor memory device according to the third example of the second embodiment.

FIGS. 40 to 42 are diagrams showing a process of manufacturing the memory cell array included in the semiconductor memory device according to the third embodiment.

FIG. 44 is a cross-sectional view of the memory cell array included in the semiconductor memory device according to the fourth embodiment.

DETAILED DESCRIPTION

Figure 2:
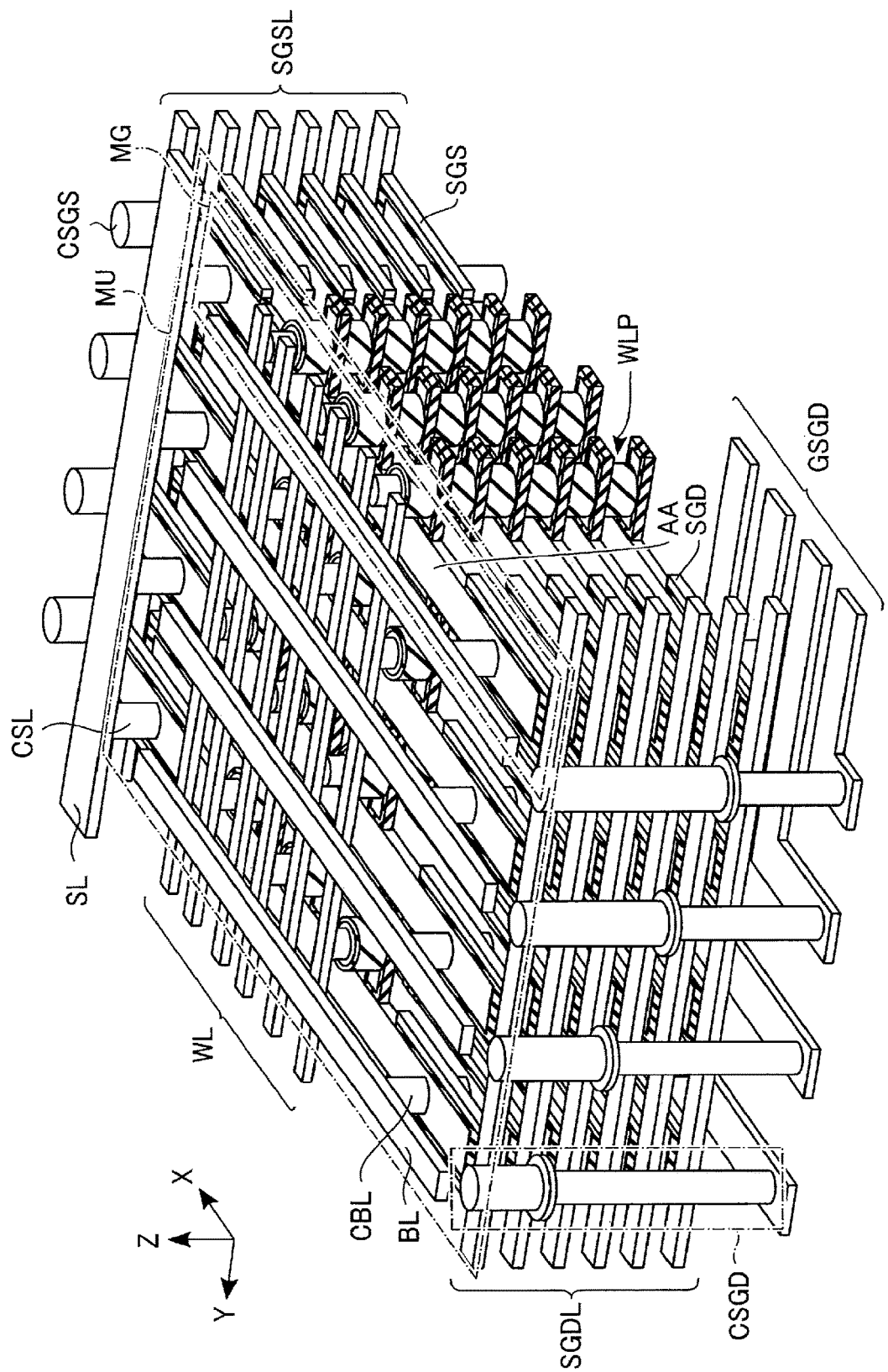
FIG. 2 is a perspective view of a memory cell array included in the semiconductor memory device according to the first embodiment.

In general, according to one embodiment, a semiconductor memory device includes: a first semiconductor layer extending in a first direction that is parallel to a substrate; a first insulating layer extending in the first direction and in contact with a first main surface of the first semiconductor layer, the first main surface facing a second direction that intersects the first direction; a second insulating layer extending in the first direction and in contact with a second main surface of the first semiconductor layer, the second main surface being opposite to the first main surface and facing the second direction; a second semiconductor layer extending in the first direction and in contact with a third main surface of the first insulating layer, the third main surface facing the second direction; a third semiconductor layer extending in the first direction and in contact with a fourth main surface of the second insulating layer, the fourth main surface facing the second direction; a first conductor extending in a third direction that intersects the first and second directions; a third insulating layer in contact with a fifth main surface of the first conductor; a fourth insulating layer provided between the second semiconductor layer and the third insulating layer; a first charge storage layer provided between the second semiconductor layer and the fourth insulating layer; and a fifth insulating layer provided between the second semiconductor layer and the first charge storage layer, and in contact with the second semiconductor layer and the first charge storage layer. A portion of the second semiconductor layer, a portion of the first conductor, a portion of the third insulating layer, the fourth insulating layer, the first charge storage layer, and the fifth insulating layer function as a first memory cell.

Hereinafter, embodiments will be described with reference to the accompanying drawings. In the following description, structural elements that have approximately the same function and configuration will be assigned the same reference symbol, and a repeat description will be given only where necessary. The embodiments to be described below are shown as an example of a device or a method for embodying the technical idea of the embodiments, and are not intended to limit the material, shape, structure, arrangement, etc. of components to those described below. The technical idea of the embodiments may be variously modified in the claims.

1. First Embodiment

A semiconductor memory device according to a first embodiment will be described. Hereinafter, a three-dimensional NAND-type flash memory in which memory cell transistors are three-dimensionally stacked above a semiconductor substrate will be described as an example of the semiconductor memory device.

1.1 Configuration

1.1.1 Overall Configuration of Semiconductor Memory Device

An overall configuration of the semiconductor memory device will be described with reference to FIG. 1. FIG. 1 is an example of a block diagram showing a basic overall configuration of the semiconductor memory device.

As shown in FIG. 1, a semiconductor memory device 1 includes a memory core module 10 and a peripheral circuit module 20.

The memory core module 10 includes a memory cell array 11, a row decoder 12, and a sense amplifier 13.

The memory cell array 11 includes a plurality of blocks BLK (BLK0 to BLK3) each including a plurality of non-volatile memory cell transistors (also referred tows "memory cells" hereinafter) associated with rows and columns. The number of blocks BLK in the memory cell array 11 is designed to be any number. The memory cell array 11 will be described in detail later.

The row decoder 12 decodes a row address received from an unillustrated external controller. Based on the result of the decoding, the row decoder 12 selects an interconnect extending in a row direction in the memory cell array 11. More specifically, the row decoder 12 applies voltages to various interconnects (word lines and select gate lines) for selecting memory cells aligned in the row direction.

When in a read operation, the sense amplifier 13 reads data from memory cell transistors in one of the blocks BLK. When in a write operation, the sense amplifier 13 applies voltages corresponding to write data to the memory cell array 11.

The peripheral circuit module 20 includes a sequencer 21 and a voltage generator 22.

The sequencer 21 controls the overall operation of the semiconductor memory device 1. More specifically, the sequencer 21 controls the voltage generator 22, the row decoder 12, the sense amplifier 13, etc. during a write operation, a read operation, and an erase operation.

The voltage generator 22 generates voltages necessary for the write operation, read operation, and erase operation, and supplies the generated voltages to, for example, the row decoder 12 and the sense amplifier 13.

1.1.2 Configuration of Memory Cell Array

Next, an overall configuration of the memory cell array 11 will be described with reference to FIG. 2. FIG. 2 is a perspective view of the memory cell array 11. In the example of FIG. 2, insulating layers are partly omitted.

As illustrated in FIG. 2, the memory cell array 11 includes a plurality of active areas AA, a plurality of word line pillars WLP, a plurality of word lines WL, a plurality of select gate lines SGD and SGS, a plurality of contact plugs CSGD and CSGS, a plurality of local select gate lines SGDL and SGSL, a plurality of global select gate lines GSGDL, a plurality of contact plugs CBL, a plurality of bit lines BL, a plurality of contact pugs CSL, and a source line SL.

Each active area AA corresponds to a single memory group MG (to be described later). The active areas AA function as active areas in which channel layers of a plurality of memory cell transistors and select transistors are formed. The active areas AA extend in an X direction which is parallel to the semiconductor substrate. The active areas AA are stacked so as to be distanced from each other (with an unillustrated insulating layer interposed therebetween), as viewed in a Z direction which is perpendicular to the semiconductor substrate. At each layer as viewed in the Z direction, a plurality of active areas AA are aligned along a Y direction which is parallel to the semiconductor substrate and intersects the X direction.

A plurality of word line pillars WLP are arranged along the X direction so as to extend in the Z direction, between the groups of active areas AA arranged in the Y direction. In other words, the word line pillars WLP arranged along the X direction and the active areas AA stacked in the Z direction are arranged in an alternating manner along the Y direction. A plurality of word lines WL are provided above the word line pillars WLP, so as to extend in the Y direction. At the same layer as the active areas AA, a block insulating film, a charge storage layer, and a tunnel insulating film are provided between the word line pillars WLP and the active areas AA.

A memory cell transistor is provided at the intersection of the word line pillar WLP and the corresponding active area AA. A plurality of memory cell transistors arranged along the X direction are coupled to a single active area AA.

A contact plug CBL is provided in the vicinity of one-end portions, as viewed in the X direction, of the active areas AA stacked in the Z direction, so as to penetrate the active areas AA. The contact plug CBL extends in, for example, the Z direction. The contact plug CBL is coupled to a plurality of active areas AA stacked in the Z direction. A plurality of contact plugs CBL are provided for the plurality of active areas AA arranged along the Y direction. A plurality of bit lines BL are provided on the respective contact plugs CBL, so as to extend in the X direction. The contact plugs CBL are coupled to different bit lines BL.

A contact plug CSL is provided in the vicinity of the other-end portions, as viewed in the X direction, of the active areas AA stacked in the Z direction, so as to penetrate the active areas AA. The contact plug CSL extends in, for example, the Z direction. The contact plug CSL is coupled to a plurality of active areas AA stacked in the Z direction. A plurality of contact plugs CSL are provided for a plurality of active areas AA arranged along the Y direction. A source line SL is provided on the contact plugs CSL, so as to extend in the Y direction. The contact plugs CSL are commonly coupled to the source line SL.

One-end portions of the active areas AA, in the vicinity of which the contact plugs CBL are arranged, are in contact with a plurality of select gate lines SGD that are provided for the respective active areas AA, with an insulating layer interposed therebetween. The select gate lines SGD corresponding to the active areas AA arranged in the Y direction at the same layer are commonly coupled to a single local select gate line SGDL which extends in the Y direction. The active areas AA and the local select gate lines SGDL are not electrically coupled to one another. The local select gate lines SGDL are stacked so as to be distanced from one another in the Z direction and so as to correspond to the active areas AA stacked in the Z direction.

The other-end portions of the active areas AA, in the vicinity of which the contact plugs CSL are arranged, are in contact with a plurality of select gate lines SGS that are provided for the respective active areas AA, with an insulating layer interposed therebetween. The select gate lines SGS corresponding to the active areas AA arranged in the Y direction at the same layer are commonly coupled to a single local select gate line SGSL which extends in the Y direction. The active area AA and the local select gate line SGSL are not electrically coupled to one another. The local select gate lines SGSL are stacked so as to be distanced from one another in the Z direction and so as to correspond to the active areas AA stacked in the Z direction.

A plurality of global select gate lines GSGDL are formed below the active areas AA stacked in the Z direction and the local select gate lines SGDL, so as to extend along the XY plane.

A plurality of contact plugs CSGD, each including a coupling portion that is electrically coupled to a corresponding one of the local select gate lines SGDL, are provided on the respective global select gate lines GSGDL. The contact plugs CSGD are arranged along the Y direction. In the example of FIG. 2, the coupling portions of the contact plugs CSGD arranged along the Y direction are respectively coupled to the local select gate lines SGDL at different layers.

A plurality of global select gate lines (not illustrated) are formed below the active areas AA stacked in the Z direction and the local select gate lines SGSL, so as to extend along the XY plane.

A plurality of contact plugs CSGS, each including a coupling portion that is electrically coupled to a corresponding one of the local select gate lines SGSL, are provided on the respective global select gate lines, similarly to the contact plugs CSGD. The contact plugs CSGS are, for example, arranged along the Y direction. The coupling portions of the contact plugs CSGS arranged along the Y direction are respectively coupled to the local select gate lines SGSL at different layers.

A single memory group MG includes a plurality of memory cell transistors that are coupled to a single active area AA. A single memory unit MU includes a plurality of memory groups MG (active areas AA) that are coupled to a corresponding local select gate line SGDL. Moreover, each block BLK includes a plurality of memory units MU that are arranged so as to be distanced from one another as viewed in the Z direction and share the same word line pillar WLP.

For the configuration of the memory cell array 11, a configuration other than the above-described one may be adopted. That is, the configuration of the memory cell array 11 is described in, for example, U.S. patent application Ser. No. 16/562,372 entitled "SEMICONDUCTOR MEMORY DEVICE" filed on Sep. 5, 2019. The entire contents of this patent application are incorporated herein by reference.

1.1.3 Circuit Configuration of Memory Cell Array

Next, a circuit configuration of the memory cell array 11 will be described with reference to FIG. 3. FIG. 3 is a circuit diagram of the memory cell array 11. FIG. 3 shows, as an example, a plurality of memory groups MG respectively corresponding to a plurality of active areas AA that are stacked in the Z direction and that are commonly coupled to a single contact plug CBL. Hereinafter, local select gate lines corresponding to lowermost active areas AA (memory groups MG) will be referred to as "SGDL0" and "SGSL0", and local select gate lines corresponding to uppermost active areas AA (memory groups MG) will be referred to as "SGDLk" and "SGSLk" (where k is an integer equal to or greater than 1).

As shown in FIG. 3, each of the memory groups MG includes two memory strings MSa and MSb, and select transistors ST1 and ST2. Hereinafter, the memory strings MSa and MSb will be collectively referred to as "memory strings MS", if they need not be distinguished from each other.

The memory string MSa includes, for example, four memory cell transistors MCa0 to MCa3. Similarly, the memory string MSb includes, for example, four memory cell transistors MCb0 to MCb3. Hereinafter, the memory cell transistors MCa0 to MCa3 and MCb0 to MCb3 will be collectively referred to as "memory cell transistors MC", if they need not be distinguished from each other.

Each memory cell transistor MC includes a control gate and a charge storage layer, and stores data in a non-volatile manner. The memory cell transistor MC may be of a MONOS type which uses a dielectric film as the charge storage layer, or of a floating gate (FG) type which uses a conductive film as the charge storage layer. In the description that follows, a case will be described where the memory cell transistors MC are of the FG type. The number of memory cell transistors MC included in each memory string MS is not limited to a particular number, and may be 8, 16, 32, 48, 64, 96, 128, etc.

Current paths of the memory cell transistors MCa0 to MCa3 included in the memory string MSa are coupled in series. Similarly, current paths of the memory cell transistors MCb0 to MCb3 included in the memory string MSb are coupled in series. Drains of the memory cell transistors MCa0 and MCb0 are commonly coupled to a source of the select transistor ST1. Sources of the memory cell transistors MCa3 and MCb3 are commonly coupled to a drain of the select transistor ST2. The number of select transistors ST1 and ST2 included in each memory group MG may be designed to be any number equal to or greater than one.

Gates of the memory cell transistors MC of a plurality of memory groups MG arranged along the Z direction are commonly coupled to a single word line WL via the word line pillar WLP. More specifically, gates of, for example, memory cell transistors MCa0 arranged along the Z direction are commonly coupled to a word line WLa0. Similarly, gates of memory cell transistors MCa1, MCa2 and MCa3 are respectively coupled to word lines WLa1, WLa2 and WLa3. Gates of memory cell transistors MCb0 to MCb3 are respectively coupled to word lines WLb0 to WLb3.

Drains of select transistors ST1 of memory groups MG arranged along the Z direction are commonly coupled to a single bit line BL via the contact plug CBL. Gates of select transistors ST1 of memory groups MG arranged along the Z direction are coupled to different local select gate lines SGDL. More specifically, for example, a gate of, for example, the select transistor ST1 corresponding to the memory group MG arranged at the lowermost layer is coupled to the local select gate line SGDL0. The gate of the select transistor ST1 corresponding to the memory group MG arranged at an uppermost layer is coupled to a local select gate line SGDLk.

Sources of select transistors ST2 of memory groups MG arranged along the Z direction are commonly coupled to a single source line SL via the contact plug CSL. Gates of select transistors ST2 of memory groups MG arranged along the Z direction are coupled to different local select gate lines SGSL. More specifically, for example, a gate of a select transistor ST2 corresponding to the memory group MG arranged at a lowermost layer is coupled to a local select gate line SGSL0, and a gate of a select transistor ST2 corresponding to the memory group MG arranged at the uppermost layer is coupled to the local select gate line SGSLk.

1.1.4 Planar Configuration of Memory Cell Array

Figure 4:
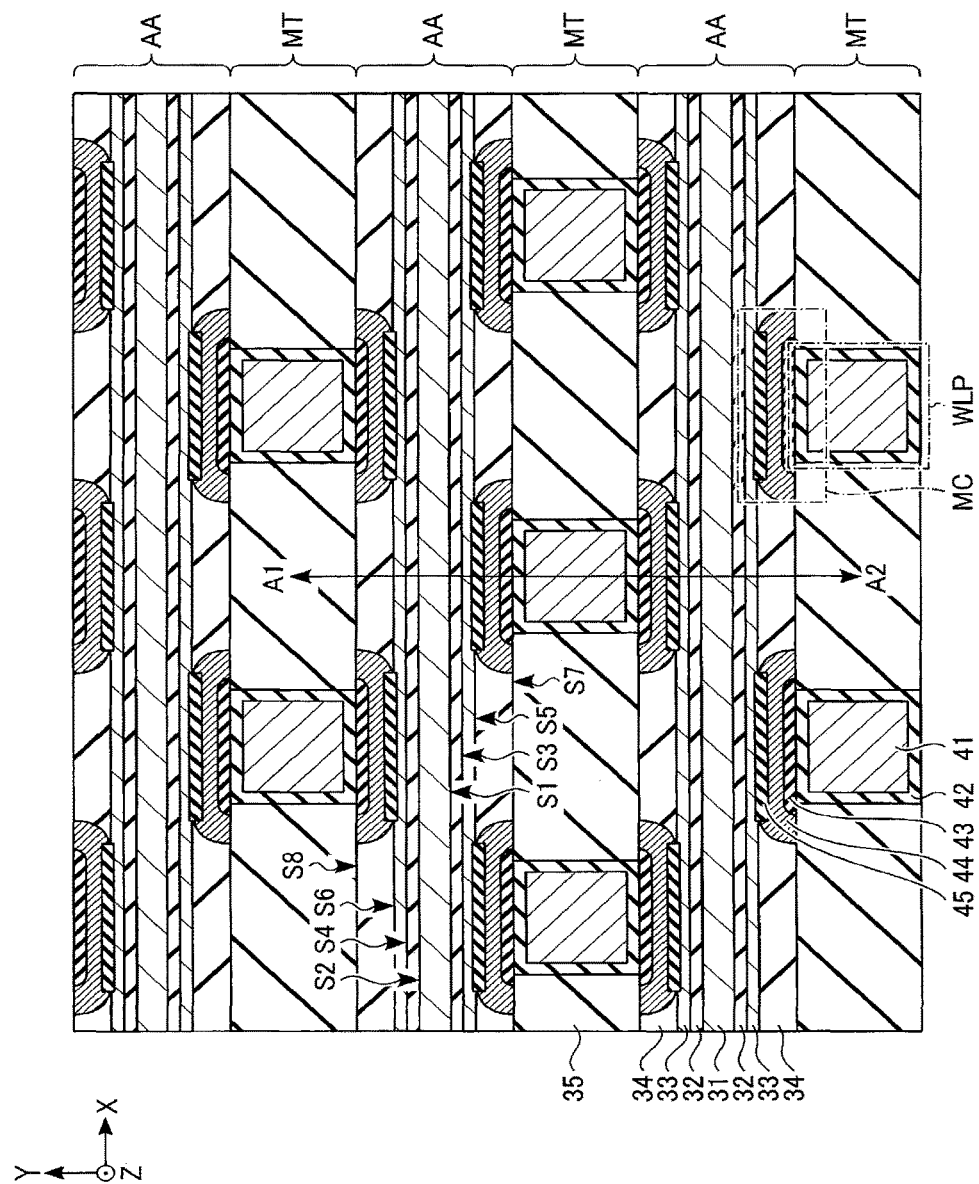
FIG. 4 is a top view of the memory cell array included in the semiconductor memory device according to the first embodiment.

Next, an example of a planar configuration of the memory cell array 11 will be described with reference to FIG. 4. FIG. 4 is a plan view of the active areas AA and the word line pillars WLP in the memory cell array 11.

As illustrated in FIG. 4, a plurality of active areas AA extending in the X direction are arranged along the Y direction. Each active area AA includes semiconductor layers 31 and 33, and insulating layers 32 and 34. More specifically, each active area AA includes, for example, a semiconductor layer 31, two insulating layers 32, two semiconductor layers 33, and two insulating layers 34.

At the center of each active area AA, a semiconductor layer 31 extending in the X direction is provided. The semiconductor layer 31 is formed using, for example, polysilicon.

Two insulating layers 32 extend in the X direction, and are in contact with two side surfaces S1 and S2 of the semiconductor layer 31 that face the Y direction. The insulating layers 32 are formed using, for example, silicon oxide ($SiO_2$). The insulating layer 32 has a thickness that allows electrical coupling between the semiconductor layer 31 and the semiconductor layer 33.

Two semiconductor layers 33 extend in the X direction, and are respectively in contact with a side surface S3 that is opposite to a side surface S1 of one of the insulating layers 32 and a side surface S4 that is opposite to a side surface S2 of the other insulating layer 32. In the semiconductor layer 33, channels of the memory cell transistors MC are formed. The semiconductor layer 33 is formed using, for example, polysilicon, a metal sulfide, polysilicon formed by a metal-induced crystallization (MIC) method, or monocrystalline silicon formed by epitaxial growth.

Hereinafter, a case will be described in the present embodiment where polysilicon, for example, is used as the semiconductor layer 33.

Two insulating layers 34 extend in the X direction, and are respectively in contact with a side surface S5 of one of the semiconductor layers 33 that is opposite to the side surface S3, and a side surface S6 of the other semiconductor layer 33 that is opposite to the side surface S4. The insulating layer 34 is formed using, for example, silicon nitride (SiN). The insulating layer 34 functions as an etching stopper in forming an insulating layer 45 (tunnel insulating film) and a charge storage layer 44 (to be described later).

That is, the active area AA has a structure in which the insulating layer 32, the semiconductor layer 33, and the insulating layer 34 are laminated from the semiconductor layer 31 toward the side surface S7 or S8 that faces the Y direction.

A memory trench MT is provided between two active areas AA arranged along the Y direction. An insulating layer 35 is embedded in the memory trench MT. The insulating layer 35 is formed using, for example, $SiO_2$.

A plurality of word line pillars WLP are provided along the X direction between two active areas AA, so as to separate the insulating layers 35. The word line pillars WLP are arranged in a staggered manner as viewed in the Y direction. Each word line pillar WLP includes a conductor 41 that extends in the Z direction and an insulating layer 42 that is provided to surround side surfaces of the conductor 41.

The conductor 41 is formed using a conductive material. The conductive material may be, for example, a metal material, or a semiconductor material doped with impurities. The conductive material is formed using, for example, a laminated structure containing W and titanium nitride (TiN). TiN functions as an adhesive layer or a barrier layer of W.

The insulating layer 42 functions as a block insulating film of the memory cell transistor MC, in conjunction with an insulating layer 43 (to be described later).

The insulating layer 43, the charge storage layer 44, and the insulating layer 45 are provided between each word line pillar WLP and the corresponding active area AA, so as to separate the insulating layers 34 as viewed in the Y direction. The insulating layer 45 functions as a tunnel insulating film of the memory cell transistor MC. More specifically, the insulating layer 43 is provided between the insulating layer 42 and the charge storage layer 44. The insulating layer 43 has a length in the X direction greater than a length of the word line pillar WLP in the X direction. The charge storage layer 44 is provided between the word line pillar WLP and the semiconductor layer 33 of the active area AA, so as to separate the insulating layers 34 as viewed in the X direction. The insulating layer 45 is provided between the charge storage layer 44 and the semiconductor layer 33 of the active area AA, as viewed in the Y direction. Since the insulating layer 45 is provided, the charge storage layer 44 is not in contact with the semiconductor layer 33. The charge storage layer 44 has, for example, a length in the X direction greater than a length of the insulating layer 43 in the X direction.

Accordingly, the insulating layer 42, the insulating layer 43, the charge storage layer 44, and the insulating layer 45 are provided in this order from a surface of the conductor 41 that faces the semiconductor layer 33 toward a side surface S5 (or a side surface S6) of the semiconductor layer 33, between the conductor 41 and the semiconductor layer 33. A region including part of the semiconductor layer 33, part of the conductor 41, part of the insulating layer 42, the insulating layer 43, the charge storage layer 44, and the insulating layer (also referred to as an "intersection area" between the semiconductor layer 33 and the word line pillar WLP) functions as a memory cell transistor MC.

The insulating layers 42 and 43 are formed using an insulating material. The insulating material is formed using, for example, a high-dielectric-constant film of an oxide or a nitride of Al, Hf, Ti, Zr, lanthanum (La), etc., a high breakdown voltage film of a silicon oxide or a silicon oxynitride, or a mixture or a laminated film thereof. In the description that follows, a case will be described where the insulating layers 42 and 43 are formed using $SiO_2$. In the case of a memory cell transistor MC of an FG type, the charge storage layer 44 is formed using, for example, polysilicon. The insulating layer 45 is formed using, for example, a mixture or a laminated film of $SiO_2$, SiN, or silicon oxynitride (SiON). In the present embodiment, a case will be described where $SO_2$ is used as the insulating layer 45.

1.1.5 Cross-Sectional Configuration of Memory Cell Array

Next, a description will be given of an example of a cross-sectional configuration of the memory cell array 11. FIG. 5 is a sectional view taken along line A1-A2 of FIG. 4.

As shown in FIG. 5, an insulating layer 51 is provided on a semiconductor substrate 50. The insulating layer 51 is formed using, for example, $SiO_2$. The insulating layer 51 may include therein a plurality of interconnect layers (not illustrated) and a transistor (not illustrated) formed on the semiconductor substrate 50.

An insulating layer 52 is provided on the insulating layer 51. The insulating layer 52 functions as an etching stopper in processing memory trenches MT and holes for various contact plugs, or the like. The insulating layer 52 may be of any insulating material that provides a sufficiently high etching selectivity to an insulating layer 53 formed thereon, and examples of such a material include SiN and aluminum oxide (AlO).

Five active areas AA, for example, are arranged on the insulating layer 52, with an insulating layer 53 interposed between adjacent layers. That is, five active areas AA and five insulating layers 53, for example, are arranged in an alternating manner on the insulating layer 52. The number of active areas AA that are stacked may be freely designed.

An insulating layer 54 is provided on the uppermost insulating layer 53. The insulating layer 54 functions as an etching stopper. The insulating layer 54 may be of, for example, any insulating material that provides a sufficiently high etching selectivity to the semiconductor layer 31, the insulating layers 34 and 53, etc. The insulating layer 54 is formed using, for example, AlO.

A word line pillar WLP is provided so as to penetrate the insulating layer 54 as well as the five insulating layers 53 and the five active areas AA that are arranged in an alternating manner, and to reach, at its bottom surface, the insulating layer 52. In the interior portion of the word line pillar WLP, an insulating layer 42 which is in contact with, at its side surface, the insulating layers 53 and 54 and the active areas AA, and a conductor 41 which is in contact with, at its side surface, the insulating layer 42 and is in contact with, at its bottom surface, the insulating layer 52, are provided.

An insulating layer 32, a semiconductor layer 33, an insulating layer 45, a charge storage layer 44, and an insulating layer 43 are provided in this order from the side of the semiconductor layer 31 toward the side of the insulating layer 42, between the semiconductor layer 31 and the insulating layer 42.

A memory trench MT is provided so as to penetrate the insulating layer 54 as well as the five insulating layers 53 and the five active areas AA that are stacked in an alternating manner, and to reach, at its bottom surface, the insulating layer 52.

An insulating layer 35 is embedded in an interior portion of the memory trench MT.

An insulating layer 32, a semiconductor layer 33, and an insulating layer 34 are provided in this order from the side of the semiconductor layer 31 toward the side of the insulating layer 35, between the semiconductor layer 31 and the insulating layer 35.

An insulating layer 55 is provided on the insulating layer 35 and partial region of the insulating layer 54, so as to expose a top surface of the conductor 41. The insulating layer 55 is formed using, for example, $SiO_2$.

A plurality of conductive layers 56 are provided on the insulating layer 55 in such a manner that their bottom surfaces are partly in contact with the top surface of the conductor 41. The conductive layers 56 function as word lines WL. The conductive layers 56 are formed using a conductive material. The conductive material may be, for example, a metal material, or a semiconductor material doped with impurities. The conductive material may be, for example, a metal material containing Cu.

1.2 Method of Manufacturing Memory Cell Array

Next, a method for manufacturing the memory cell array 11 will be described with reference to FIGS. 6 to 19. Each of FIGS. 6 to 19 shows a top surface of an uppermost active area AA (AA top surface) and a cross section taken along line A1-A2 (A1-A2 cross section) in a process of manufacturing the memory cell array 11.

Figure 6:
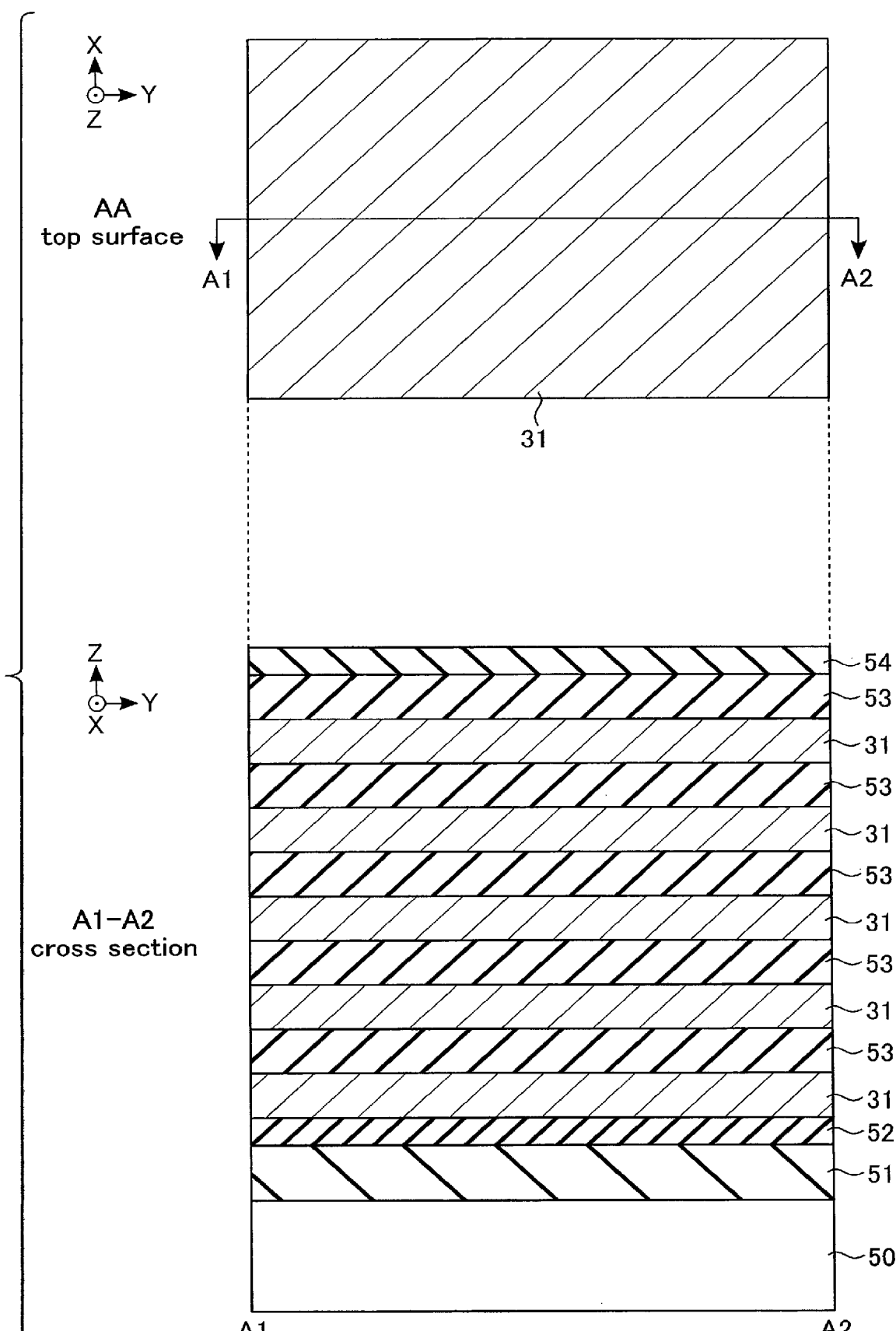

As shown in FIG. 6, insulating layers 51 and 52 are formed on a semiconductor substrate 50.

In this state, five semiconductor layers 31 and five insulating layers 53, for example, are stacked in an alternating manner on the insulating layer 52. An insulating layer 54 is formed on the uppermost insulating layer 53.

As shown in FIG. 7, a memory trench MT is formed so as to penetrate the insulating layer 54, the five insulating layers 53, and the five semiconductor layers 31, and to reach, at its bottom surface, the insulating layer 52.

Figure 8:
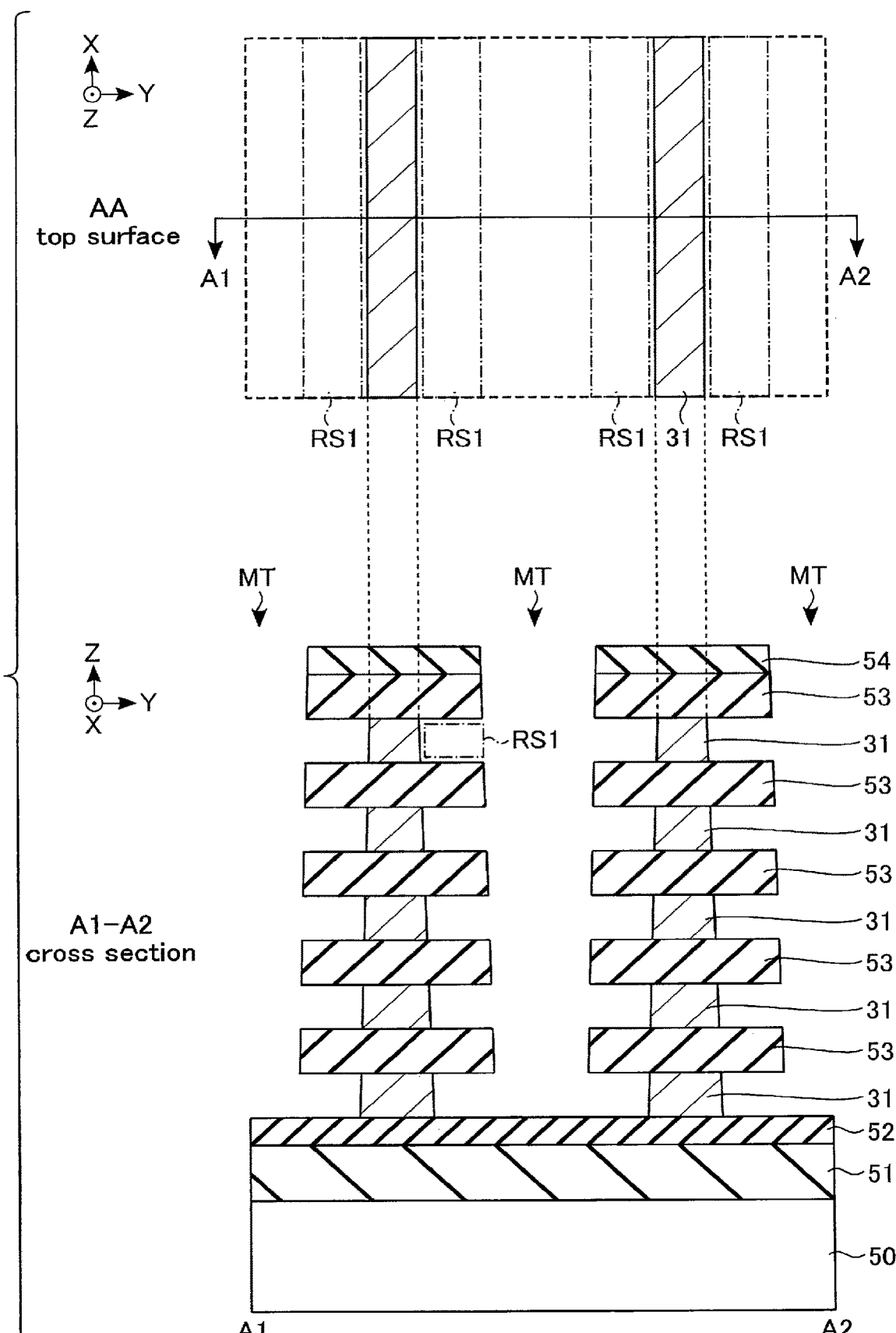

As shown in FIG. 8, the semiconductor layers 31 are processed from side surfaces of the memory trench MT by, for example, wet etching, thereby forming a plurality of recess regions RS1.

Figure 9:
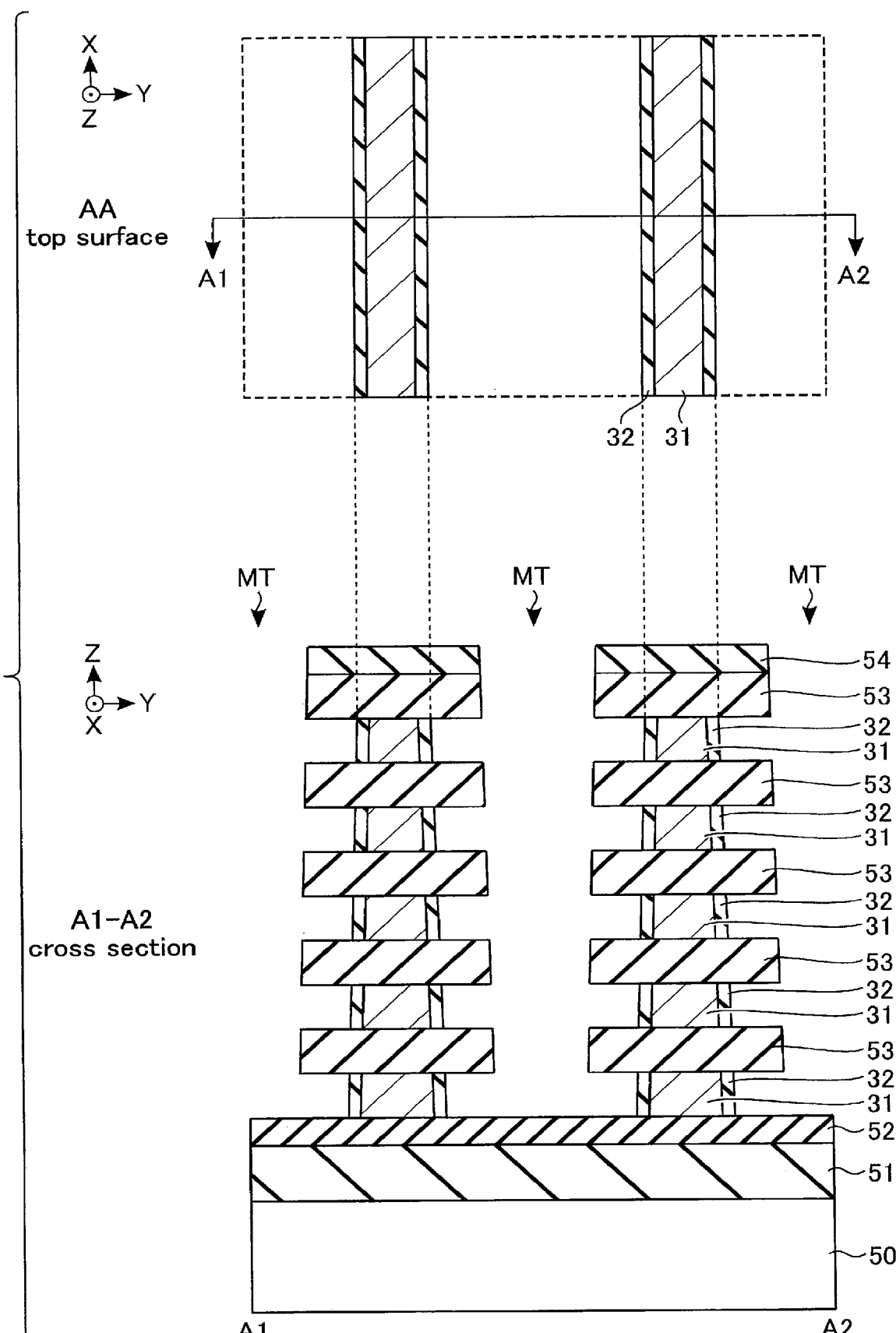

As shown in FIG. 9, a plurality of insulating layers 32 are formed on side surfaces of the semiconductor layers 31. For example, the insulating layers 32 may be formed by an oxidative treatment of the semiconductor layers 31, or may be formed on surfaces of the semiconductor layers 31 by selective CVD, etc.

Figure 10:
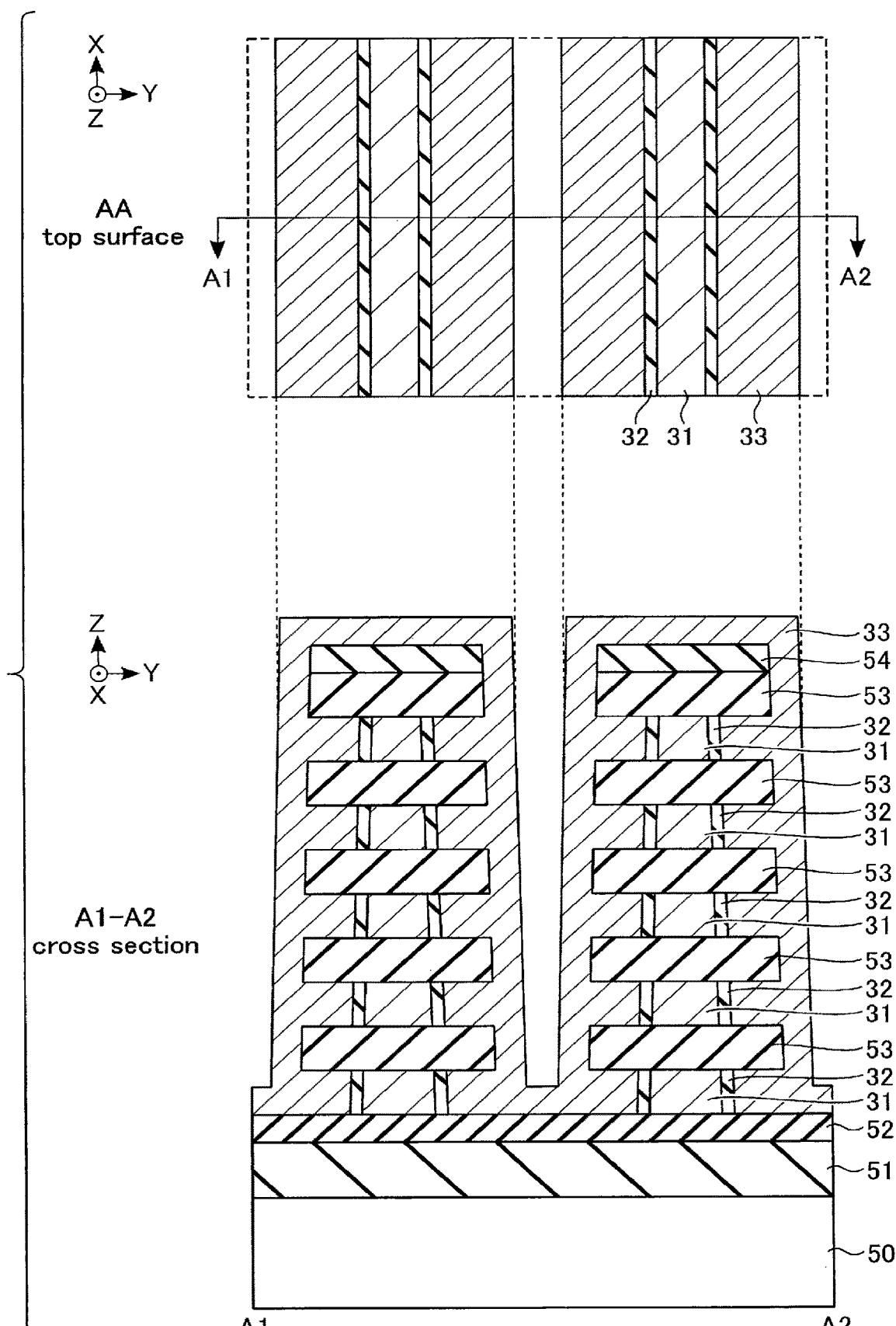

As shown in FIG. 10, a semiconductor layer 33 is formed so as to fill in the recess regions RS1 and to cover the insulating layers 52 to 54. When, for example, the semiconductor layer 33 is polysilicon, amorphous silicon is formed by CVD, and then polysilicon is formed by a thermal treatment.

Figure 11:
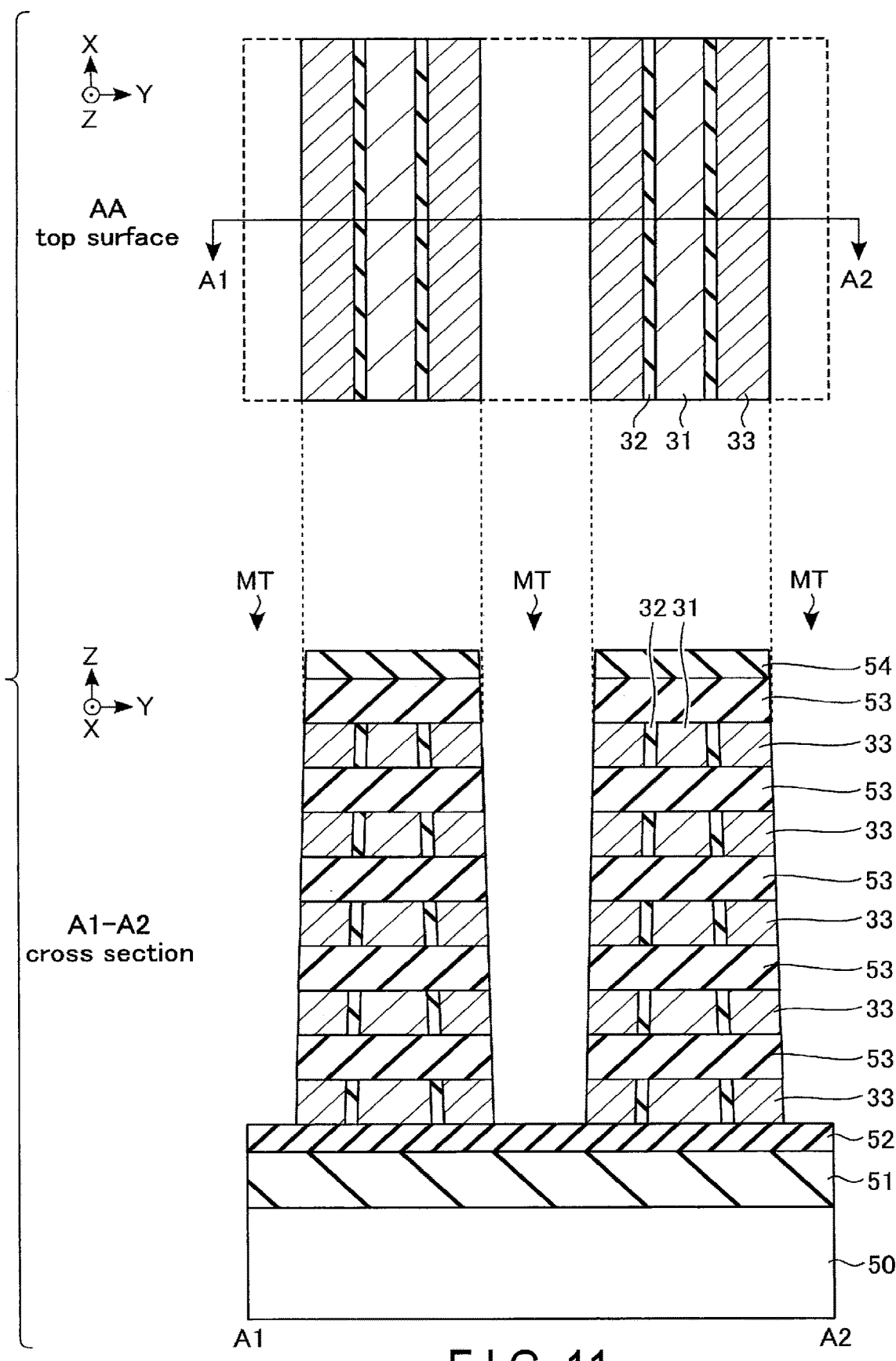

As shown in FIG. 11, portions of the semiconductor layer 33 that are in contact with top surfaces of the insulating layers 52 and 54 and side surfaces of the insulating layers 53 are removed by, for example, wet etching or chemical dry etching (CDE), in such a manner that the semiconductor layer 33 remains in the recess regions RS1.

Figure 12:
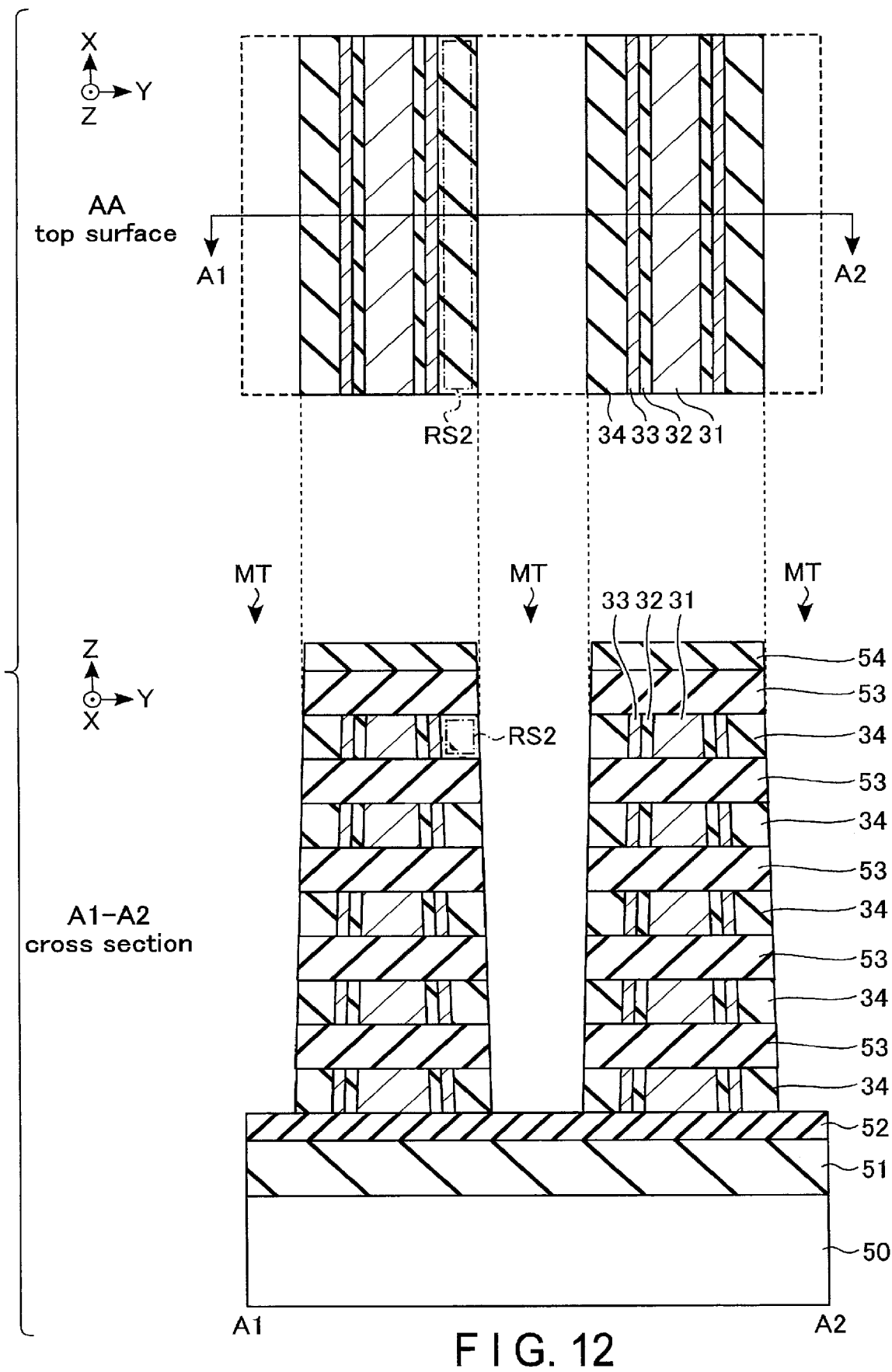

As shown in FIG. 12, portions of the semiconductor layers 33 are processed from their side surfaces by, for example, wet etching or CDE, in such a manner that the semiconductor layers 33 which are in contact with the insulating layers 32 remain, thereby forming a plurality of recess regions RS2. Next, an insulating layer 34 is formed by, for example, CVD, so as to fill in the recess regions RS2. Thereafter, portions of the insulating layer 34 which are in contact with the top surfaces of the insulating layers 52 and 54 and the side surfaces of the insulating layers 53 are removed, in such a manner that the insulating layer 34 remains in the recess regions RS2.

Figure 13:
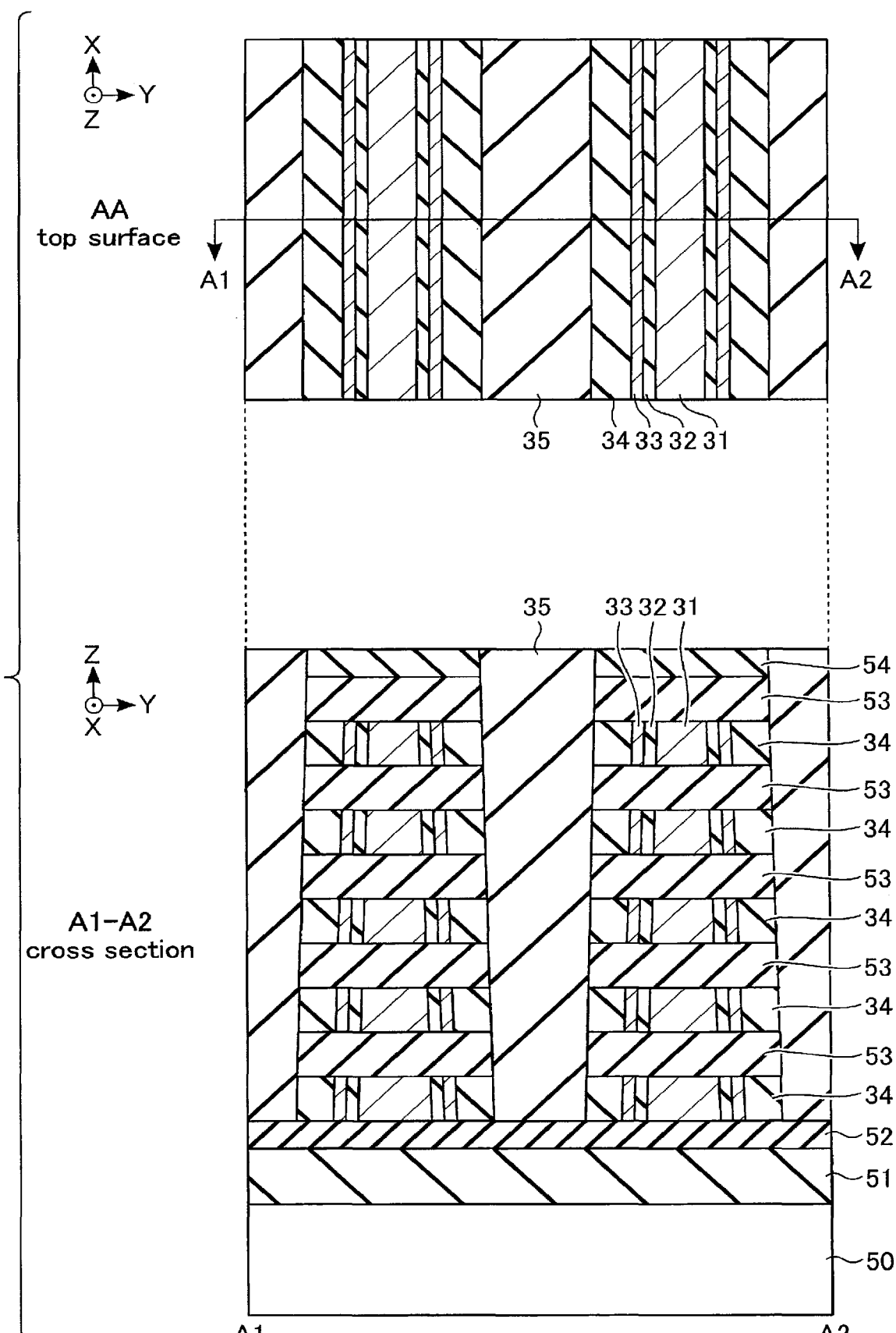

As shown in FIG. 13, an insulating layer 35 is embedded in an interior portion of the memory trench MT. For example, a spin-on glass (SOG), which has excellent embedding property, may be employed as $SiO_2$ used in the insulating layer 35. In this case, a material containing polysilazane may be used as an SOG coating material.

Figure 14:
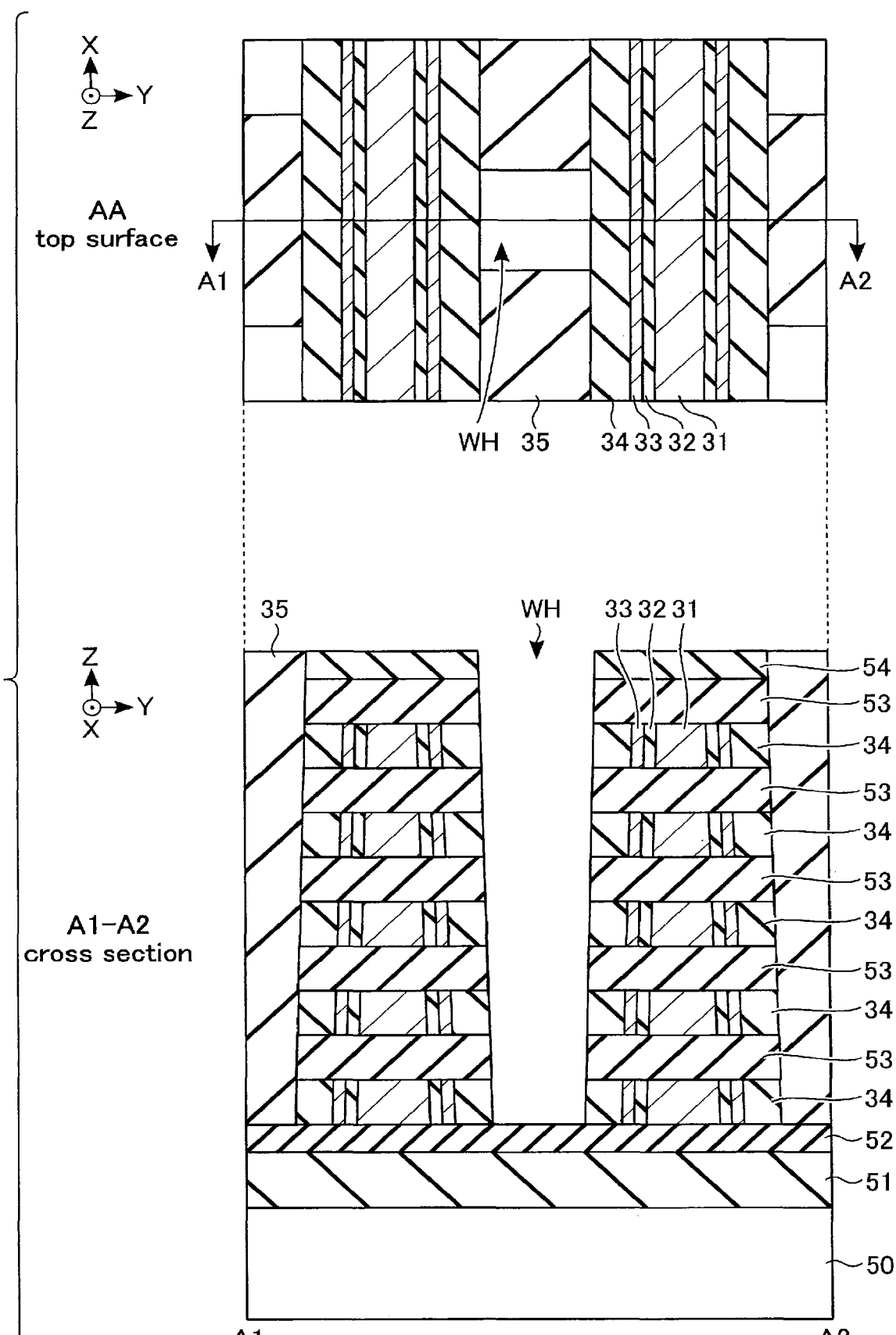

As shown in FIG. 14, a hole WH corresponding to a word line pillar WLP is formed by processing the insulating layer 35 by, for example, RIE.

Figure 15:
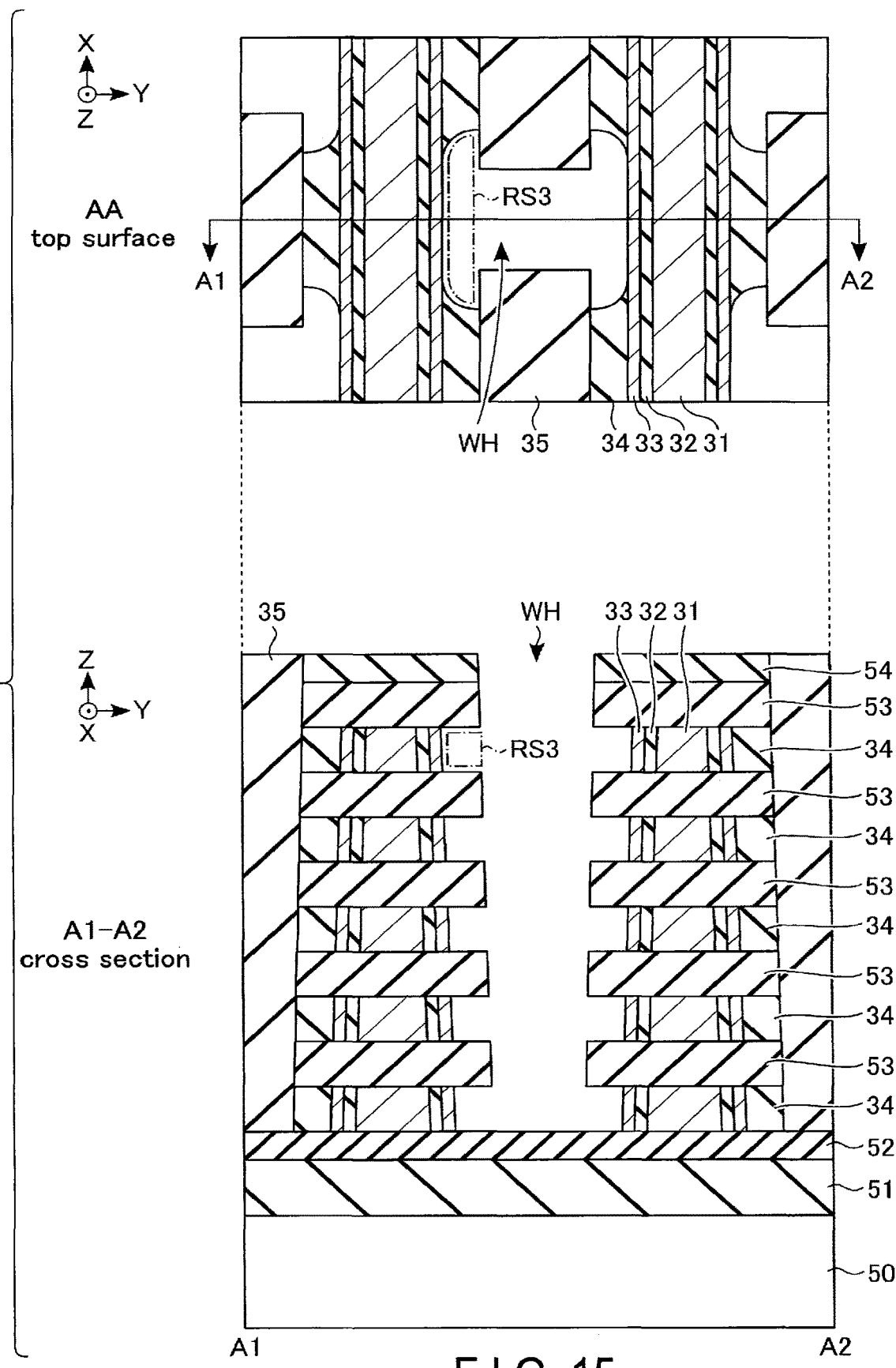

As shown in FIG. 15, the insulating layers 34 are processed from side surfaces of the hole WH by, for example, wet etching or CDE until the semiconductor layers 33 are exposed, thereby forming recess regions RS3.

As shown in FIG. 16, insulating layers 45 are formed by, for example, selective CVD on surfaces of the exposed semiconductor layers 33.

Figure 17:
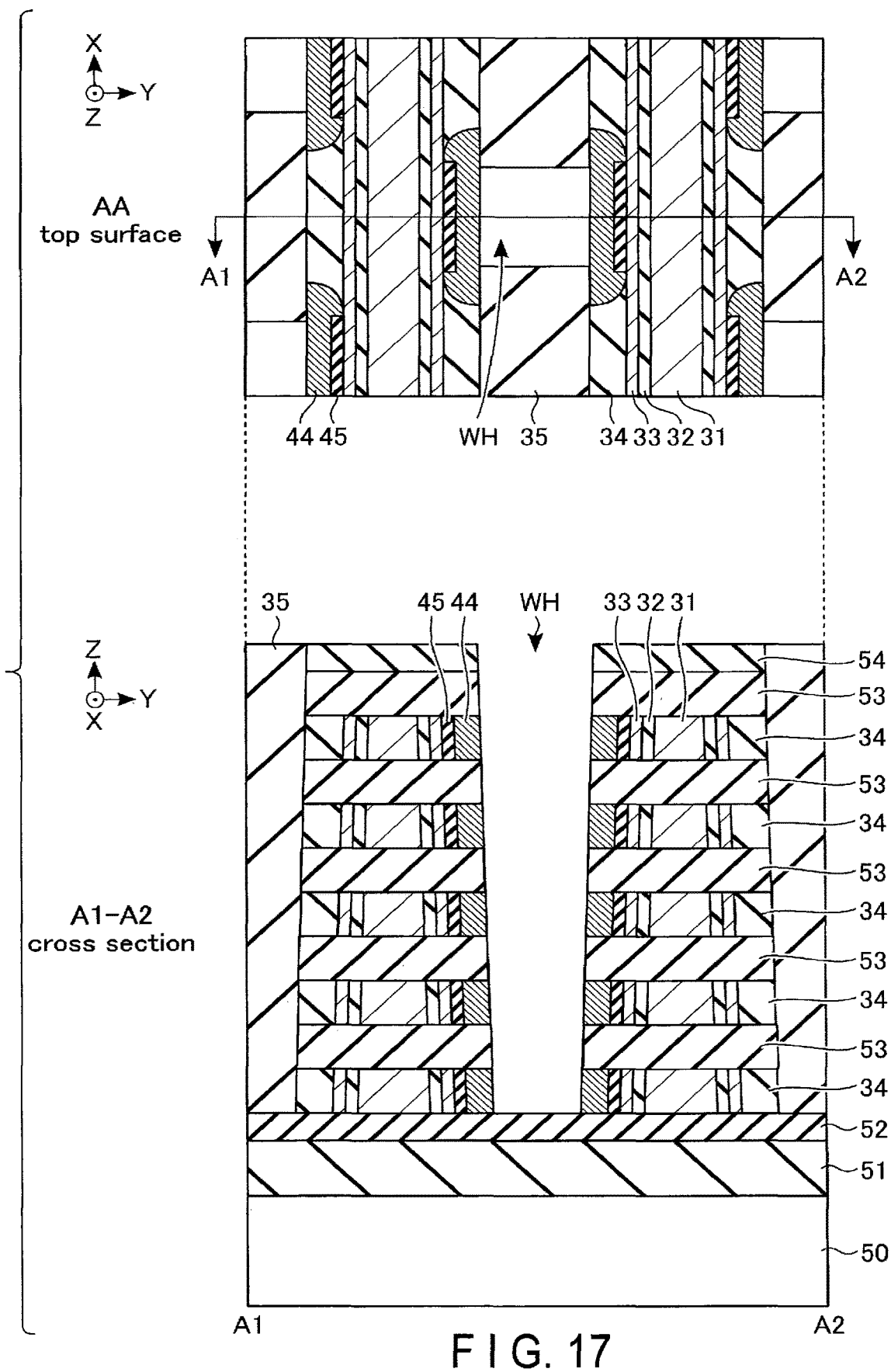

As shown in FIG. 17, charge storage layers 44 are formed in the recess regions RS3. More specifically, when, for example, the charge storage layer 44 is polysilicon, amorphous silicon is formed by CVD so as to fill in the recess regions RS3, in a procedure similar to that described with reference to FIGS. 10 and 11. Subsequently, polysilicon is formed by a thermal treatment. Thereafter, portions of the polysilicon that are formed on top surfaces of the insulating layers 35, 52, and 54, and side surfaces of the insulating layer 53, are removed by, for example, wet etching or CDE.

Figure 18:
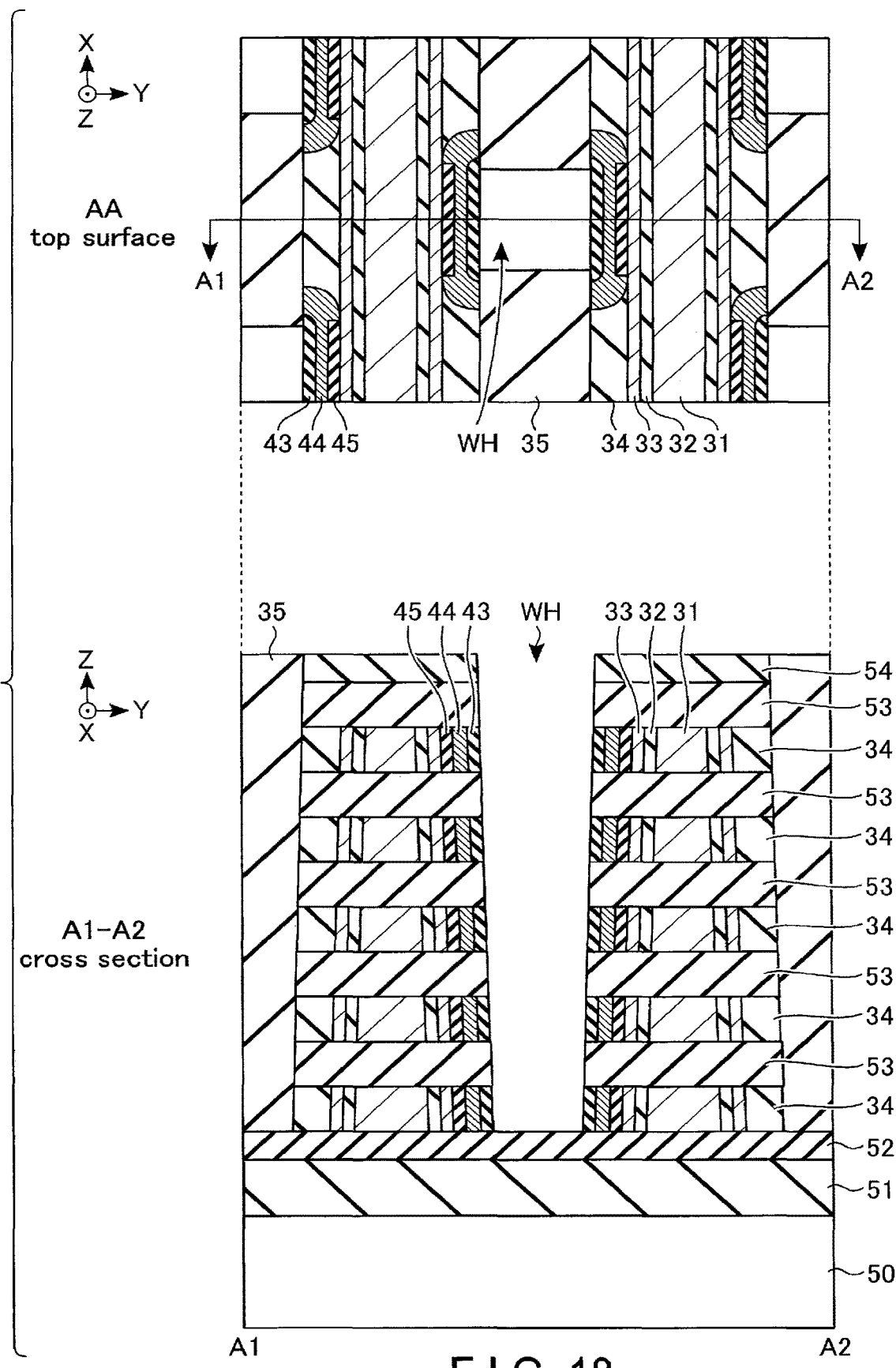

As shown in FIG. 18, portions of the charge storage layer 44 are processed from side surfaces of the hole WH by, for example, wet etching, in such a manner that portions of the charge storage layer 44 that are in contact with the insulating layers 45 remain, thereby forming recess regions. Subsequently, an insulating layer 43 is formed by, for example, CVD, so as to fill in the recess regions. Thereafter, portions of the insulating layer 45 that are in contact with the top surfaces of the insulating layers 35, 52, and 54 and the side surfaces of the insulating layers 53 are removed, in such a manner that the insulating layer 43 remains in the recess regions.

Figure 19:
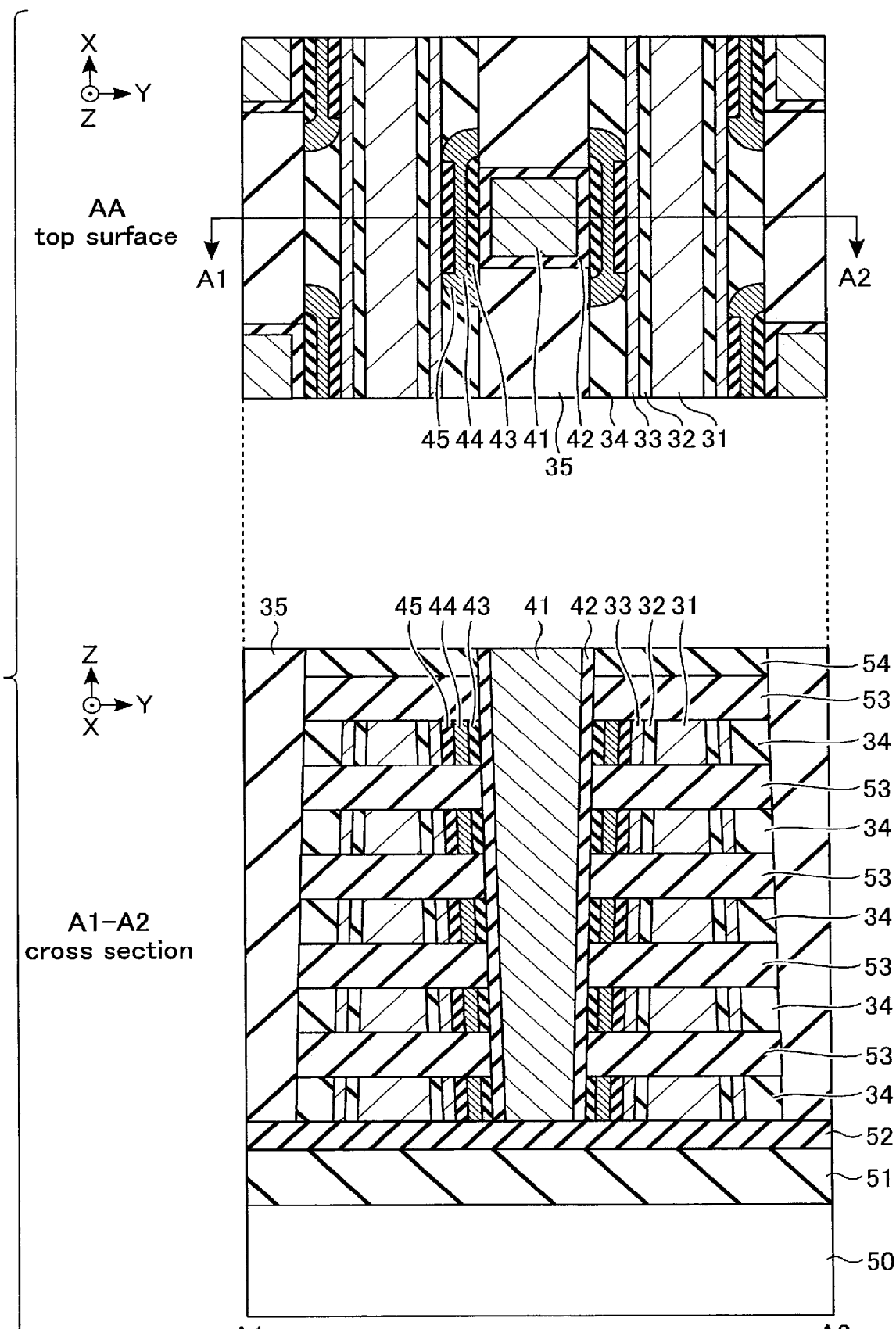

As shown in FIG. 19, an interior portion of the hole WH is filled with an insulating layer 42 and a conductor 41. More specifically, the insulating layer 42 is formed by, for example, CVD. Subsequently, portions of the insulating layer 42 that are in contact with top surfaces of the insulating layers 35, 52, and 54 are removed by RIE. Thereafter, if the conductor 41 has a stacked structure of TiN and W, TiN is formed by CVD. Subsequently, W is formed by CVD, and is buried in the interior portion of the hole WH. Thereafter, portions of the TiN and W that are in contact with top surfaces of the insulating layers 35 and 54 are removed by chemical mechanical polishing (CMP).

1.3 Effects of Present Embodiment

With the configuration of the present embodiment, it is possible to improve reliability of the semiconductor memory device. This effect will be explained in detail below.

When, for example, the insulating layer 32 and the semiconductor layer 33 are not provided in the active area AA, the insulating layer 45 (i.e., the tunnel insulating film) is in contact with the semiconductor layer 31. The semiconductor layer 31 functions as a channel of the memory cell transistor MC. When, for example, polysilicon is used as the semiconductor layer 31, the carrier mobility decreases due to the relatively small particle size of polysilicon. Due to the thick thickness of polysilicon in the Y direction, an S value (a coefficient indicating current rising properties in a sub-threshold region) of the memory cell transistors MC deteriorates, thus causing possible deterioration in the cell properties of the memory cell transistors MC. Moreover, due to, for example, variations in a plane direction of the polysilicon (channel) according to the layer as viewed in the Z direction, there may be variations in the cell currents of the memory cell transistors MC.

On the other hand, with the configuration of the present embodiment, it is possible to form semiconductor layers 33 with a thin thickness through provision of insulating layers 32 and the semiconductor layers 33 in active areas AA. It is thereby possible to form channels with a thin thickness in memory cell transistors MC. This results in improvement in the S value. It is thereby possible to improve the transistor properties of the memory cell transistors MC. This results in improvement in reliability of the semiconductor memory device.

2. Second Embodiment

Next, a second embodiment will be described. In the second embodiment, three example cases will be described where a material different from polysilicon as described in the first embodiment is used as the semiconductor layer 33, or a manufacturing method of the semiconductor layer 33 different from that of the first embodiment is used. Hereinafter, the description will focus mainly on matters different from those of the first embodiment.

2.1 First Example

A first example will be described. In the first example, a case will be described where a semiconductor layer 33 is formed using a metal sulfide. A cross-sectional configuration of a memory cell array 11 when the semiconductor layer 33 is formed using a metal sulfide is similar to that of FIG. 5 of the first embodiment.

The metal sulfide is formed using a metal such as tungsten (W), molybdenum (Mo), hafnium (Hf), or zirconium (Zr). The metal sulfide formed by using such a metal is capable of forming a crystal of a metal sulfide that has a C-axis orientation, depending on the formation conditions.

The metal sulfide may be either layered crystal or a metal disulfide. A metal sulfide that has a C-axis orientation has, even in the form of an ultrathin film (e.g., of 1 nm or less), a band gap of 1 to 2 eV, and is a material whose mobility ranges from several hundred to several thousand $cm^2/Vs$. Accordingly, a metal sulfide can be employed as an ultrathin high-mobility channel material in the semiconductor layer 33.

Next, a method for manufacturing the memory cell array 11 will be described with reference to FIGS. 20 to 21. Each of FIGS. 20 and 21 shows a top surface of an uppermost active area AA and a cross section taken along line A1-A2 in a process of manufacturing the memory cell array 11.

The steps up to formation of insulating layers 32 are the same as those described in the first embodiment with reference to FIGS. 6 to 9.

Figure 20:
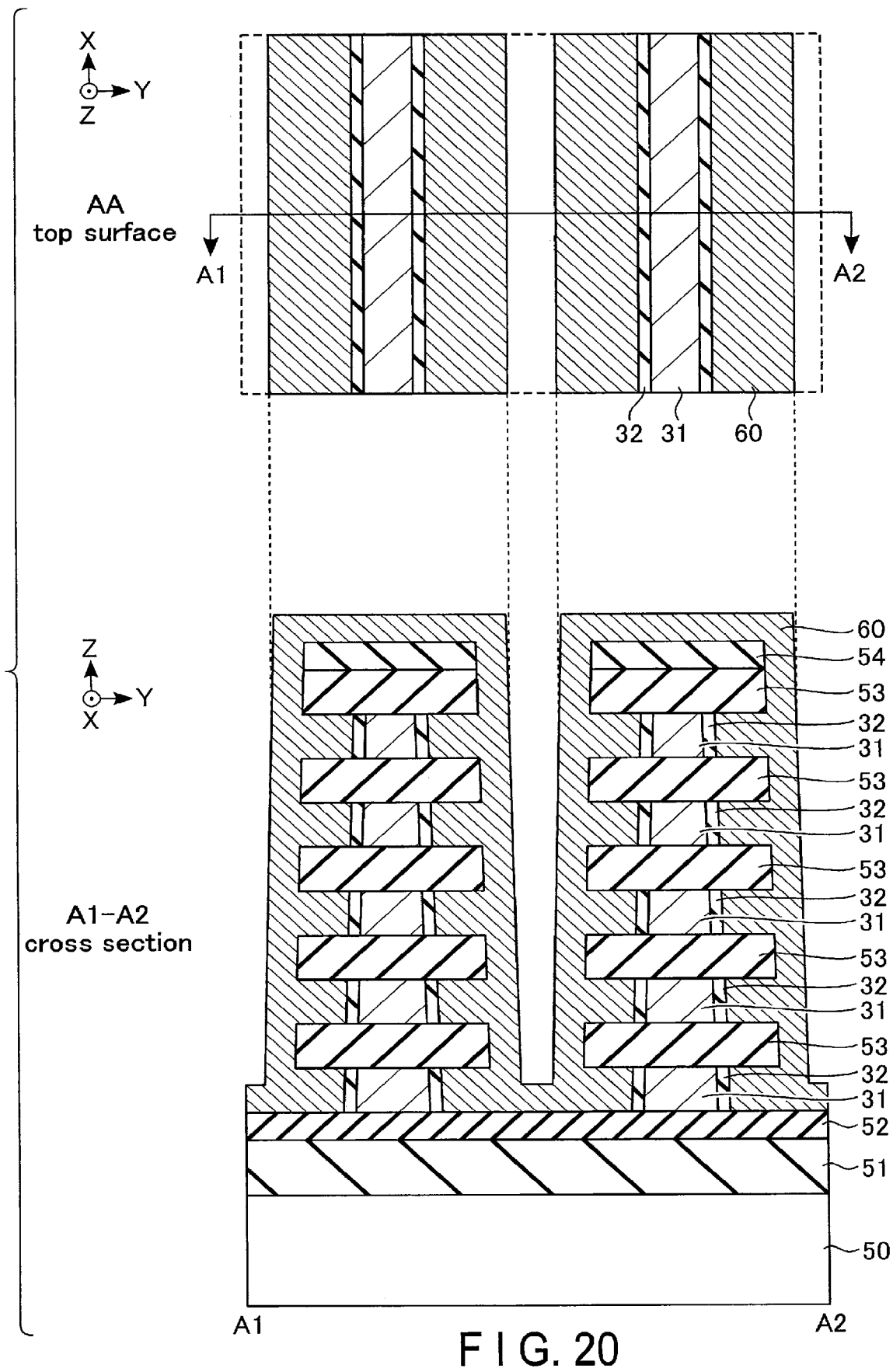
FIGS. 20 and 21 are diagrams showing a process of manufacturing the memory cell array included in the semiconductor memory device according to a first example of a second embodiment.

As shown in FIG. 20, after the insulating layers 32 are formed, an S-rich amorphous metal sulfide 60 is formed so as to fill in recess regions RS1 and cover the insulating layers 52 to 54. When, for example, the metal sulfide is $WS_2$, S-rich amorphous $WS_x$ (where X is a number greater than 2) is formed as the amorphous metal sulfide 60. More specifically, the amorphous $WS_x$ is formed by, for example, plasma CVD at a deposition temperature of 25° C. to 300° C., using tungsten hexafluoride ($WF_6$) and hydrogen sulfide ($H_2S$) as a source gas. The deposition method of the amorphous metal sulfide 60 is not limited to CVD.

Figure 21:
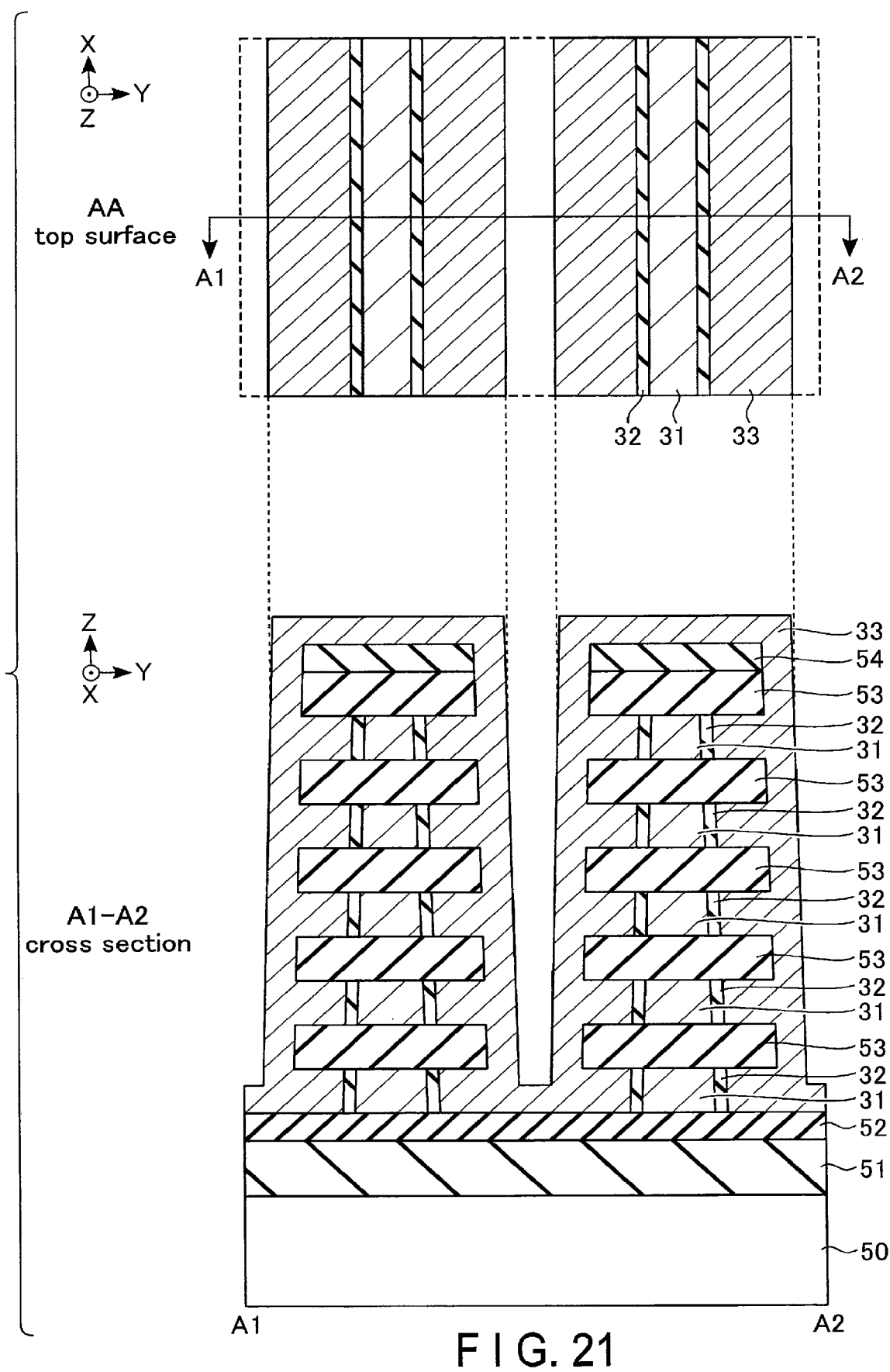

As shown in FIG. 21, the amorphous metal sulfide 60 is crystallized by a thermal treatment, and thereby a metal sulfide (semiconductor layer 33) is formed. The metal sulfide may be either layered crystal or a metal disulfide. Through the crystallization by a thermal treatment, it is possible to form a metal sulfide with a relatively small surface roughness. The thermal treatment is performed at a nitrogen ($N_2$) atmosphere at 300° C. to 1150° C. Through this thermal treatment, an excessive amount of S is desorbed, and a metal sulfide that has a C-axis orientation is formed. The steps that follow are similar to those of FIGS. 11 to 19 of the first embodiment. A metal material contained in a metal sulfide can be confirmed by EDX analysis in a transmission electron microscope (TEM). When, for example, the metal sulfide is a layered crystal, it can be confirmed by, for example, observation using a TEM. A C-axis orientation can be confirmed by, for example, precession electron diffraction (PED) using a TEM.

A case has been described where $WF_6$ and $H_2S$ are used as a CVD source gas for forming the amorphous metal sulfide 60; however, the source gas is not limited thereto. When, for example, the metal sulfide is formed using a metal of at least one of W, Mo, Hf, and Zr, CVD may be performed using, as source materials, a combination including at least one of MoCl5, $M_VC_XO_YH_Z$ (where V, X, Y, and Z are integers and M is one of W, MO, HF, AND ZR), $H_2S$, S, AND $C_XH_YS_Z$ (WHERE X, Y, Z ARE INTEGERS). The atmosphere of the thermal treatment is not limited to $N_2$. The thermal treatment may be performed in an atmosphere containing, for example, at least one of $N_2$, oxygen ($O_2$), argon (Ar), helium (He), hydrogen ($H_2$), and $H_2S$.

2.2 Second Example

A second example will be explained. In the second example, a case will be described where polysilicon formed by a metal-induced crystallization (MIC) method is used as the semiconductor layer 33.

The polysilicon formed by the MIC method contains metal atoms at $4.0\times10^{17}$ atoms/cm$^3$ or less. It is preferable that the metal atoms contain at least one of the atoms of, for example, gold (Au), aluminum (Al), copper (Cu), silver (Ag), palladium (Pd), nickel (Ni), and platinum (Pt). Alternatively, the metal atoms may contain at least one of the atoms of manganese (Mn), rhodium (Rh), cobalt (Co), iron (Fe), chromium (Cr), titanium (Ti), niobium (Nb), iridium (Ir), tantalum (Ta), rhenium (Re), Mo, vanadium (V), Hf, ruthenium (Ru), Zr, and W. With these metals, silicon (semiconductor layer 33) can be crystallized at a lower temperature, and the crystal grain size can be increased compared to when the MIC method is not used.

2.2.1 Cross-Sectional Configuration of Memory Cell Array

Next, details of a cross-sectional configuration of the memory cell array 11 will be described with reference to FIG. 22. FIG. 22 is an enlarged view of a region R1 shown in FIG. 5 of the first embodiment.

As shown in FIG. 22, the semiconductor layer 33 formed by the MIC method contains metal atoms 66 at $4.0\times10^{17}$ atoms/cm$^3$ or less. Moreover, the semiconductor layer 33 formed by the MIC method has, for example, a (100) orientation toward a direction (Y direction) that is perpendicular to the insulating layer 32. The crystal orientation of the semiconductor layer 33 can be confirmed by, for example, PED using a TEM.

The other configuration is similar to that of the first embodiment.

2.2.2 Method of Manufacturing Memory Cell Array

Next, an example of a method of manufacturing a memory cell array 11 will be described with reference to FIGS. 23 to 28. Each of FIGS. 23 to 28 shows a top surface of an uppermost active area AA and a cross section taken along line A1-A2 in a process of manufacturing the memory cell array 11.

The steps up to formation of insulating layers 32 are the same as those described in the first embodiment with reference to FIGS. 6 to 9.

Figure 23:
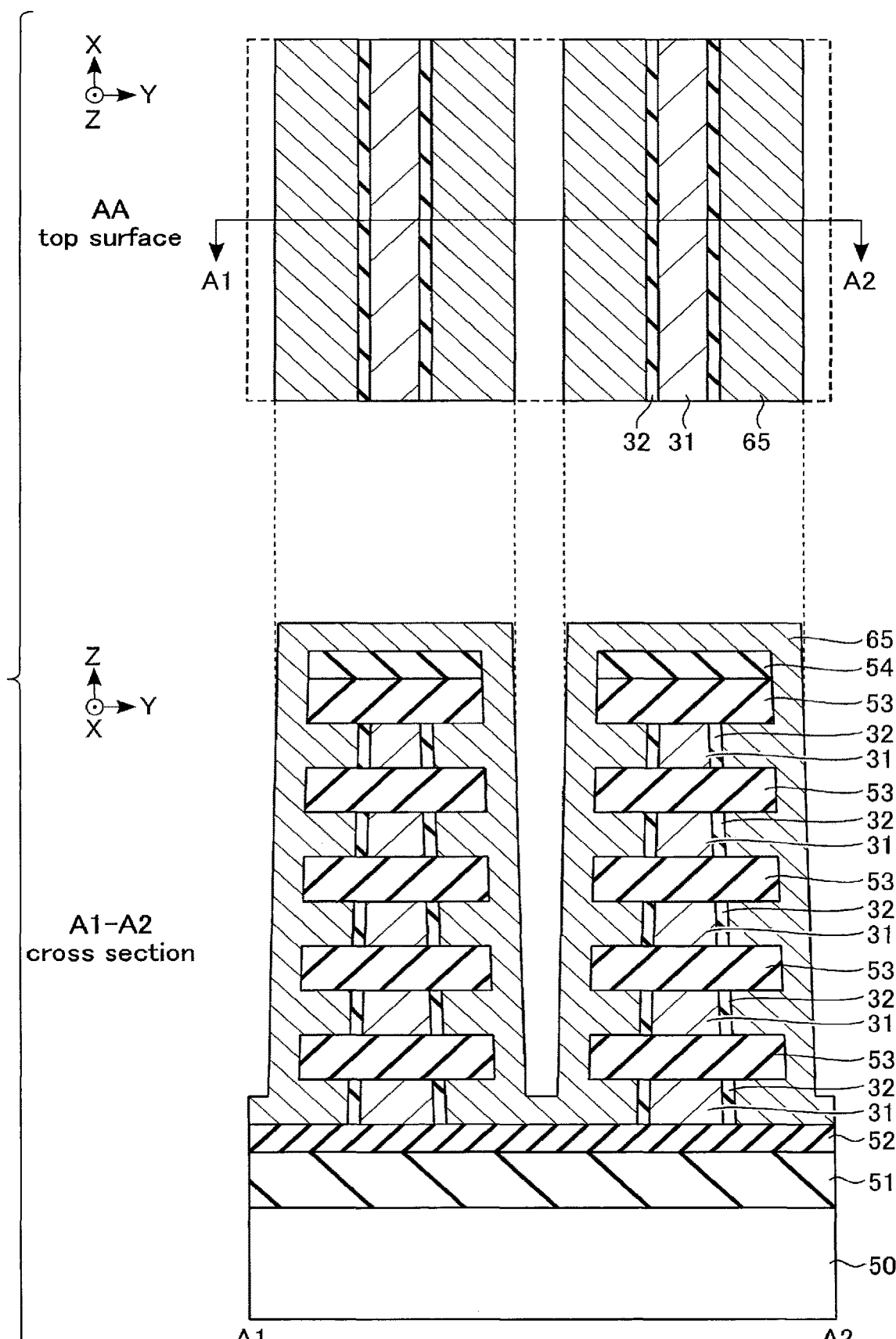
FIGS. 23 to 28 are diagrams showing a process of manufacturing the memory cell array included in the semiconductor memory device according to the second example of the second embodiment.

As shown in FIG. 23, after the insulating layer 32 is formed, an amorphous semiconductor layer 65 (e.g., amorphous silicon) is formed so as to fill in the recess regions RS1 and cover the insulating layers 52 to 54.

Figure 24:
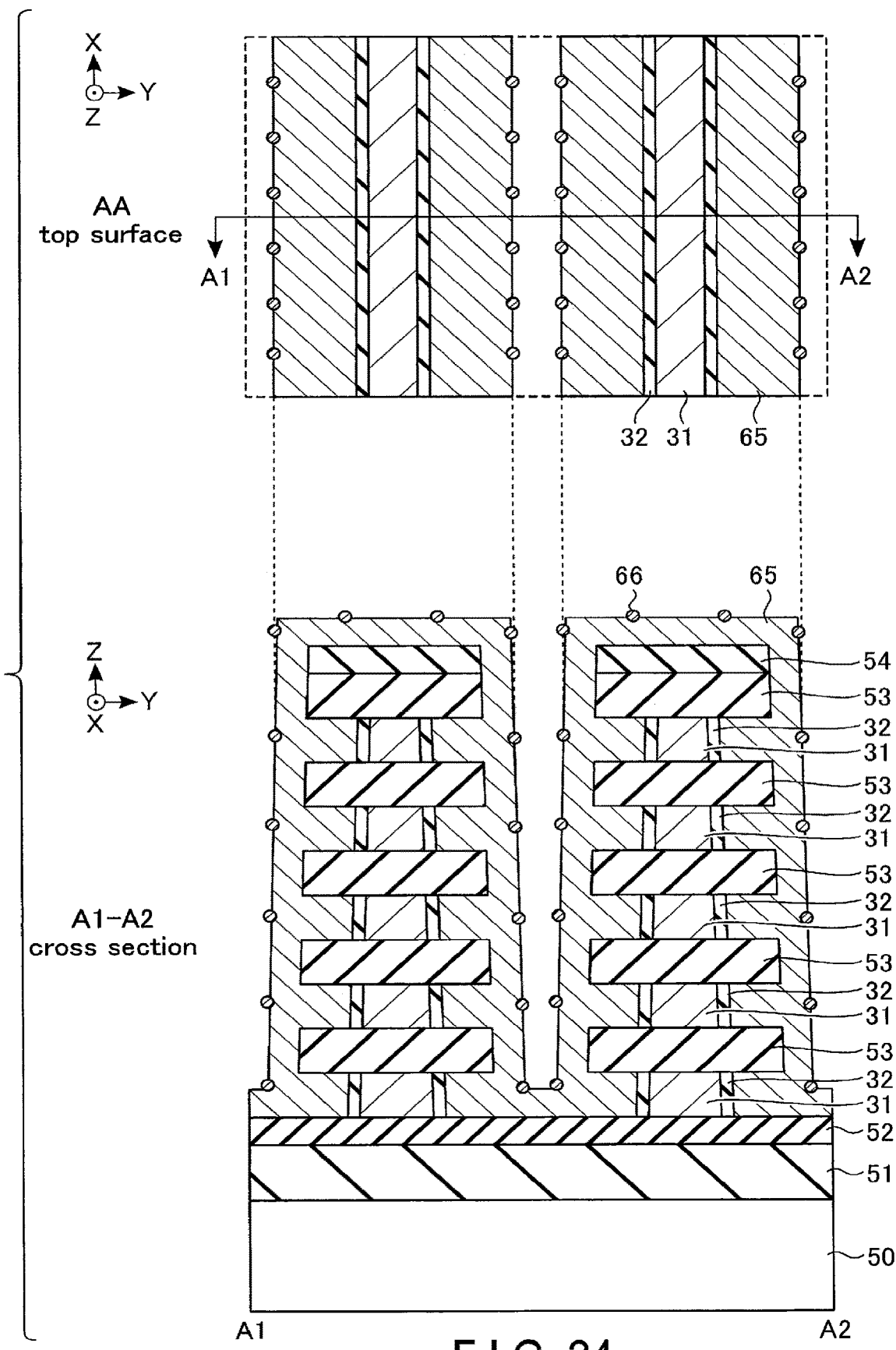

As shown in FIG. 24, metal atoms 66 are adhered on side surfaces of the amorphous semiconductor layer 65. A liquid containing the metal atoms 66, for example, is supplied to a surface of the amorphous semiconductor layer 65. When, for example, the metal atoms 66 are Ni, a Ni solution is supplied to a surface of the amorphous semiconductor layer 65. At this time, the plane concentration of the metal atoms 66 at the surface of the amorphous semiconductor layer 65 is set to, for example, $1.0\times10^{15}$ atoms/cm$^2$ or lower.

Figure 25:
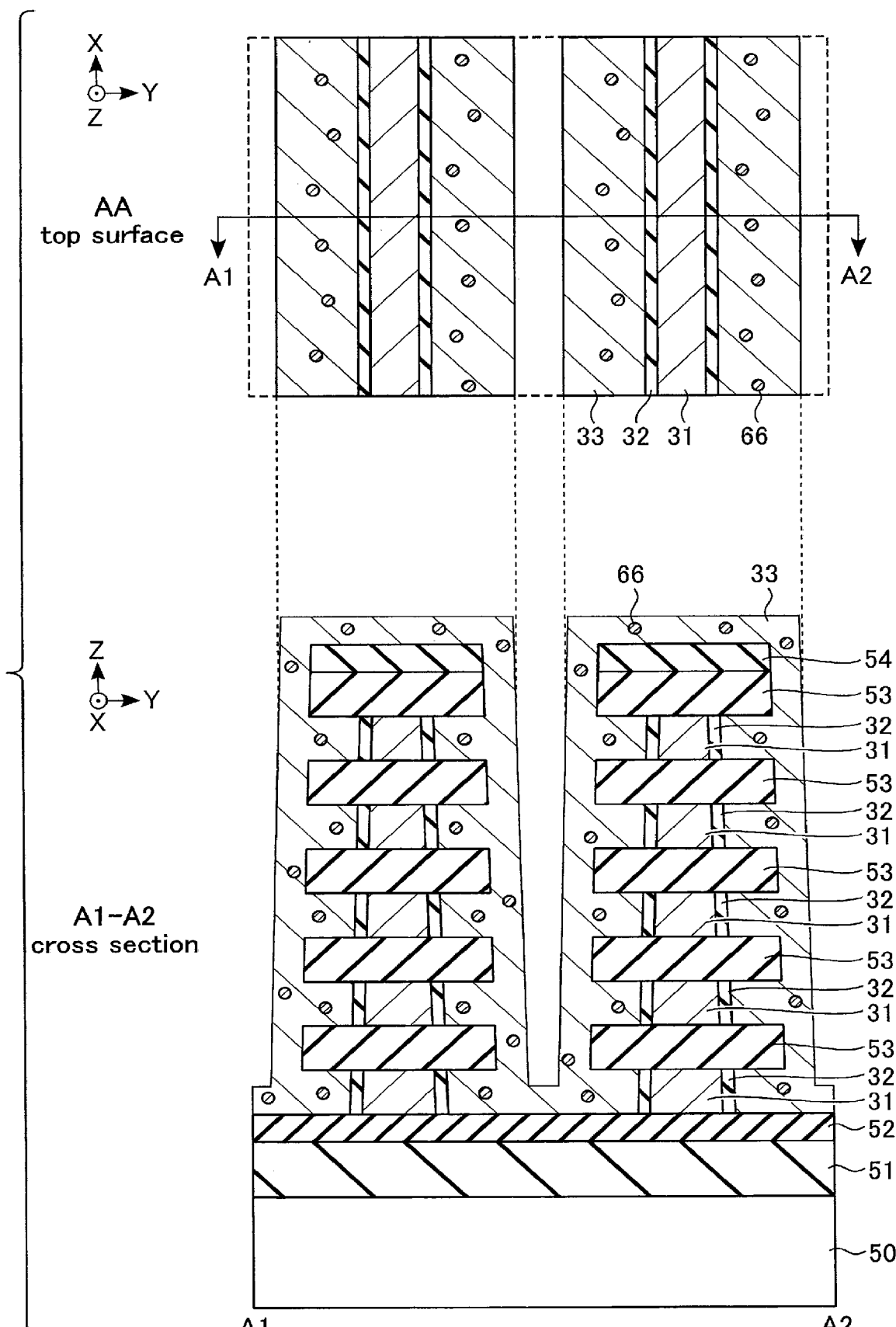

As shown in FIG. 25, a thermal treatment is performed, for example, at a temperature of 500° C. to 1000° C. at a pressure of from 100 Pa to atmospheric pressure. Thereby, the metal atoms 66 are diffused into an interior portion of the amorphous semiconductor layer 65, the amorphous semiconductor layer 65 (e.g., amorphous silicon) is crystallized, and the semiconductor layer 33 (e.g., polysilicon) is formed. The thermal treatment may be performed in an atmosphere containing at least one of H$_2$, deuterium (D$_2$), N$_2$, and a noble gas. More specifically, the semiconductor layer 33 is crystallized at a temperature of 500° C. to 1000° C., in such a manner that a concentration of the metal atoms 66 in the semiconductor layer 33 becomes $5.0\times10^{17}$ atoms/cm$^3$ or higher. Thereby, the semiconductor layer 33 can be crystallized in such a manner that the crystal grain size in the semiconductor layer 33 becomes equal to or greater than 80 nm and equal to or less than 1600 nm. It is also possible to perform a thermal treatment again, after the crystallization of the semiconductor layer 33. This improves the crystallization properties of the semiconductor layer 33.

Figure 26:
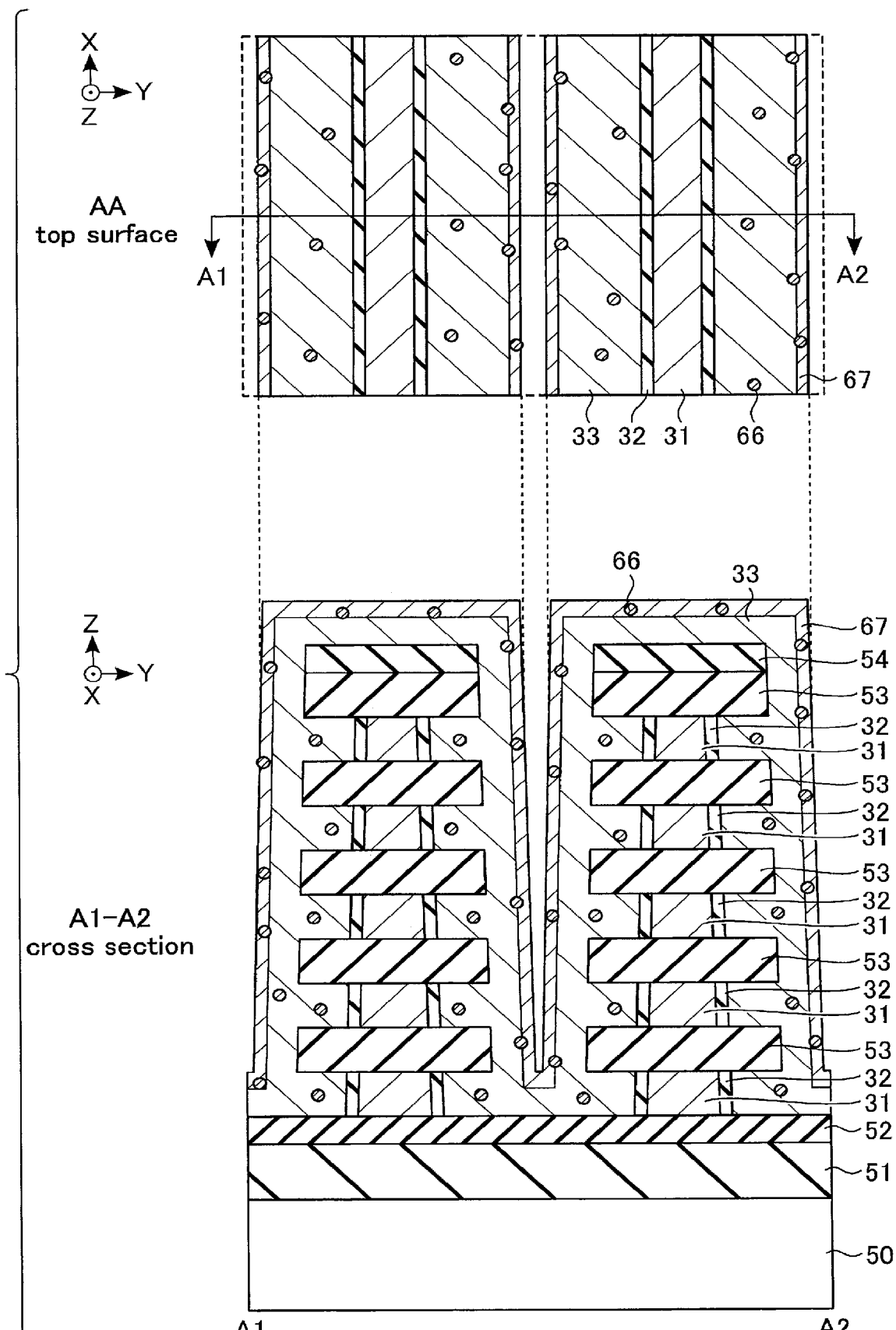

As shown in FIG. 26, a getter layer 67 is formed so as to cover the semiconductor layer 33. The getter layer 67 is provided to extract the metal atoms 66 from the semiconductor layer 33. An amorphous semiconductor material is used as the getter layer 67. Amorphous silicon or amorphous germanium, for example, is used as the getter layer 67. In the present example, a case will be described where amorphous silicon is used as the getter layer 67. The getter layer 67 may be formed with an insulating layer of SiO$_2$, SiN, etc. interposed between the getter layer 67 and the semiconductor layer 33. The thickness of the getter layer 67 is set to, for example, 3 to 30 nm. The getter layer 67 may contain O, N, carbon (C), etc., and may contain boron (B), phosphorus (P), arsenic (As), etc. Through the inclusion of such atoms, the getter layer 67 is capable of maintaining the amorphous state at a relatively high temperature. The getter layer 67 (amorphous silicon) of the present example contains P at a concentration of $1.0\times10^{11}$ atoms/cm$^3$ to $1.0\times10^{22}$ atoms/cm$^3$, or contains B at a concentration of $1.0\times10^{16}$ atoms/cm$^3$ to $1.0\times10^{22}$ atoms/cm$^3$.

After formation of the getter layer 67, a thermal treatment is performed at a temperature equal to or higher than 500° C. Thereby, some of the metal atoms 66 in the semiconductor layer 33 move to the getter layer 67, and the concentration of the metal atoms 66 in the semiconductor layer 33 decreases. Consequently, it becomes possible to decrease the concentration of the metal atoms 66 in the semiconductor layer 33 to $4.0\times10^{17}$ atoms/cm$^3$ or lower. In this case, the thermal treatment may be performed in an atmosphere containing at least one of H$_2$, D$_2$, N$_2$, and a rare gas, or in an oxidizing atmosphere or a reducing atmosphere containing O$_2$, H$_2$O, an O radical or ammonia (NH$_3$).

Figure 27:
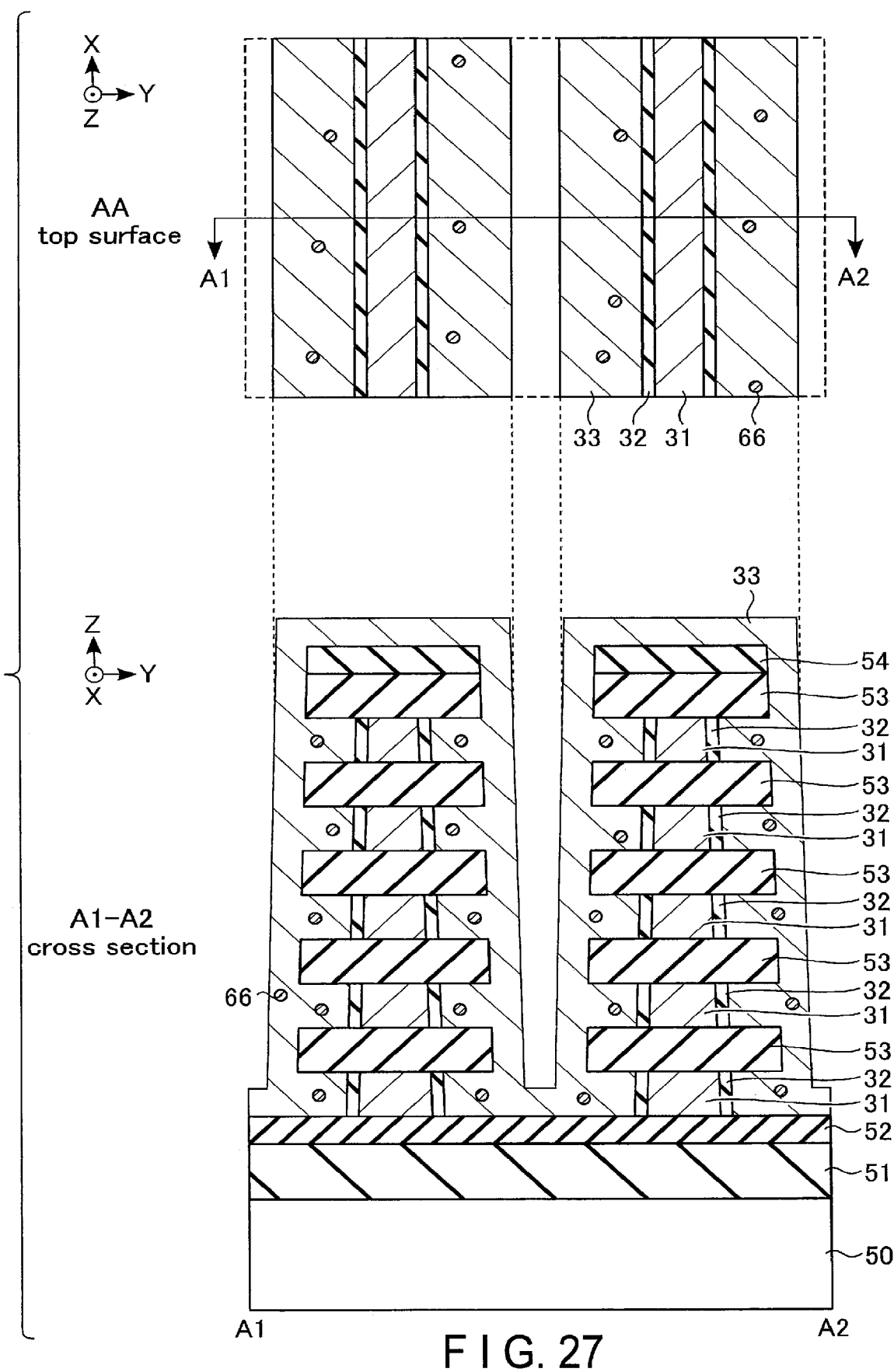

As shown in FIG. 27, the getter layer 67 is removed by, for example, wet etching or CDE, while allowing the semiconductor layer 33 to remain. The number of steps described with reference to FIGS. 26 and 27 may be repeated multiple times. Through the multiple times of repetition, the concentration of the metal atoms 66 in the semiconductor layer 33 can be further decreased.

Figure 28:
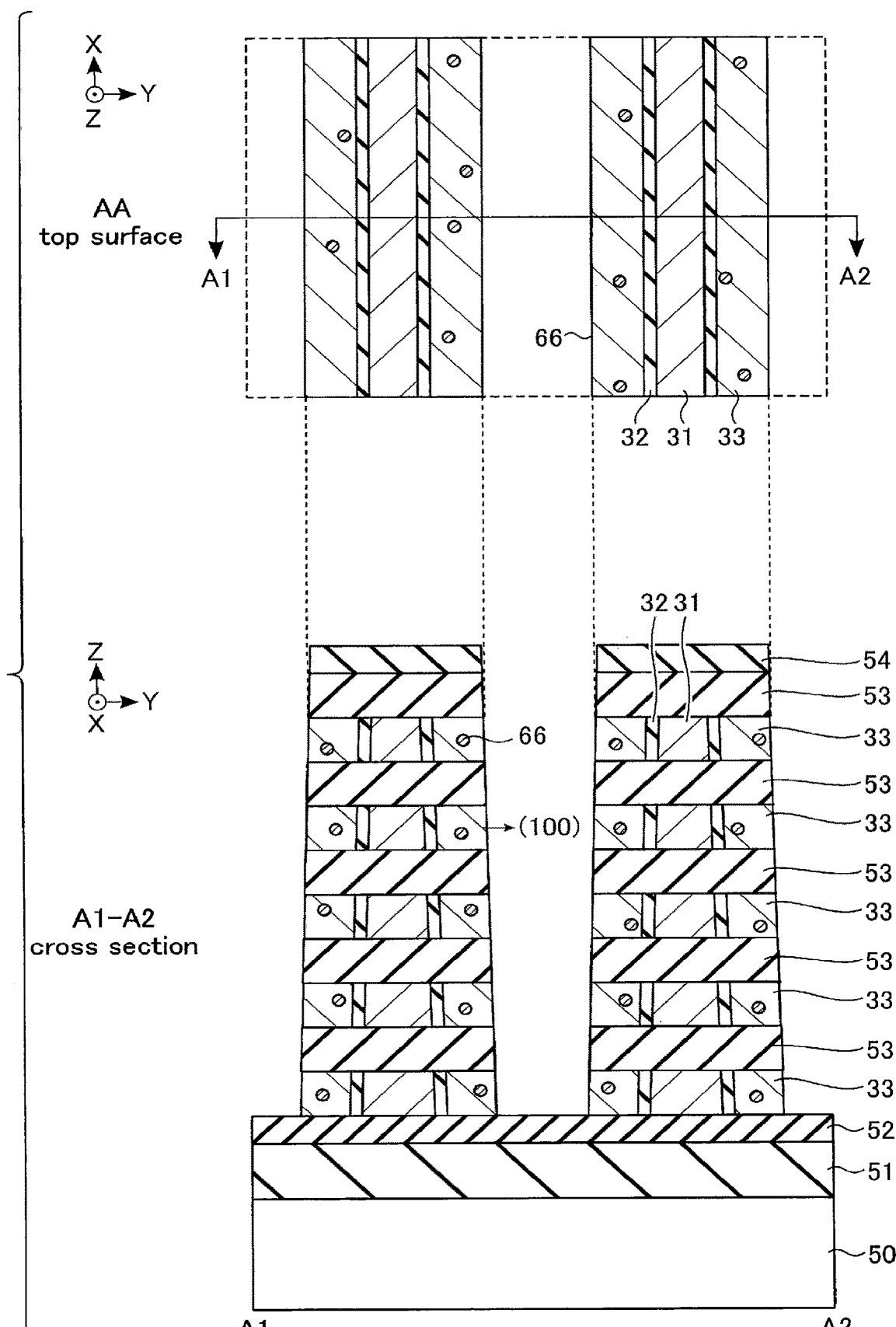

As shown in FIG. 28, portions of the semiconductor layer 33 that are in contact with top surfaces of the insulating layers 52 and 54 and side surfaces of the insulating layers 53 are removed by, for example, wet etching or CDE, in such a manner that the semiconductor layer 33 remains in recess regions RS1, similarly to the first embodiment described with reference to FIG. 11. The semiconductor layer 33 in each recess region RS1 that is formed using the MIC method has a (100) orientation toward a direction that is perpendicular to the insulating layer 32. As the thickness of the semiconductor layer 33 decreases, a proportion made up of crystal grains that have a (100) orientation, from among all the crystal grains in the semiconductor layer 33, increases. When, for example, the thickness of the semiconductor layer 33 is equal to or smaller than 15 nm, a proportion made up of crystal grains that have a (100) orientation, from among all the crystal grains in the semiconductor layer 33, reaches a value close to 1000.

The steps that follow are similar to those described in the first embodiment with reference to FIGS. 12 to 19.

In the present example, the semiconductor layers 33, described with reference to FIG. 28, are processed after formation of the getter layer 67 and removal of some of the metal atoms 66; however, the getter layer 67 may be formed after processing of the semiconductor layer 33. Moreover, formation of the getter layer 67 may be omitted.

The configuration and the formation method of the semiconductor layer 33 formed using the MIC method is not limited to the above-described ones. That is, a configuration and a formation method of a semiconductor using the MIC method are described in, for example, U.S. patent application Ser. No. 16/809,887 entitled "SEMICONDUCTOR STORAGE DEVICE AND METHOD OF MANUFACTURING THE SAME" filed on Mar. 5, 2020. The entire contents of this patent application are incorporated herein by reference.

2.2.3 Crystal Grain Size of Semiconductor Layer 33

Next, a crystal grain size of the semiconductor layer 33 (polysilicon) formed using the MIC method will be described with reference to FIG. 29. FIG. 29 is a diagram illustrating a difference in crystal grain size of the semiconductor layer 33 according to whether or not the MIC method is used. More specifically, FIG. 29(a) is a perspective view illustrating an arrangement of polysilicon (e.g., a semiconductor layer 31) formed without using the MIC method and a conductor 41. FIG. 29 (b) is a perspective view illustrating an arrangement of polysilicon (a semiconductor layer 33) formed using the MIC method and a conductor 41. In the examples of FIGS. 29 (a) and 29 (b), materials other than polysilicon (the semiconductor layer 31 or 33) and the conductor 41 are omitted to simplify the description. The examples of FIGS. 29(a) and 29 (b) illustrate crystal grain boundaries GB of polysilicon (the semiconductor layer 31 or 33) on a side surface that faces the conductor 41.

As shown in FIG. 29(a), when polysilicon is formed without using the MIC method, as in the semiconductor layer 31, its crystal grain size is relatively small. The semiconductor layer 31 contains, for example, three or more crystal grains over a width of the active area AA in the Z direction. Assuming, for example, that a region that the semiconductor layer 31 and the conductor 41 face is RA, a relatively large number of crystal grain boundaries GB are included in the region RA. That is, a large number of, at least three or more crystal grains are included in the region RA. The same applies to the case where polysilicon is used as the charge storage layer 44.

As shown in FIG. 29 (b), when polysilicon is formed using the MIC method, as in the semiconductor layer 33 of the present example, its crystal grain size is relatively large. The semiconductor layer 33 that is formed using the MIC method contains, for example, two or fewer crystal grains in a width of the active area AA in the Z direction. Assuming, for example, that a region that the semiconductor layer 33 formed using the MIC method and the conductor 41 face is RB, since the crystal grains are relatively large, up to one crystal grain boundary GB is included in the region RB. That is, one or two crystal grains are included in the region RB. In other words, in the region RB, no grain boundary is present, or only a grain boundary between two crystalline materials is present. In the present example, the crystal grains have a (100) orientation.

2.3 Third Example

A third example will be explained. In the third example, a case will be described where monocrystalline silicon formed by epitaxial growth is used as the semiconductor layer 33.

2.3.1 Cross-Sectional Configuration of Memory Cell Array

A cross-sectional configuration of the memory cell array 11 will be described with reference to FIG. 30. FIG. 30 is a cross-sectional view of the memory cell array 11.

As shown in FIG. 30, in the present example, a memory trench MT is provided so as to penetrate the insulating layer 54, the five insulating layers 53 and the five active areas AA that are stacked in an alternating manner, the insulating layer 52, and the insulating layer 51, and to reach, at its bottom surface, the semiconductor substrate 50. An insulating layer 35 is embedded in an interior portion of the memory trench MT.

The word line pillar WLP is provided in such a manner, for example, that its bottom surface is located below a top surface of the insulating layer 52. That is, the bottom surface is provided below a bottom surface of the lowermost active area AA. In the example of FIG. 30, the word line pillar WLP penetrates the insulating layer 54, as well as the five insulating layers 53 and the five active areas AA that are stacked in an alternating manner, and the insulating layer 52. A bottom portion of the word line pillar WLP is in contact with the insulating layer 35. The word line pillar WLP may reach, at its bottom surface, the semiconductor substrate 50 if the word line pillar WLP is not electrically coupled to the semiconductor substrate 50. In this case, an insulating layer 42 is provided on, for example, a side surface and a bottom surface of the word line pillar WLP. In an interior portion of the insulating layer 42, a conductor 41 is provided in such a manner that its side surface and its bottom surface are in contact with the insulating layer 42.

The other configuration is similar to that of the first embodiment described with reference to FIG. 5.

2.3.2 Method of Manufacturing Memory Cell Array

Next, a method of manufacturing a memory cell array 11 will be described with reference to FIGS. 31 to 34.

Each of FIGS. 31 to 34 shows a top surface of an uppermost active area AA and a cross section taken along line A1-A2 in a process of manufacturing the memory cell array 11.

Figure 31:
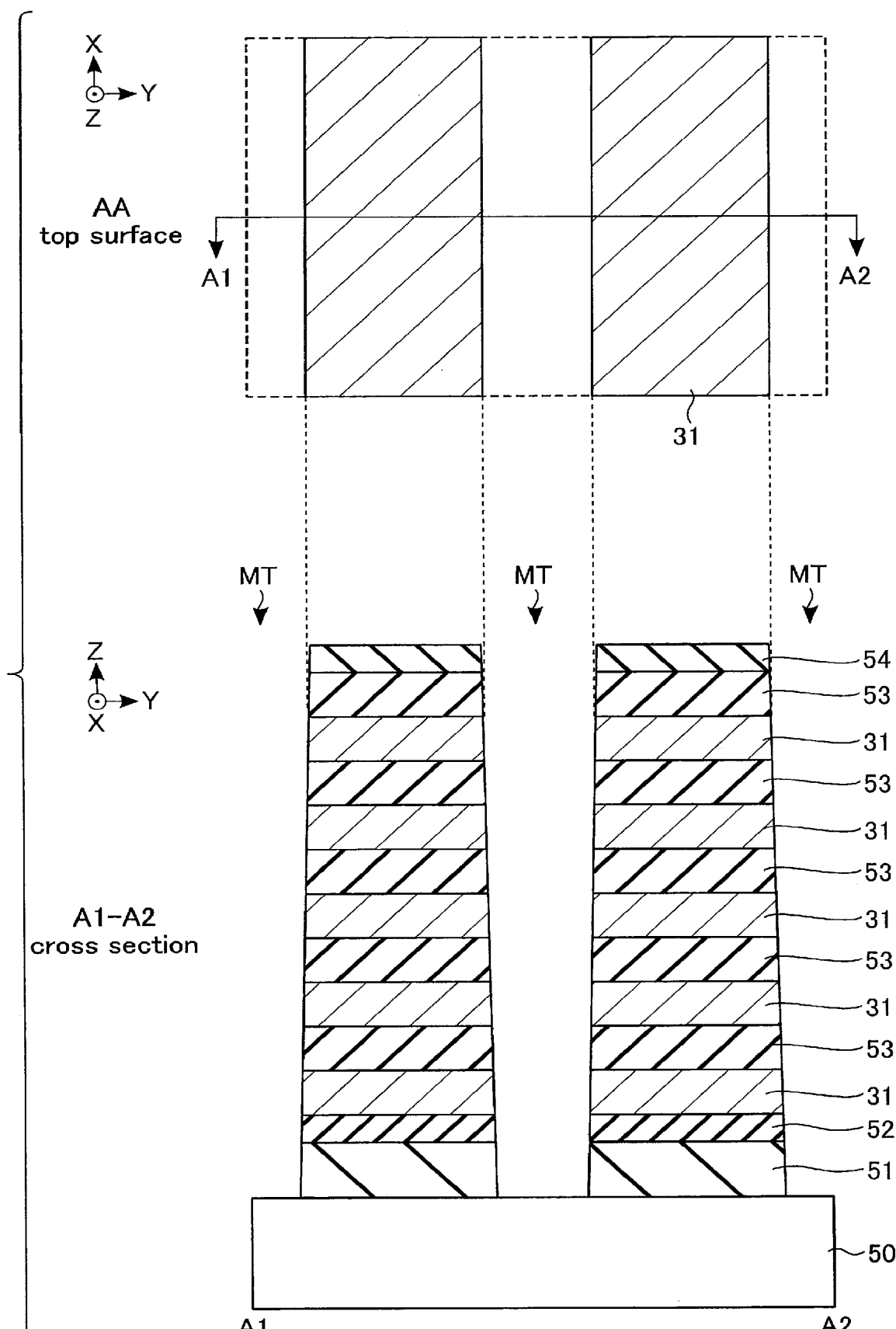

As shown in FIG. 31, after an insulating layer 54 is formed in a manner similar to FIG. 6 of the first embodiment, a memory trench MT is formed by dry etching so as to penetrate the insulating layer 54, five insulating layers 53 and five semiconductor layers 31, an insulating layer 52, and an insulating layer 51, and to reach, at its bottom surface, a semiconductor substrate 50.

Figure 32:
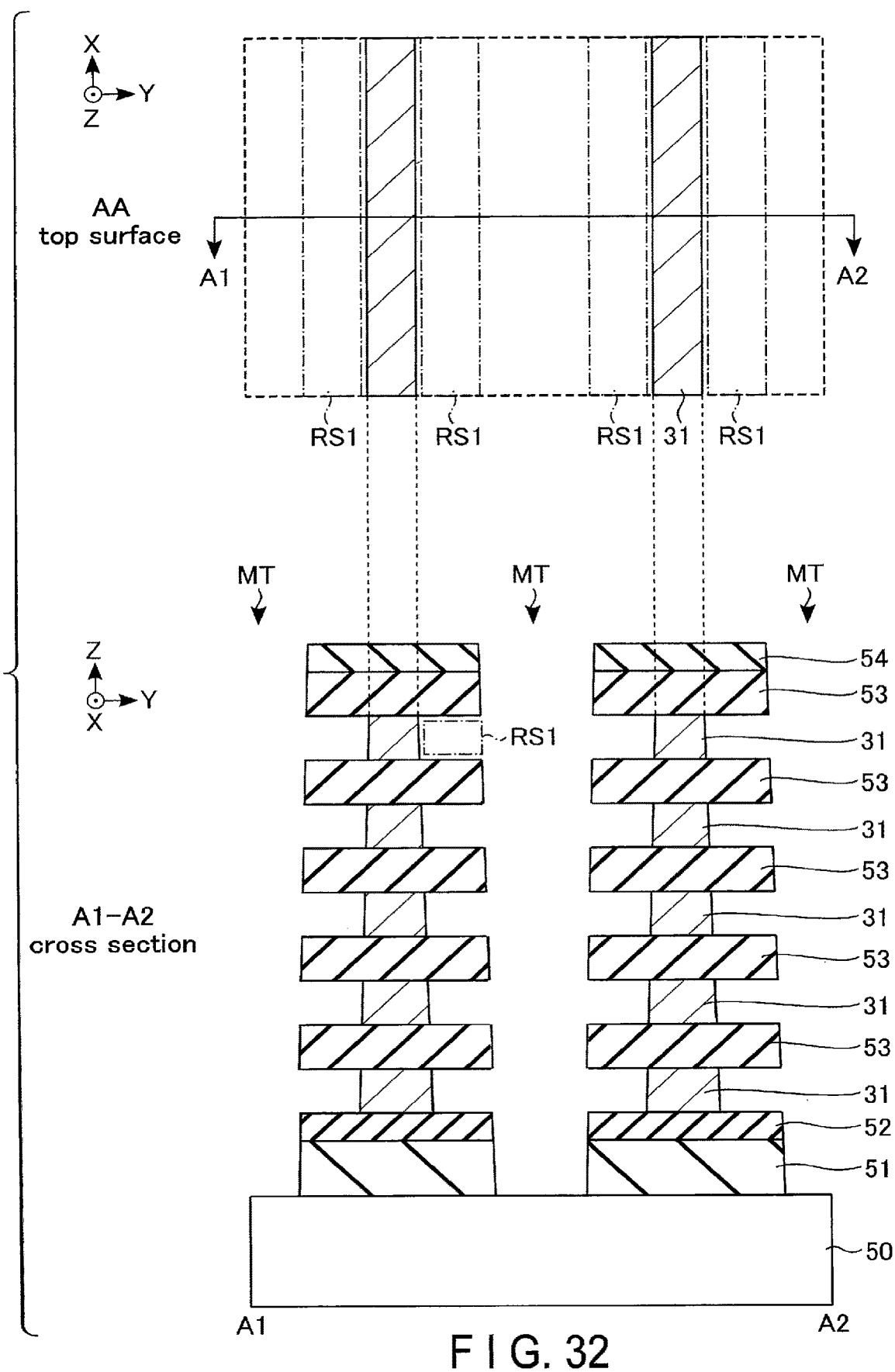

As shown in FIG. 32, the semiconductor layers 31 are processed from side surfaces of the memory trench MT by, for example, wet etching, thereby forming recess regions RS1.

As shown in FIG. 33, insulating layers 32 are formed on side surfaces of the semiconductor layers 31. For example, the insulating layers 32 may be formed by an oxidative treatment of the semiconductor layers 31, or may be formed on surfaces of the semiconductor layers 31 by selective CVD, etc. When, for example, an insulating layer 32 is formed on the semiconductor substrate 50, too, the insulating layer 32 on the semiconductor substrate 50 is removed by, for example, RIE.

Figure 34:
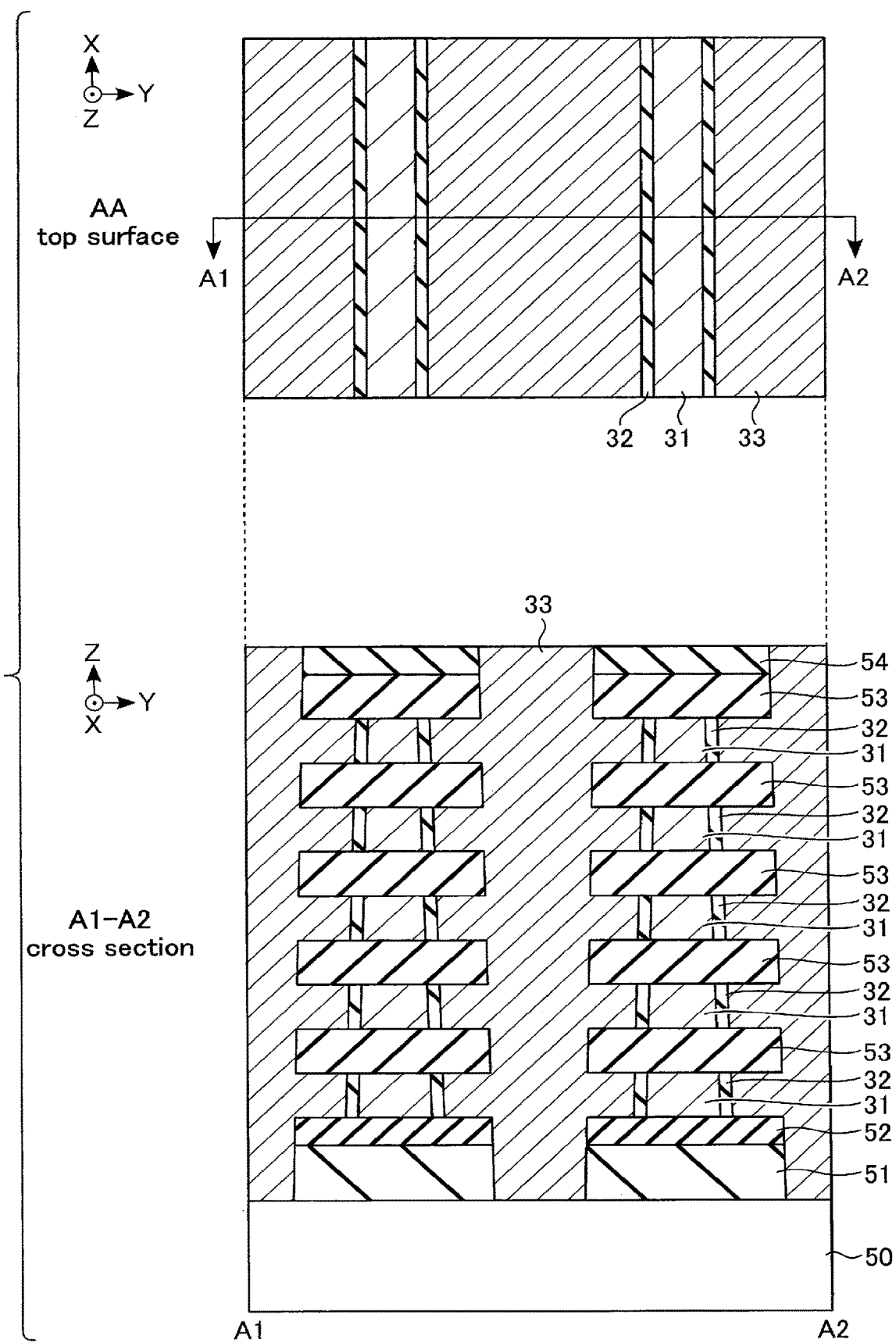

As shown in FIG. 34, after a pre-treatment is performed to remove, for example, a natural oxide film on a surface of the exposed semiconductor substrate 50, a monocrystalline semiconductor layer 33 is formed by epitaxial growth, so as to grow upward from the surface of the semiconductor substrate 50. In the present example, a case has been described where the semiconductor layer 33 is formed by epitaxial growth; however, the configuration is not limited thereto. For example, solid-phase growth of silicon which uses the semiconductor substrate 50 as a seed may be employed.

Figure 35:
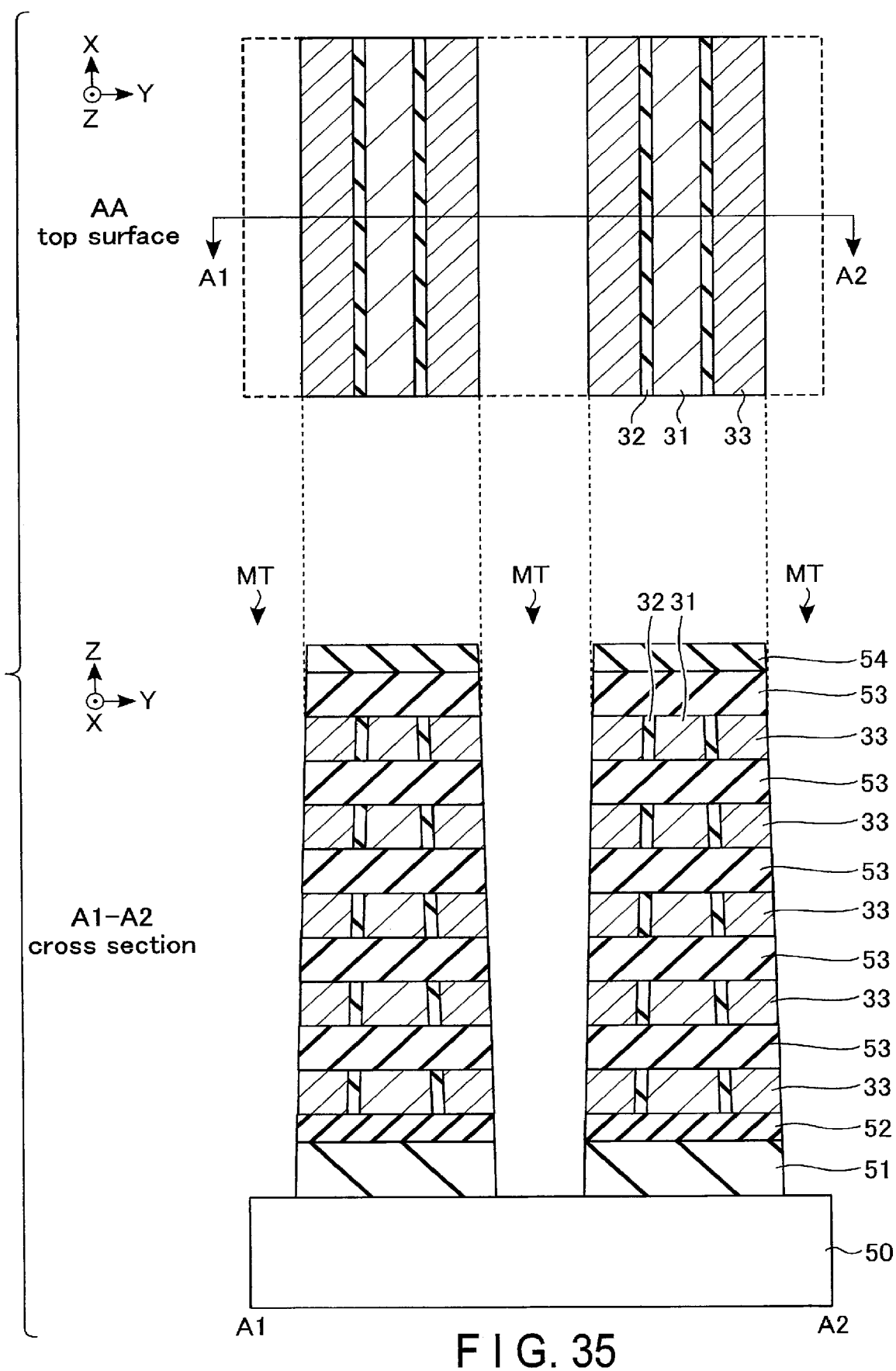

As shown in FIG. 35, a memory trench MT is formed by, for example, RIE, using the insulating layer 54 as a mask.

Figure 36:
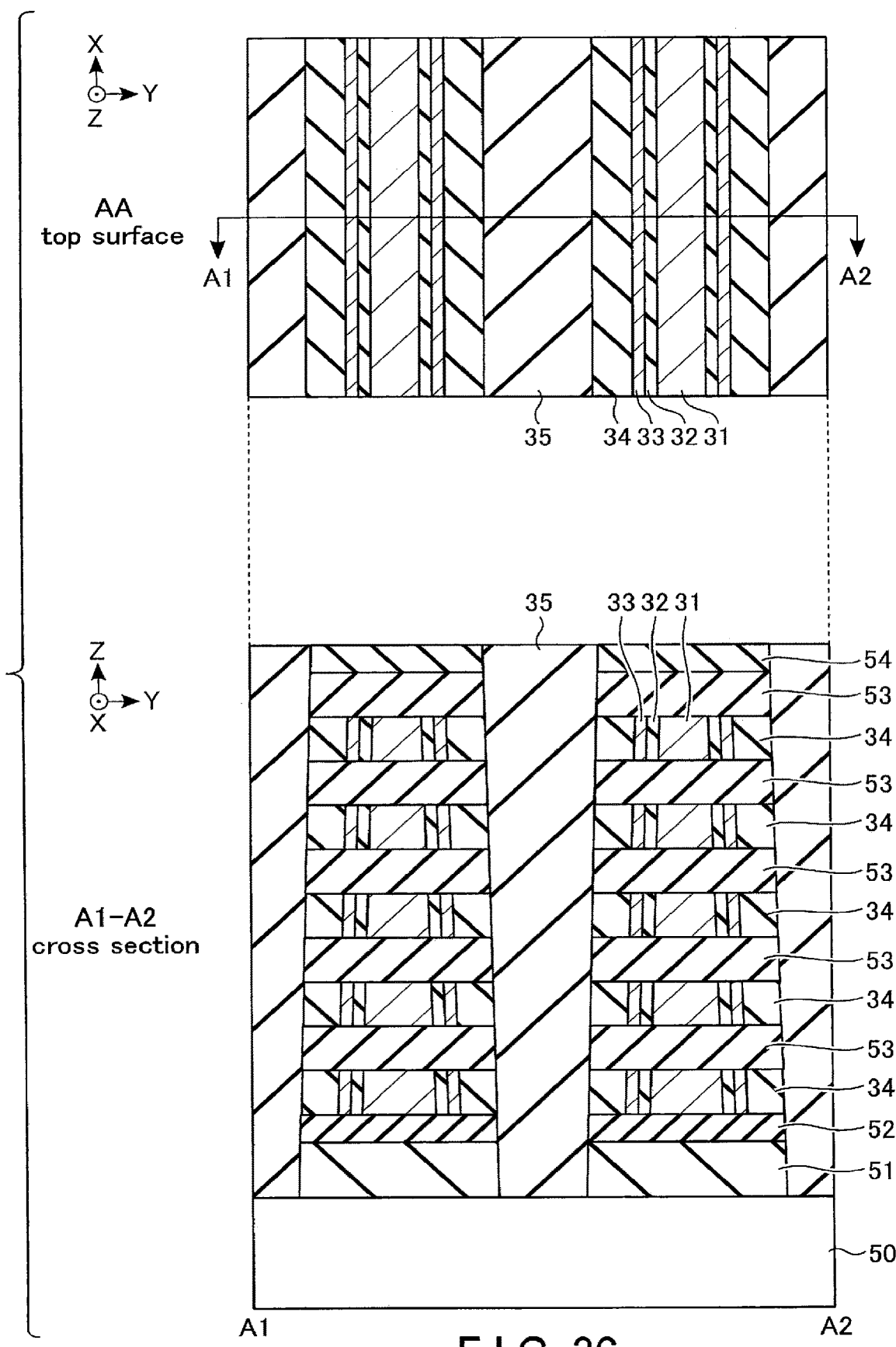

As shown in FIG. 36, similarly to the first embodiment described with reference to FIGS. 12 and 13, after the semiconductor layer 33 and the insulating layer 34 are formed, an insulating layer 35 is embedded in an interior portion of the memory trench MT.

Figure 37:
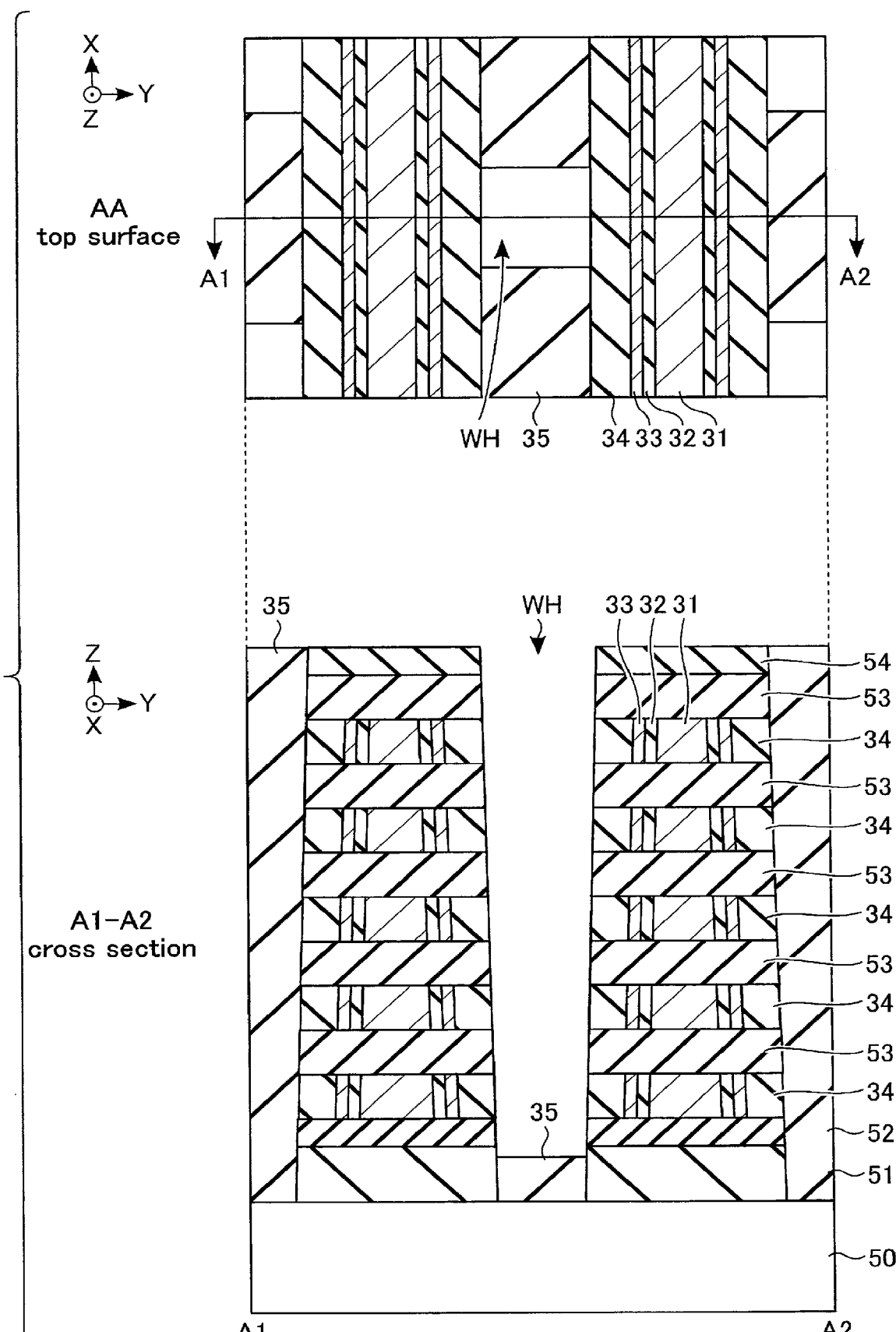

As shown in FIG. 37, a hole WH corresponding to a word line pillar WLP is formed by processing the insulating layer 35 by, for example, RIE. At this time, the hole WH is configured so as to not penetrate the insulating layer 35. More specifically, the etching amount of the insulating layer 35 is adjusted in such a manner that a bottom surface of the hole is below a top surface of the insulating layer 52, and above a top surface of the semiconductor substrate 50.

The steps that follow are similar to those of the first embodiment described with reference to FIGS. 15 to 19.

2.4 Effects of Present Embodiment

According to the configuration of the present embodiment, effects similar to those of the first embodiment are achieved.

Moreover, according to the configuration of the first example of the present embodiment, a crystallized metal sulfide that has a C-axis orientation can be used as the semiconductor layer 33. That is, a metal sulfide can be used as a channel layer of the memory cell transistor MC. It is thereby possible to form a channel layer using a metal sulfide that has a relatively high carrier mobility.

Furthermore, by forming a metal sulfide by a thermal treatment of an S-rich amorphous metal sulfide, it is possible to form a metal sulfide with a relatively small surface roughness.

Moreover, according to the configuration of the second example of the present embodiment, the semiconductor layer 33 formed using the MIC method is capable of forming crystal grains that have a (100) orientation which faces a direction that is perpendicular to the insulating layer 32 (tunnel insulating film). It is thereby possible to reduce the interface state density between the tunnel insulating film (insulating layer 32) and the channel (semiconductor layer 33). Also, the S value of the semiconductor layer 33 and the carrier mobility can be improved. This results in improvement of the cell properties of the memory cell transistors MC. Moreover, in the semiconductor layer 33 formed using the MIC method, the crystal grain size can be increased compared to when the MIC method is not used. That is, the semiconductor layer 33 can be formed with a relatively lower number of crystal grain boundaries.

Furthermore, according to the configuration of the third example of the present embodiment, the semiconductor layer 33 can be formed in a monocrystalline form. This results in improvement in the carrier mobility of the semiconductor layer 33.

3. Third Embodiment

Next, a third embodiment will be described. In the third embodiment, a case will be described where the semiconductor layer 31 described in the first and second embodiments is replaced with an insulating layer. Hereinafter, the description will focus mainly on matters different from those of the first and second embodiments.

3.1 Planar Configuration of Memory Cell Array

Figure 38:
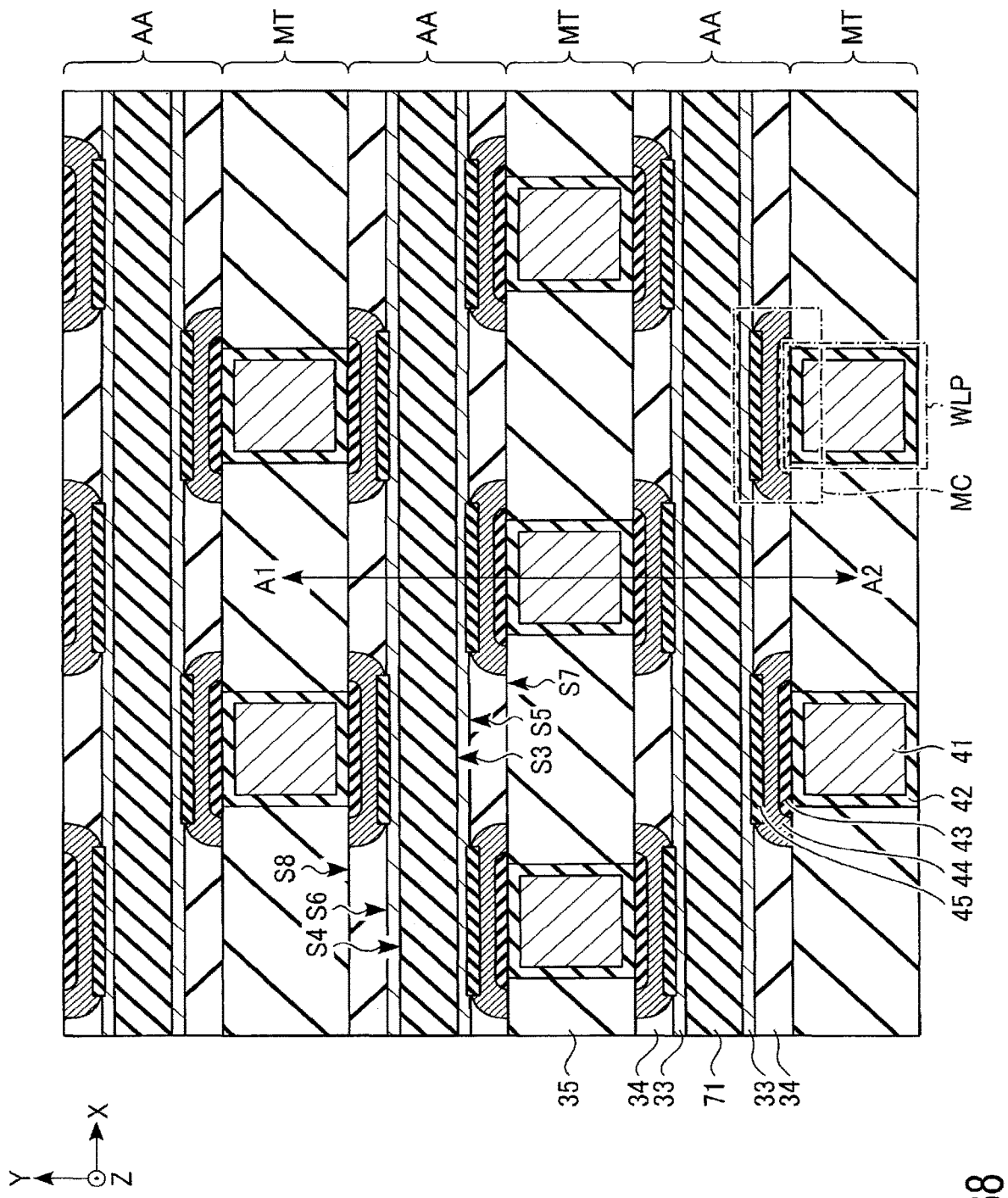
FIG. 38 is a top view of a memory cell array included in a semiconductor memory device according to a third embodiment.

First, an example of a planar configuration of a memory cell array 11 will be described with reference to FIG. 38. FIG. 38 is a plan view of the active areas AA and the word line pillars WLP in the memory cell array 11.

As illustrated in FIG. 38, a plurality of active areas AA extending in the X direction are arranged along the Y direction. The active areas AA include, for example, an insulating layer 71, two semiconductor layers 33, and two insulating layers 34.

At the center of each active area AA, an insulating layer 71 extending in the X direction is provided. The insulating layer 71 is formed of, for example, SiN.

Two semiconductor layers 33 extend in the X direction, and are in contact with two side surfaces S3 and S4 of the insulating layer 71 that face the Y direction.

The other configuration is similar to that of the first embodiment described with reference to FIG. 4.

3.2 Cross-Sectional Configuration of Memory Cell Array

Figure 39:
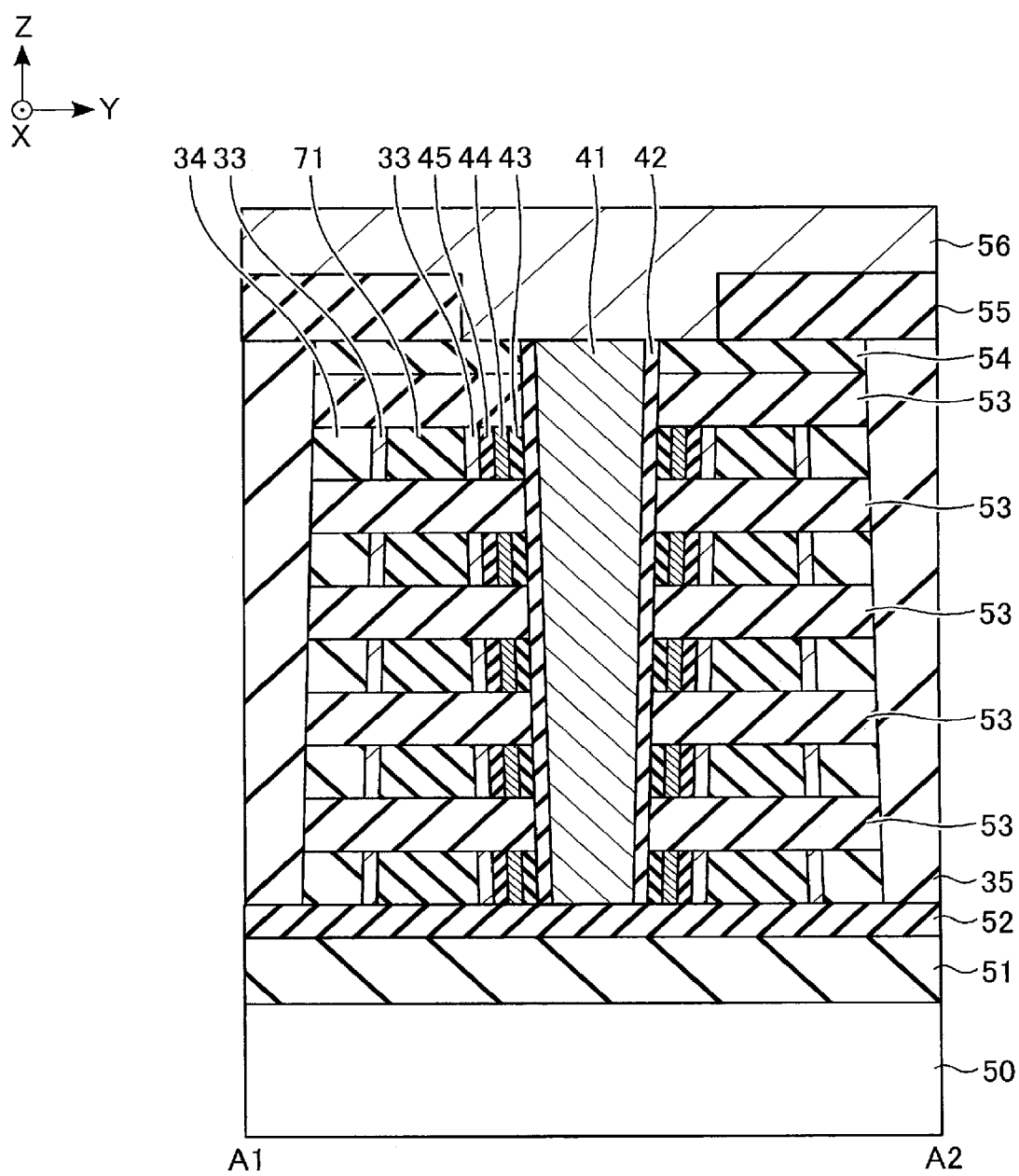
FIG. 39 is a cross-sectional view of the memory cell array included in the semiconductor memory device according to the third embodiment.

Next, a description will be given of an example of a cross-sectional configuration of the memory cell array 11. FIG. 39 is a sectional view taken along line A1-A2 shown in FIG. 38.

As shown in FIG. 39, a plurality of active areas AA are stacked, for example, on the insulating layer 52, with an insulating layer 53 interposed between adjacent layers. That is, five active areas AA and five insulating layers 53, for example, are provided in an alternating manner on the insulating layer 52. The number of active areas AA that are stacked may be freely designed.

A semiconductor layer 33, an insulating layer 45, a charge storage layer 44, and an insulating layer 43 are provided in this order from the side of the insulating layer 71 toward the side of the insulating layer 42, between the insulating layer 71 and the insulating layer 42. That is, the memory cell array 11 of the present embodiment is configured in such a manner that the semiconductor layer 31 and the insulating layer 32 described in the first embodiment with reference to FIG. 5 are replaced with the insulating layer 71.

The other configuration is similar to that of the first embodiment described with reference to FIG. 5.

3.3 Method of Manufacturing Memory Cell Array

Next, a description will be given of a method of manufacturing the memory cell array 11, with reference to FIGS. 40 to 42. Each of FIGS. 40 to 42 shows a top surface of an uppermost active area AA and a cross section taken along line A1-A2 in a process of manufacturing the memory cell array 11.

Figure 40:
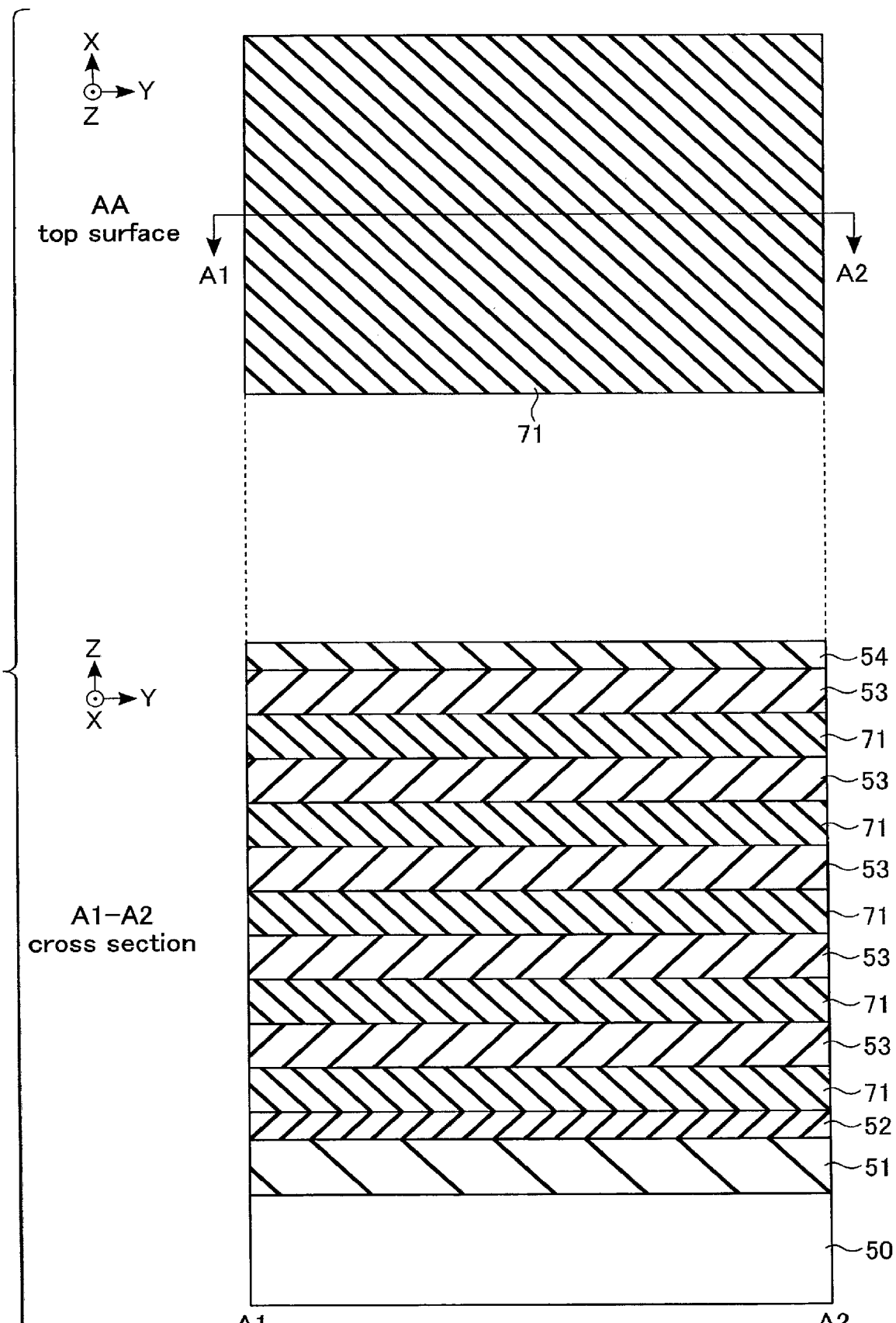

As illustrated in FIG. 40, insulating layers 51 and 52 are formed on a semiconductor substrate 50. In this state, five insulating layers 71 and five insulating layers 53, for example, are stacked in an alternating manner on the insulating layer 52. An insulating layer 54 is formed on the uppermost insulating layer 53.

As shown in FIG. 41, a memory trench MT is formed by dry etching, so as to penetrate the insulating layer 54, the five insulating layers 53, and the five insulating layers 71, and reach the insulating layer 52 at its bottom surface.

Figure 42:
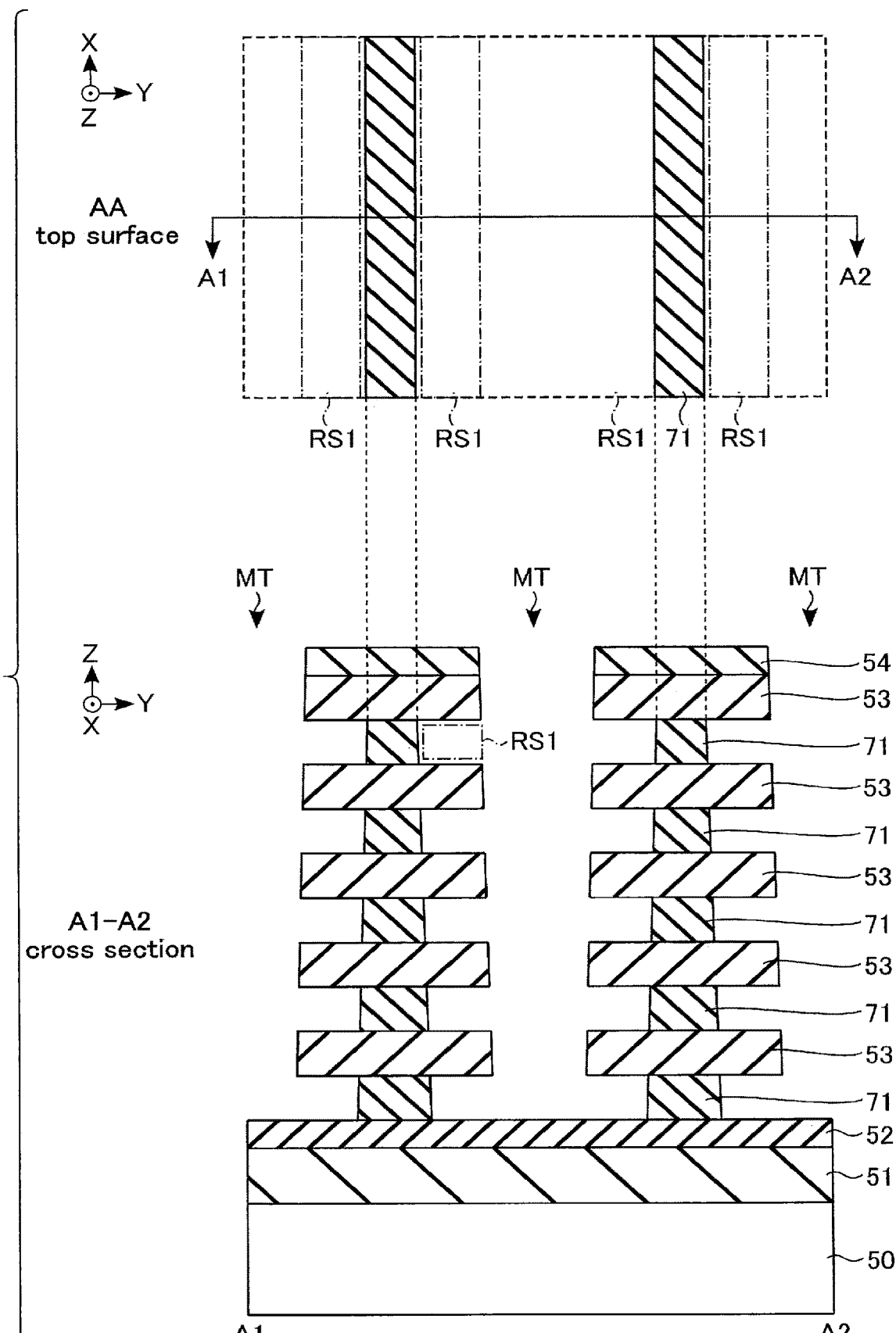

As shown in FIG. 42, the insulating layer 71 is processed from side surfaces of the memory trench MT by, for example, wet etching, thereby forming recess regions RS1.

The steps that follow are similar to those of the first embodiment described with reference to FIGS. 10 to 19.

3.4 Effects of Present Embodiment

According to the configuration of the present embodiment, it is possible to form semiconductor layers 33 with a small thickness, similarly to the first embodiment. According to the configuration of the present embodiment, it is thus possible to obtain advantageous effects similar to that of the first embodiment.

The third embodiment and the first to third examples of the second embodiment may be combined. That is, the semiconductor layer 33 may be a metal sulfide, a semiconductor (a semiconductor that contains metal atoms or a semiconductor that has a (100) orientation) that is formed using the MIC method, or a monocrystalline semiconductor.

4. Fourth Embodiment

Next, a fourth embodiment will be described. In the fourth embodiment, a case will be described where an insulating layer 72 different from the insulating layer 71 is provided between the insulating layer 71 and the semiconductor layer 33, in the configuration of the active area AA described in the third embodiment. Hereinafter, the description will focus mainly on matters different from those of the first to third embodiments.

4.1 Planar Configuration of Memory Cell. Array

Figure 43:
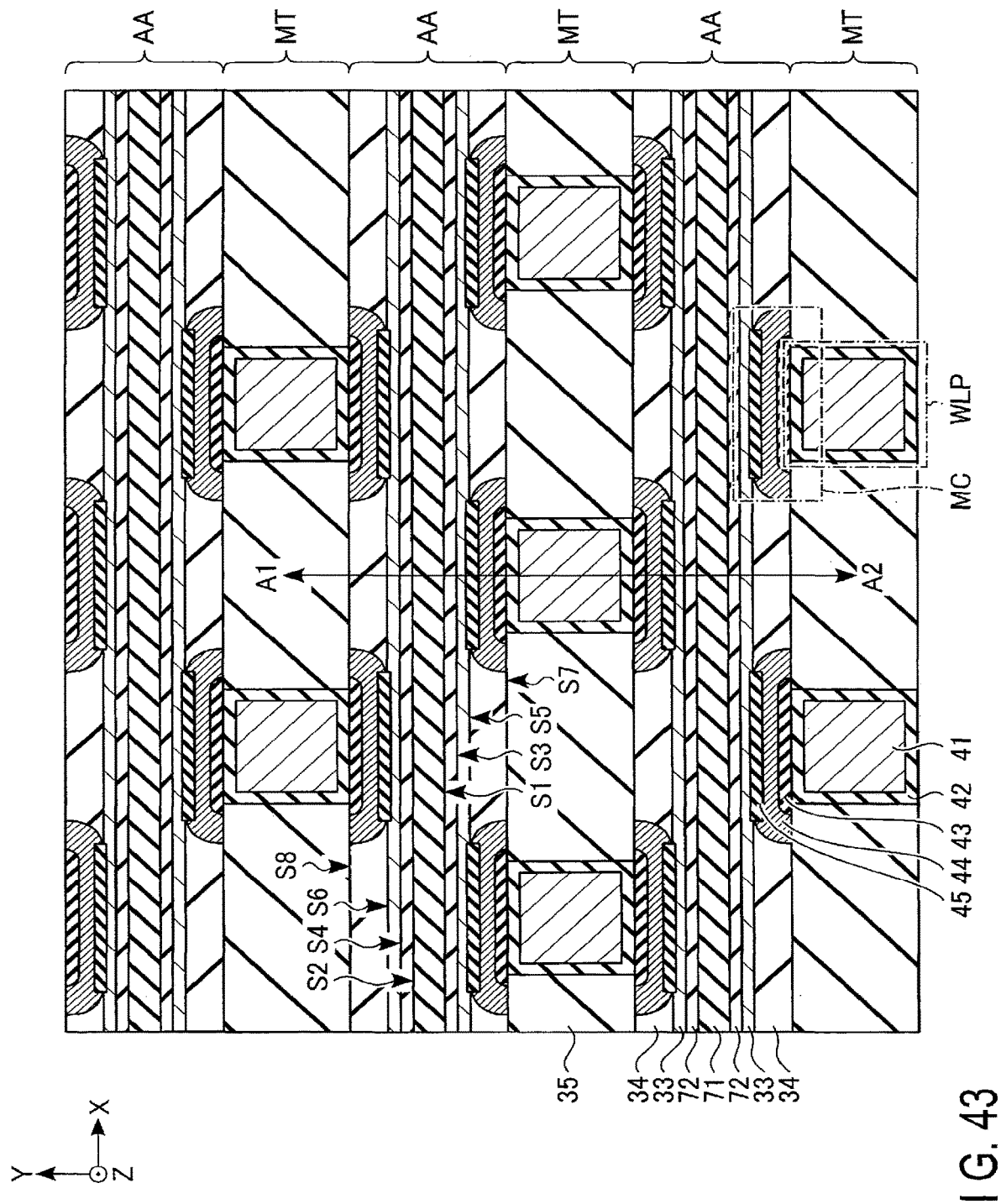
FIG. 43 is a top view of a memory cell array included in a semiconductor memory device according to a fourth embodiment.

First, an example of a planar configuration of a memory cell array 11 will be described with reference to FIG. 43. FIG. 43 is a plan view of active areas AA and word line pillars WLP in the memory cell array 11.

As illustrated in FIG. 43, a plurality of active areas AA extending in the X direction are arranged along the Y direction. The active areas AA include, for example, an insulating layer 71, two insulating layer 72, two semiconductor layers 33, and two insulating layers 34.

Each insulating layer 72 is provided between the insulating layer 71 and the semiconductor layer 33. The two insulating layers 72 extend in the X direction, and are respectively in contact with two side surfaces S1 and S2 of the insulating layer 71 that face the Y direction. The insulating layers 72 are formed using, for example, SiON. The insulating layers 72 may be formed using $SiO_2$, or a laminated structure of $SiON/SiO_2$.

The other configuration is similar to that of the third embodiment described with reference to FIG. 38.

4.2 Cross-Sectional Configuration of Memory Cell Array

Next, a description will be given of an example of a cross-sectional configuration of the memory cell array 11. FIG. 44 is a cross-sectional view taken along line A1-A2 shown in FIG. 43.

As shown in FIG. 44, a plurality of active areas AA are stacked, for example, on an insulating layer 52, with an insulating layer 53 interposed between adjacent layers. That is, five active areas AA and five insulating layers 53, for example, are provided in an alternating manner on the insulating layer 52. The number of active areas AA that are stacked may be freely designed.

An insulating layer 72, a semiconductor layer 33, an insulating layer 45, a charge storage layer 44, and an insulating layer 43 are provided in this order from the side of the insulating layer 71 toward the side of the insulating layer 42, between the insulating layer 71 and the insulating layer 42. That is, the memory cell array 11 of the present embodiment is configured in such a manner that the insulating layer 72 is provided between the insulating layer 71 and the semiconductor layer 33 described in the third embodiment with reference to FIG. 39.

The other configuration is similar to that of the third embodiment described with reference to FIG. 39.

4.3 Method of Manufacturing Memory Cell Array

Figure 45:
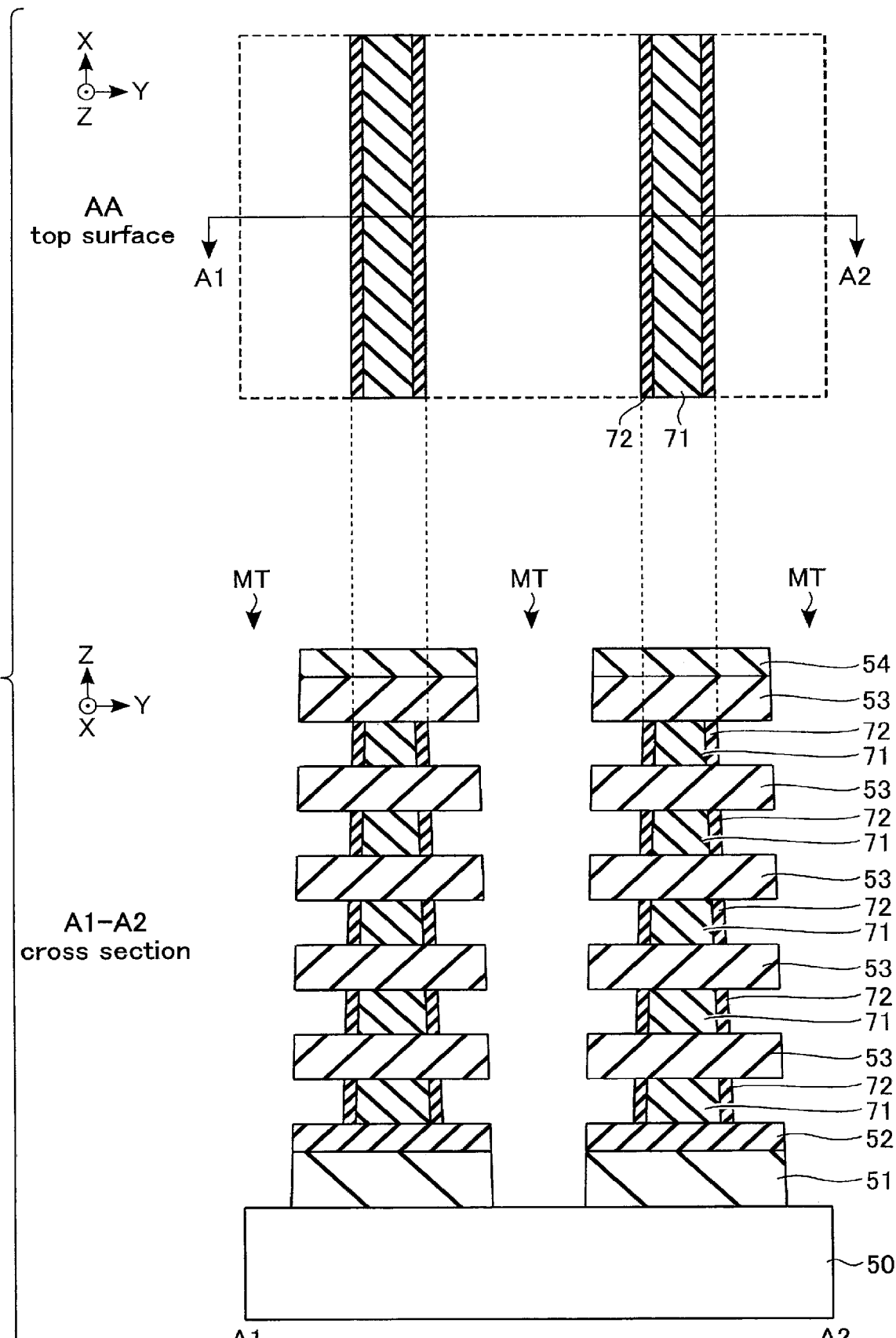
FIG. 45 is a diagram showing a process of manufacturing the memory cell array included in the semiconductor memory device according to the fourth embodiment.

Next, a method of manufacturing the memory cell array 11 will be described with reference to FIG. 45. FIG. 45 shows a top surface of an uppermost active area AA and a cross section taken along line A1-A2 in a process of manufacturing the memory cell array 11.

The steps up to processing of an insulating layer 71 and formation of recess regions RS1 are the same as those described in the third embodiment with reference to FIGS. 40 to 42.

As shown in FIG. 45, an insulating layer 72 is formed on a side surface of the insulating layer 71 by, for example, an oxidation treatment. When, for example, the insulating layer 71 is SiN, the insulating layer 72 is formed in the form of SiON, $SiO_2$, or a laminated structure of $SiO_2$ and SiON, depending on the conditions of the oxidation treatment.

The steps that follow are similar to those of the first embodiment described with reference to FIGS. 10 to 19.

4.4 Effects of Present Embodiment

With the configuration of the present embodiment, it is possible to improve reliability of the semiconductor memory device. This effect will be explained in detail below.

There is a case where, for example, an insulating layer 72 is not provided, and an insulating layer 71 (e.g., SiN) and a semiconductor layer 33 are in contact with each other in the active area AA. SiN has a relatively high interface state, namely, has a relatively large number of traps. Accordingly, charges may be trapped in SiN during, for example, an erase operation of the memory cell transistor MC, namely, when charges are extracted from the charge storage layer 44. This may cause fluctuations in threshold voltage of the memory cell transistor MC, resulting in a possible cause of variations in threshold voltage.

On the other hand, according to the configuration of the present embodiment, it is possible to form an insulating layer (e.g., SiON, $SiO_2$, or a laminated structure of SiON and $SiO_2$) with a lower number of traps than the insulating layer 71 between the insulating layer 71 and the semiconductor layer 33, namely, on a surface (hereinafter also referred to as a "backside of the channel") that is opposite to a surface that is in contact with a trap insulating film of the channel. It is thereby possible to suppress a threshold voltage shift caused by a write operation (trapping of charges) to the backside of the channel during an erase operation. It is thus possible to suppress variations in threshold voltage of the memory cell transistors MC. This results in improvement in reliability of the semiconductor memory device.

The fourth embodiment may be combined with the first to third examples of the second embodiment. That is, the semiconductor layer 33 may be a metal sulfide, a semiconductor (a semiconductor that contains metal atoms or a semiconductor that has a (100) orientation) that is formed using the MIC method, or a monocrystalline semiconductor.

5. Modifications, Etc.

According to the above embodiment, a semiconductor memory device includes: a first semiconductor layer (31) extending in a first direction (X direction) that is parallel to a substrate (50); a first insulating layer (32) extending in the first direction and in contact with a first main surface (S1) of the first semiconductor layer, the first main surface facing a second direction (Y direction) that intersects the first direction; a second insulating layer (32) extending in the first direction and in contact with a second main surface (S2) of the first semiconductor layer, the second main surface being opposite to the first main surface and facing the second direction; a second semiconductor layer (33) extending in the first direction and in contact with a third main surface (S3) of the first insulating layer, the third main surface facing the second direction; a third semiconductor layer (33) extending in the first direction and in contact with a fourth main surface (S4) of the second insulating layer, the fourth main surface facing the second direction; a first conductor (41) extending in a third direction (Z direction) that intersects the first and second directions; a third insulating layer (42) in contact with a fifth main surface of the first conductor; a fourth insulating layer (43) provided between the second semiconductor layer and the third insulating layer; a first charge storage layer (44) provided between the second semiconductor layer and the fourth insulating layer; and a fifth insulating layer (45) provided between the second semiconductor layer and the first charge storage layer, and in contact with the second semiconductor layer and the first charge storage layer. A portion of the second semiconductor layer, a portion of the first conductor, a portion of the third insulating layer, the fourth insulating layer, the first charge storage layer, and the fifth insulating layer function as a first memory cell.

It is possible to provide a semiconductor memory device with improved reliability by applying the above-described embodiments.

The embodiments are not limited to the aspects described above, and various modifications may be made.

For example, the above-described embodiments may be combined wherever possible.

The term "couple" in the above-described embodiments includes, for example, indirect coupling with a transistor, a resistor, etc. interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first semiconductor layer extending in a first direction that is parallel to a substrate;
    a first insulating layer extending in the first direction and in contact with a first main surface of the first semiconductor layer, the first main surface facing a second direction that intersects the first direction;
    a second insulating layer extending in the first direction and in contact with a second main surface of the first semiconductor layer, the second main surface being opposite to the first main surface and facing the second direction;
    a second semiconductor layer extending in the first direction and in contact with a third main surface of the first insulating layer, the third main surface facing the second direction;
    a third semiconductor layer extending in the first direction and in contact with a fourth main surface of the second insulating layer, the fourth main surface facing the second direction;
    a first conductor extending in a third direction that intersects the first and second directions;
    a third insulating layer in contact with a fifth main surface of the first conductor;
    a fourth insulating layer provided between the second semiconductor layer and the third insulating layer;
    a first charge storage layer provided between the second semiconductor layer and the fourth insulating layer; and
    a fifth insulating layer provided between the second semiconductor layer and the first charge storage layer, and in contact with the second semiconductor layer and the first charge storage layer,
    wherein a portion of the second semiconductor layer, a portion of the first conductor, a portion of the third insulating layer, the fourth insulating layer, the first charge storage layer, and the fifth insulating layer function as a first memory cell.

2. The device according to claim 1, further comprising:
    a second conductor extending in the third direction;
    a sixth insulating layer in contact with a sixth main surface of the second conductor;
    a seventh insulating layer provided between the third semiconductor layer and the sixth insulating layer;
    a second charge storage layer provided between the third semiconductor layer and the seventh insulating layer; and
    an eighth insulating layer provided between the third semiconductor layer and the second charge storage layer, and in contact with the third semiconductor layer and the second charge storage layer,
    wherein a portion of the third semiconductor layer, a portion of the second conductor, a portion of the sixth insulating layer, the seventh insulating layer, the second charge storage layer, and the eighth insulating layer function as a second memory cell.

3. The device according to claim 1, wherein the second semiconductor layer is a metal sulfide.

4. The device according to claim 3, wherein the metal sulfide contains at least one of W, Mo, Hf, and Zr.

5. The device according to claim 3, wherein the metal sulfide is a layered crystal.

6. The device according to claim 1, wherein the second semiconductor layer contains two or fewer crystal grains in a region of the second semiconductor layer that faces the first conductor.

7. The device according to claim 1, wherein the second semiconductor layer has a (100) orientation.

8. The device according to claim 1, wherein the second semiconductor layer is monocrystalline silicon.

9. The device according to claim 1, further comprising:
a third conductor extending in the third direction;
a ninth insulating layer in contact with a seventh main surface of the third conductor;
a tenth insulating layer provided between the second semiconductor layer and the ninth insulating layer;
a third charge storage layer provided between the second semiconductor layer and the tenth insulating layer; and
an eleventh insulating layer provided between the second semiconductor layer and the third charge storage layer, and in contact with the second semiconductor layer and the third charge storage layer,
wherein a portion of the second semiconductor layer, a portion of the third conductor, a portion of the ninth insulating layer, the tenth insulating layer, the third charge storage layer, and the eleventh insulating layer function as a third memory cell, and
the first memory cell and the third memory cell are aligned in the first direction.

10. The device according to claim 1, further comprising:
a fourth semiconductor layer provided above the first semiconductor layer, and extending in the first direction;
a twelfth insulating layer provided above the first insulating layer, extending in the first direction, and in contact with an eighth main surface of the fourth semiconductor layer, the eighth main surface facing the second direction;
a thirteenth insulating layer provided above the second insulating layer, extending in the first direction, and in contact with a ninth main surface of the fourth semiconductor layer, the ninth main surface being opposite to the eighth main surface and facing the second direction;
a fifth semiconductor layer provided above the second semiconductor layer, extending in the first direction, and in contact with a tenth main surface of the twelfth insulating layer, the tenth main surface facing the second direction;
a sixth semiconductor layer provided above the third semiconductor layer, extending in the first direction, and in contact with an eleventh main surface of the thirteenth insulating layer, the eleventh main surface facing the second direction;
a fourteenth insulating layer provided between the fifth semiconductor layer and the third insulating layer above the fourth insulating layer;
a fourth charge storage layer provided between the fifth semiconductor layer and the fourteenth insulating layer above the first charge storage layer; and
a fifteenth insulating layer provided between the fifth semiconductor layer and the fourth charge storage layer above the fifth insulating layer, and in contact with the fifth semiconductor layer and the fourth charge storage layer,
wherein a portion of the fifth semiconductor layer, a portion of the first conductor, a portion of the third insulating layer, the fourteenth insulating layer, the fourth charge storage layer, and the fifteenth insulating layer function as a fourth memory cell.

11. The device according to claim 1, further comprising:
a twelfth insulating layer provided above the first to third semiconductor layers, the first, second, fourth, and fifth insulating layers, and the first charge storage layer, and extending in the first direction.

12. The device according to claim 1, wherein a length of the first charge storage layer in the first direction is greater than a length of the first conductor in the first direction.

* * * * *